US012577392B2

(12) United States Patent
Silvi et al.

(10) Patent No.: US 12,577,392 B2
(45) Date of Patent: Mar. 17, 2026

(54) COMPOSITES HAVING IMPROVED MICROWAVE SHIELDING PROPERTIES

(71) Applicant: SHPP GLOBAL TECHNOLOGIES B.V., Bergen op Zoom (NL)

(72) Inventors: Norberto Silvi, Selkirk, NY (US); Kristi Jean Narang, Selkirk, NY (US); Martin Sas, Bergen op Zoom (NL); Hochul Jung, Perry, OH (US); Jiali Jiang, Conroe, TX (US)

(73) Assignee: SHPP Global Technologies B.V., Bergen op Zoom (NL)

( * ) Notice: Subject to any disclaimer, the term of this patent is extended or adjusted under 35 U.S.C. 154(b) by 62 days.

(21) Appl. No.: 18/016,780

(22) PCT Filed: Jul. 20, 2021

(86) PCT No.: PCT/IB2021/056559
§ 371 (c)(1),
(2) Date: Jan. 18, 2023

(87) PCT Pub. No.: WO2022/018639
PCT Pub. Date: Jan. 27, 2022

(65) Prior Publication Data

US 2023/0279220 A1 Sep. 7, 2023

(30) Foreign Application Priority Data

Jul. 20, 2020 (EP) .................................... 20186793

(51) Int. Cl.
*C08L 67/02* (2006.01)
*C08K 3/04* (2006.01)
(Continued)

(52) U.S. Cl.
CPC ................ *C08L 67/02* (2013.01); *C08K 3/04* (2013.01); *G01S 7/02* (2013.01); *H05K 9/0083* (2013.01);
(Continued)

(58) Field of Classification Search
CPC ..... C08L 67/02; C08K 3/04; C08K 2201/001; H05K 9/0083
(Continued)

(56) References Cited

U.S. PATENT DOCUMENTS 4,351,746 A * 9/1982 Parish ...................... H01G 4/20 252/502
4,528,213 A 7/1985 Nelson et al.
(Continued)

FOREIGN PATENT DOCUMENTS

CN 104004355 A 8/2014
CN 106062062 A 10/2016
(Continued)

OTHER PUBLICATIONS

Seng "EMI shielding based on MWCNTs/polyester composites." Applied Physics A (2018) 124:140 (Year: 2018).*
(Continued)

*Primary Examiner* — Tri V Nguyen
(74) *Attorney, Agent, or Firm* — Quicker Law, LLC

(57) ABSTRACT

Disclosed is a composite comprising from about 50 wt. % to about 97 wt. % of a thermoplastic resin, wherein the thermoplastic resin comprises a polyester; and from about 3 wt. % to about 15 wt. % of a carbon-based filler, wherein the carbon-based filler has a primary surface area of from about 500 to about 1000 $m^2/g$, wherein the composite exhibits a dielectric constant ε' of between 5 and 30 and a dissipation loss ε" of between 0.5 and 45, measured at frequencies between about 10 and about 120 GHz. A molded sample of
(Continued)

Table 1

| Item Description | Unit | CE-1 | CE-2 | EX-1 | EX-2 | EX-3 |
|---|---|---|---|---|---|---|
| PC (LOW VISCOSITY GRADE LEXAN PC) | % | 85.5 | 0 | 0 | 0 | 0 |
| PEI-1 (ENHANCED LOW T IMPACT, HIGH FLOW POLYETHERIMIDE BLEND) | % | 0 | 15 | 0 | 0 | 0 |
| PEI-2 (HIGH FLOW UNFILLED ULTEM 1010-1000) | | 0 | 73 | | | |
| PBT-1 (GE VALOX 305-1001) | % | 0 | 0 | 85.5 | 0 | 0 |
| PBT-2 (GE VALOX 195-1001) | % | 0 | 0 | 0 | 50 | 50 |
| PBT-3 (GE VALOX 315-1001) | % | 0 | 0 | 0 | 35.5 | 35.5 |
| CB1 (ENSACO™ 350G Carbon Powder) | % | 0 | | 14.5 | 14.5 | 0 |
| CB2 (ENSACO™ 360G Carbon Powder) | % | 14.5 | 12 | 0 | 0 | 14.5 |

the composite exhibits a percent reflected power measured in transmission mode of at least 15% when observed according to a Free Space method at frequencies from about 75 GHz to 110 GHz.

13 Claims, 79 Drawing Sheets

(51) Int. Cl.
*G01S 7/02* (2006.01)
*H05K 9/00* (2006.01)

(52) U.S. Cl.
CPC .. *C08K 2201/001* (2013.01); *C08K 2201/006* (2013.01); *C08L 2203/20* (2013.01)

(58) Field of Classification Search
USPC .......................................................... 252/511
See application file for complete search history.

(56) References Cited

U.S. PATENT DOCUMENTS

| | | | | |
|---|---|---|---|---|
| 5,876,647 | A | 3/1999 | Makise et al. | |
| 6,689,835 | B2 | 2/2004 | Amarasekera et al. | |
| 9,505,903 | B2 | 11/2016 | Lee et al. | |
| 2002/0035170 | A1 | 3/2002 | Glatkowski et al. | |
| 2004/0077771 | A1 | 4/2004 | Wadahara et al. | |
| 2008/0139065 | A1 | 6/2008 | Amarasekera et al. | |
| 2013/0221282 | A1* | 8/2013 | Wu | C08L 77/00<br>252/503 |
| 2014/0011011 | A1 | 1/2014 | Fujino et al. | |
| 2016/0355670 | A1 | 12/2016 | Lee et al. | |
| 2018/0213637 | A1* | 7/2018 | Hosoda | B32B 3/266 |
| 2019/0291364 | A1* | 9/2019 | O'Connor | B29C 70/58 |
| 2020/0140679 | A1* | 5/2020 | Peng | B29C 45/14311 |

FOREIGN PATENT DOCUMENTS

| | | | |
|---|---|---|---|
| CN | 107736085 | A | 2/2018 |
| CN | 108603005 | A | 9/2018 |
| CN | 109415532 | A | 3/2019 |
| EP | 3845587 | A1 | 7/2021 |
| JP | 2004-134515 | A | 4/2004 |
| JP | 2005-120322 | A | 5/2005 |
| KR | 10-2006-0052657 | A | 5/2006 |
| KR | 10-2017-0090040 | A | 8/2017 |

OTHER PUBLICATIONS

Yin, H. et al. "Carbon-based nanofillers/Poly(butylene terephthalate): thermal, dielectric, electrical and rheological properties". Journal of Polymer Research, vol. 22 No. 7, Jun. 23, 2015, pp. 1-13.

Qiao, Y.J. et al. "Investigation on Potential Microwave Absorbability of Polyester-composites Filled with Carbon Nanotubes", First IEEE International Conference on Nano/Micro Engineered and Molecular Systems, 2006, pp. 1331-1334.

Al-Saleh, M.H. et al. "EMI shielding effectiveness of carbon based nanostructured polymeric materials: A comparative study," Carbon vol. 60, 2013, pp. 146-156.

Johnk, C. T. A. Engineering Electromagnetic Fields and Waves, New York: Wiley, 1988. (Abstract only).

Chin, W.S. "Dielectric Characteristics of E glass-polyester composite containing conductive carbon black powder" Journal of Composite Materials, vol. 41 No. 4, Feb. 2007, pp. 403-417. (Abstract only).

Song, J.B. "Rheological Properties, morphology, mechanical properties, electrical resistivity and EMI SE of cyclic butylene terephthalate/graphite/carbon black composites". Journal of Polymer Research, vol. 21 No. 9, Aug. 2014. (Abstract only).

International Search Report and Written Opinion mailed Aug. 19, 2021 in PCT/IB2021/056559 (12 pgs).

Li, J. et al. "Effects of PS microspheres on dielectric properties and electromagnetic shielding performance of conductive composites", Fiber Reinforced Plastics/Composites No. 3, 2015, pp. 40-44.

* cited by examiner

Table 1

| Item Description | Unit | CE-1 | CE-2 | EX-1 | EX-2 | EX-3 |
|---|---|---|---|---|---|---|
| PC (LOW VISCOSITY GRADE LEXAN PC) | % | 85.5 | 0 | 0 | 0 | 0 |
| PEI-1 (ENHANCED LOW T IMPACT, HIGH FLOW POLYETHERIMIDE BLEND) | % | 0 | 15 | 0 | 0 | 0 |
| PEI-2 (HIGH FLOW UNFILLED ULTEM 1010-1000) | | 0 | 73 | | | |
| PBT-1 (GE VALOX 305-1001) | % | 0 | 0 | 85.5 | 0 | 0 |
| PBT-2 (GE VALOX 195-1001) | % | 0 | 0 | 0 | 50 | 50 |
| PBT-3 (GE VALOX 315-1001) | % | 0 | 0 | 0 | 35.5 | 35.5 |
| CB1 (ENSACO™ 350G Carbon Powder) | % | 0 | | 14.5 | 14.5 | 0 |
| CB2 (ENSACO™ 360G Carbon Powder) | % | 14.5 | 12 | 0 | 0 | 14.5 |

FIG. 1

Table 2

| Test | Unit | E250G | E350G | E360G |
|---|---|---|---|---|
| Pour density | g/l | 181 | 135 | 133 |
| OAN-value | ml/100g | 186 | 320 | 369 |
| COAN (24M4) | ml/100g | 110 | 270 | 294 |
| Grit >45 micron | ppm | 3 | 5 | 2.2 |
| BET surface area | $m^2/g$ | 65.6 | 770 | 745 |
| Ash content | % | 0.01 | 0.01 | 0.01 |
| Moisture (as packed) | % | 0.1 | 0.01 | 0.5 |
| Volatile matter | % | 0.11 | 0.25 | 0.6 |
| Conduct. rinsing water | µS/cm | 0.9 | 3 | 2.9 |
| pH | | 8.6 | 9.8 | 9.7 |
| Oxygen content | ppm | 980 | 2800 | 2000 |

FIG. 2

Table 3A.

| Property | EX-1 | EX-2 | EX-3 | Unit | Standard |
|---|---|---|---|---|---|
| **MECHANICAL** | | | | | |
| Tensile Strength, yld, Type I, 5 mm/min | 48.7 | 49.7 | 47.3 | MPa | ASTM D 638 |
| Tensile Strength, brk, Type I, 5 mm/min | 48.7 | 49.7 | 47.3 | MPa | ASTM D 638 |
| % Elongation at yield | 1.67 | 1.71 | 1.52 | % | ASTM D 638 |
| % Elongation at break | 1.67 | 1.71 | 1.52 | % | ASTM D 638 |
| Tensile Modulus, 5 mm/min | 3688 | 3674 | 3818 | MPa | ASTM D 638 |
| Flexural Modulus, 1.3 mm/min | 3440 | 3420 | 3510 | MPa | ASTM D 790 |
| Flexural Stress, yield, 1.3 mm/min | 92.5 | 87.9 | 91.9 | MPa | ASTM D 790 |
| Flexural Stress, break, 1.3 mm/min | 92.5 | 87.9 | 91.9 | MPa | ASTM D 790 |
| **IMPACT** | | | | | |
| Izod impact, unnotched, 23°C | 238 | 281 | 214 | J/m | |
| Izod impact, notched, 23°C | 16.6 | 17.2 | 24.6 | J/m | ASTM D 256 |
| Puncture impact (Multi-axial Impact] Energy to max load | 0.72 | 0.52 | | J | ASTM D 3763 |
| Puncture impact (Multi-axial Impact] Energy to failure | 0.66 | 0.68 | | J | ASTM D 3763 |
| Puncture impact (Multi-axial Impact] Energy total | 1.38 | 1.24 | | J | ASTM D 3763 |
| Puncture impact (Multi-axial Impact] Max load | 543.36 | 533.28 | | kN | ASTM D 3763 |
| Puncture impact (Multi-axial Impact] Deflection at max load | 2.56 | 1.72 | | mm | ASTM D 3763 |
| Thermal | | | | | |
| HDT, 1.82 MPa, 3.2mm, unannealed | 119 | 127 | | °C | ASTM D 790 |
| **PHYSICAL** | | | | | |
| Specific Gravity | 1.3665 | 1.3635 | 1.371 | | ASTM D 792 |
| Coefficient of Linear Thermal Expansion - Flow | 77.2 | 77.5 | | um/(m-°C) | ASTM E 831 |
| Coefficient of Linear Thermal Expansion - XFlow | 76.9 | 76.8 | | um/(m-°C) | ASTM E 831 |
| Initial mold shrinkage Flow-Avg | 2.2 | 2.3 | | % | ASTM D 955 |
| Initial mold shrinkage Cross flow-Avg | 2.4 | 2.5 | | % | ASTM D 955 |
| 24 hr mold shrinkage Flow-Avg | 2.3 | 2.3 | | % | ASTM D 955 |
| 24 hr mold shrinkage Cross flow-Avg | 2.5 | 2.6 | | % | ASTM D 955 |
| Mold shrinkage parallel | | | 2.37 | % | SABIC method |
| Mold shrinkage, perpendicular | | | 2.42 | % | SABIC method |
| **ELECTRICAL** | | | | | |
| Surface Resistivity - ASTM D 257 | 30.2 | 31.4 | 36.4 | OHM-P-SQ | ASTM D 257 |
| Volume Resistivity - ASTM D 257 | 41.4 | 37.8 | 21 | Ohm-cm | ASTM D 257 |

FIG. 3A

Table 3B.

| MECHANICAL | CE-1 | Units | Standard | MECHANICAL | CE-2 | Units |
|---|---|---|---|---|---|---|
| Tensile Stress, yield | 60 | MPa | ASTM D638 | Tensile Stress, brk, Type I, 5 mm/min | 74 | MPa |
| Tensile Stress, break | 53 | MPa | ASTM D638 | Tensile Strain, brk, Type I, 5 mm/min | 2.3 | % |
| Tensile Strain, yield | 4.2 | % | ASTM D638 | Tensile Modulus, 5 mm/min | 3840 | MPa |
| Tensile Strain, break | 16.3 | % | ASTM D638 | Flexural Stress, brk, 1.3 mm/min, 50 mm span | 132 | MPa |
| Tensile Modulus, 50 mm/min | 2980 | MPa | ASTM D638 | Flexural Modulus, brk, 1.3 mm/min, 50 mm span | 4000 | MPa |
| Flexural Stress | 89 | MPa | ASTM D790 | Tensile Stress, break, 5 mm/min | 85 | MPa |
| Flexural Modulus | 2710 | MPa | ASTM D790 | Tensile Stress, break, 5 mm/min | 2.8 | % |
| Tensile Stress, yield | 61 | MPa | ISO 527 | Tensile Modulus, 1 mm/min | 3730 | MPa |
| Tensile Stress, break | 54 | MPa | ISO 527 | Flexural Stress | 159 | MPa |
| Tensile Strain, yield | 4.5 | % | ISO 527 | Flexural Modulus, 2 mm/min | 3680 | MPa |
| Tensile Strain, break | 8.5 | % | ISO 527 | **IMPACT** | | |
| Tensile Modulus, 1 mm/min | 2710 | MPa | ISO 527 | Izod Impact, unnotched, 23°C | 346 | J/m |
| Flexural Stress | 75 | MPa | ISO 178 | Izod Impact, notched, 23°C | 16 | J/m |
| Flexural Modulus | 2510 | MPa | ISO 178 | Multiaxial Impact | 1 | J |
| **IMPACT** | | | | Inst. Impact 23°C | 3 | J |
| Izod Impact, unnotched, 23°C | 2342 | J/m | ASTM D4812 | Izod unnotched 80°10°4 +23°C | 21 | kJ/m³ |
| Izod Impact, notched, 23°C | 48 | J/m | ASTM D256 | Izod Impact, notched 80° 10° 4 +23°C | 2 | kJ/m³ |
| Instrumented Impact Energy at peak, 23°C | 4 | J | ASTM D3763 | **THERMAL** | | |
| Multiaxial Impact | 9 | J | ISO 6603 | HDT, 0.45 MPa, 3.2 mm, unannealed | 205 | °C |
| Izod Impact, unnotched 80°10°4 +23°C | 167 | kJ/m³ | ISO 180/1U | HDT, 1.82 MPa, 3.2 mm, unannealed | 201 | °C |
| Izod Impact, notched 80° 10° 4 +23°C | 5 | kJ/m³ | ISO 180/1A | CTE, -30°C to 30°C, flow | 4.4E+05 | 1/°C |
| **THERMAL** | | | | CTE, -30°C to 30°C, xflow | 4.5E+05 | 1/°C |
| HDT, 1.82 MPa, 3.2mm, unannealed | 132 | °C | ASTM D648 | HDT/B, 0.45 MPa Flatw 80°10°4 sp-64mm | 203 | °C |
| CTE, -40°C to 40°C, flow | 6.3E+05 | 1/°C | ASTM E 831 | HDT/M, 1.8 MPa Flatw 80°10°4 sp-64mm | 192 | °C |
| CTE, -40°C to 40°C, xflow | 5.94E+05 | 1/°C | ASTM E831 | **PHYSICAL** | | |
| CTE, -40°C to 40°C, flow | 6.35E+05 | 1/°C | ISO 11359-2 | Specific Gravity | 1.3 | |
| CTE, -40°C to 40°C, xflow | 6.08E+05 | 1/°C | ISO 11359-2 | Density | 1.29 | g/cm² |
| HDT/M, 1.8 MPa Flatw 80°10°4 sp-64mm | 133 | °C | ISO 75/M | Moisture Absorption, 50% RH, 24 hrs | 0.35 | % |
| Relative Temp Index, Elec[1] | 80 | °C | UL 7468 | Mold Shrinkage, flow, 24 hrs | 0.3-0.5 | % |
| Relative Temp Index, Mech w/Impact[1] | 80 | °C | UL 7468 | Mold Shrinkage, xflow, 24 hrs | 0.5-0.7 | % |
| Relative Temp Index, Mech w/o Impact[1] | 80 | °C | UL 7468 | Moisture Absorption (23°C | 0.25 | % |

FIG. 3B

Table 3B. [cont'd]

| **PHYSICAL** | **CE-1** | | | **ELECTRICAL** | **CE-2** | |
|---|---|---|---|---|---|---|
| Density | 1.23 | g/cm² | ASTM D792 | Volume Resistivity | 100-100000 | Ohm-cm |
| Moisture Absorption, 50% RH, 24 hrs | .2 | % | ASTM D570 | **INJECTION MOLDING** | | |
| Mold Shrinkage, flow, 24 h | .4 | % | ASTM D955 | Drying Temperature | 120-150 | °C |
| Mold Shrinkage, xflow, 24 h | .5 | % | ASTM D955 | Drying Time | 46 | hrs |
| Mold Shrinkage, flow 24 h | .42 | % | ISO 294 | Maximum Moisture Content | .02 | % |
| Mold Shrinkage, xflow, 24 h | .5 | % | ISO 294 | Melt Temperature | 360-365 | °C |
| Density | 1.23 | g/cm² | ISO 1183 | Front - Zone 3 Temperature | 365-375 | °C |
| **ELECTRICAL** | | | | Middle - Zone 2 Temperature | 355-365 | °C |
| Volume Resistivity | 100-100000 | Ohm-cm | ASTM D257 | Rear - Zone 1 Temperature | 345-355 | °C |
| Surface Resistivity | 1.E+(02-05) | Ohm | ASTM D257 | Mold Temperature | 120-150 | °C |
| **FLAME CHARACTERISTICS(1)** | | | | Back Pressure | 0.3-0.7 | MPa |
| UL Yellow Card Link | E121562-1039099 | -- | -- | Screw Speed | 60-100 | rpm |
| UL Rec., 94HB Flame Cl | ≥1.5 | Mm | UL 94 | **MECHANICAL** | | |
| **INJ MOLDING** | | | | Tensile Stress, brk, Type I, 5 mm/min | 74 | MPa |
| Drying Temp | 120 | °C | | Tensile Strain, brk, Type I, 5 mm/min | 2.3 | % |
| Drying Time | 4 | hrs | | Tensile Modulus, 5 mm/min | 3840 | MPa |
| Max Moisture Content | .02 | % | | Flexural Stress, brk, 1.3 mm/min, 50 mm span | 132 | MPa |
| Melt Temperature | 305-325 | °C | | Flexural Modulus, brk, 1.3 mm/min, 50 mm span | 4000 | MPa |
| Front - Zone 3 Temp | 320-330 | °C | | Tensile Stress, break, 5 mm/min | 85 | MPa |
| Middle - Zone 2 Temp | 310-320 | °C | | Tensile Stress, break, 5 mm/min | 2.8 | % |
| Rear - Zone 1 Temp | 295-305 | °C | | Tensile Modulus, 1 mm/min | 3730 | MPa |
| Mold Temperature | 80-110 | °C | | Flexural Stress | 159 | MPa |
| Back Pressure | 0.2-0.3 | MPa | | Flexural Modulus, 2 mm/min | 3680 | MPa |
| Screw Speed | 30-60 | rpm | | **IMPACT** | | |
| | | | | Izod Impact, unnotched, 23°C | 346 | J/m |

FIG. 3C

Table 4

| | Surface Resistivity (ohms/sq) | Volume Resistivity (ohms-cm) |
|---|---|---|
| EX -3 | 43 | 20 |
| EX -2 | 50 | 27 |
| CE2 | 837 | 2,746 |
| CE1 | 291 | 216 |

FIG. 4

Table 5

| | | $\varepsilon'$ | | | $\varepsilon''$ | | | $Df = \tan\delta$ $\varepsilon''/\varepsilon'$ | | |
|---|---|---|---|---|---|---|---|---|---|---|
| | | 75 GHz | 92.5 GHz | 110 GHz | 75 GHz | 92.5 GHz | 110 GHz | 75 GHz | 92.5 GHz | 110 GHz |
| PC / $CB_2$ | CE1-A | 8.1913 | 5.3851 | 3.8243 | 1.3604 | 0.5871 | 0.3551 | 0.166 | 0.109 | 0.093 |
| | CE1-B | 8.1955 | 5.3885 | 3.8247 | 1.3631 | 0.5878 | 0.3558 | 0.166 | 0.109 | 0.093 |
| PEI / $CB_2$ | CE2-A | 8.0690 | 5.4133 | 3.7666 | 1.6577 | 0.6604 | 0.4511 | 0.205 | 0.122 | 0.120 |
| | CE2-B | 7.9758 | 5.3787 | 3.7576 | 1.5868 | 0.6504 | 0.4505 | 0.199 | 0.121 | 0.120 |
| PBT / $CB_1$ | EX2-A | 16.6176 | 10.4572 | 7.2255 | 1.3044 | 0.8593 | 0.4715 | 0.078 | 0.082 | 0.065 |
| | EX2-B | 16.5736 | 10.3952 | 7.4007 | 1.3348 | 0.9049 | 0.7145 | 0.081 | 0.087 | 0.097 |
| PBT / $CB_2$ | EX3-A | 17.9426 | 11.1661 | 7.8649 | 1.4591 | 0.9678 | 0.8116 | 0.081 | 0.087 | 0.103 |
| | EX3-B | 17.6552 | 11.0857 | 7.8054 | 1.3283 | 0.8819 | 0.7118 | 0.075 | 0.080 | 0.091 |

FIG. 6

Table 6

| | REFLECTION LOSS (dB) | | |
|---|---|---|---|
| | 75 GHz | 92.5 GHz | 110 GHz |
| CE1-A | -4.41 | -4.39 | -4.64 |
| CE1-B | -4.40 | -4.39 | -4.66 |
| CE2-A | -4.96 | -4.97 | -5.12 |
| CE2-B | -5.05 | -4.97 | -5.09 |
| EX2-A | -4.22 | -4.33 | -4.57 |
| EX2-B | -4.32 | -4.35 | -4.54 |
| EX3-A | -3.85 | -4.03 | -4.32 |
| EX3-B | -3.85 | -4.03 | -4.31 |

FIG. 7

Table 7

| | VALOX 195 | VALOX 315 | ENSACO 360G Carbon Powder |
|---|---|---|---|
| CE3 | 57.31 | 40.69 | 2 |
| EX-4 | 56.14 | 39.86 | 4 |
| EX-5 | 54.97 | 39.03 | 6 |
| EX-6 | 53.80 | 38.20 | 8 |
| EX-7 | 52.63 | 37.37 | 10 |
| EX-2* | 50 | 35.5 | 14.5 * |
| | | | Ex-2 contains Ensaco 350G carbon black |

FIG. 14

Table 8

| | Frequency (Hz) | ε′ | ε″ | ε″/ε′ (tan δ) | Attenuation Constant (dB/cm) | Total Shielding Effectiveness (dB) | RL Measured (Metal-Backed) (dB) | RL Calculated (Metal-Backed) (dB) | % Power in Metal-Backed Reflection (Absorption) | % Power in Transmission (Reflected) | % Power in Transmission (Absorbed) | % Power in Transmission (Transmitted) |
|---|---|---|---|---|---|---|---|---|---|---|---|---|
| CE3 | 7.70E+10 | 4.181 | 0.424 | 0.101 | -14.504 | 5.566 | -5.407 | -5.504 | 71.20 | 13.94 | 58.30 | 27.76 |
| EX-4 | 7.70E+10 | 5.918 | 1.297 | 0.219 | -37.119 | 13.008 | -6.269 | -6.737 | 76.39 | 18.66 | 76.34 | 5.00 |
| EX-5 | 7.70E+10 | 7.955 | 2.624 | 0.330 | -64.310 | 21.734 | -6.319 | -6.274 | 76.66 | 25.00 | 74.33 | 0.67 |
| EX-6 | 7.70E+10 | 9.858 | 4.032 | 0.409 | -88.170 | 29.663 | -5.521 | -5.344 | 71.95 | 28.34 | 71.55 | 0.11 |
| EX-7 | 7.70E+10 | 11.758 | 6.318 | 0.537 | -124.884 | 41.199 | -4.964 | -4.702 | 68.11 | 32.30 | 67.70 | 0.01 |
| EX-2 | 7.70E+10 | 15.654 | 12.266 | 0.784 | -203.767 | 73.528 | -4.070 | -3.718 | 60.82 | 42.49 | 57.51 | 0 |

FIG. 15

Table 9

| Item Description | Unit | CE-3 | EX-4 | EX-5 | EX-6 | EX-7 | **EX-2** |
|---|---|---|---|---|---|---|---|
| VALOX 195 1001 (C9060) | % | 57.31 | 56.14 | 54.97 | 53.80 | 52.63 | **50** |
| VALOX 315 1001 (C601) | % | 40.96 | 39.86 | 39.03 | 38.20 | 37.37 | **35.5** |
| ENSACO 360G Carbon Powder | % | 2 | 4 | 6 | 8 | 10 | **14.5** |
| | | | | | | | |
| | % | 100 | 100 | 100 | 100 | 100 | 100 |
| (Valox 195 / Valox 315) Ratio | | 1.408 | 1.408 | 1.408 | 1.408 | 1.408 | 1.408 |
| Total Resin | | 98 | 96 | 94 | 92 | 90 | 85.5 |
| | | | | | | | |
| **Volume Resistivity Average (Ohm.cm)** | | 7.20E+14 | 5.10E+14 | 6.60E+10 | 7.00E+02 | 6.40E+01 | **20** |
| **Volume Resistivity St Dev (Ohm.cm)** | | 6.20E+14 | 2.60E+14 | 5.00E+10 | 4.50E+02 | 7.00E+00 | **0** |
| | | | | | | | |
| **Surface Resistivity Average (Ohm/sq)** | | 1.30E+13 | 2.90E+13 | 2.30E+09 | 4.20E+03 | 3.80E+02 | **43** |
| **Surface Resistivity St Dev (Ohm/sq)** | | 7.00E+12 | 3.50E+13 | 1.20E+09 | 3.10E+03 | 4.70E+01 | **0** |

FIG. 21

2-SHOT INJECTION MOLDING PROCESS

STEP 1
Press closed; first shot injected into first mold

STEP 2
Press opened; part created from first shot is robotically transferred to second mold STEP 3
Press closed; first shot injected into first mold; second shot injected into second mold STEP 4
Press opened; completed 2-shot part robotically removed; cycle starts again Table 10

| Sample ID | | ABSORBER PBT-A | ABSORBER PBT-B | ABSORBER PBT-C |
|---|---|---|---|---|
| Item Description | Unit | CE-4 | EX-8 | EX-9 |
| VALOX 195 1001 (C9060) | % | 40.93 | 40.93 | 38.88 |
| VALOX 315 1001 (C601) | % | 29.07 | 29.07 | 27.62 |
| ENSACO 360G Carbon Powder | % | 4 | 10 | 13.5 |
| Glass Fibers - JM718 | % | 26 | 20 | 20 |
| Total Composition | % | 100 | 100 | 100 |
| (Valox 195 / Valox 315) Ratio | | 1.408 | 1.408 | 1.408 |
| Total Resin | | 70 | 70 | 66.5 |

Table 11

| ABSORBER PBT-A | | |
|---|---|---|
| CE-4 | | |
| Point | Viscosity (Poises) | Shear rate (1/s) |
| 1 | 1273.9 | 4315.4 |
| 2 | 1284 | 4310.54 |
| 3 | 1532 | 3007.09 |
| 4 | 1838 | 2004.92 |
| 5 | 2500 | 1002.04 |
| 6 | 1301 | 4310.41 |

Table 12

| ABSORBER PBT-B | | |
|---|---|---|
| EX-8 | | |
| Point | Viscosity (Poises) | Shear rate (1/s) |
| 1 | 1200.4 | 4315.64 |
| 2 | 1213.1 | 4309.81 |
| 3 | 1452 | 3006.48 |
| 4 | 1767 | 2003.95 |
| 5 | 2386 | 1001.8 |
| 6 | 1206 | 4309.93 |

Table 13

| ABSORBER PBT-C | | |
|---|---|---|
| EX-9 | | |
| Point | Viscosity (Poises) | Shear rate (1/s) |
| 1 | 997 | 4315.91 |
| 2 | 1019 | 4309.08 |
| 3 | 1229 | 3007.21 |
| 4 | 1486 | 2003.34 |
| 5 | 2136 | 1002.77 |
| 6 | 1005 | 4310.54 |

FIG. 39

Table 14

| | Material Description | ABSORBER PBT-A | ABSORBER PBT-B | ABSORBER PBT-C |
|---|---|---|---|---|
| | Batch | CE-4 | EX-8 | EX-9 |
| Testing | Unit | Results | Results | Results |
| Surface Resistivity | Lg/sq | 11.03 | 2.31 | 1.92 |
| *Volume Resistivity* | Lg/sq | 11.28 | 2.02 | 1.92 |

Table 15

| | Material Description | ABSORBER PBT-A | ABSORBER PBT-B | ABSORBER PBT-C |
|---|---|---|---|---|
| | Batch | CE-4 | EX-8 | EX-9 |
| Testing | Unit | Results | Results | Results |
| Melt Viscosity Cap. Rheo. | Poises | 1273.9 | 1200.4 | 997 |
| Filler | % | 26.12 | 20.13 | 20.01 |
| Izod Impact ASTM | flb/in | 1.32 | 1.02 | 0.81 |
| Surface Resistivity | Lg/sq | 11.03 | 2.31 | 1.92 |
| Tensile Strenght ASTM | Mpa | 124.89 | 74.81 | 37.68 |
| Tensile Modulus ASTM | Mpa | 9286.69 | 8245.71 | 8981.31 |

FIG. 40

Table 16

| Item Description | Unit | CE-5 | CE-6 |
|---|---|---|---|
| VALOX 195 1001 (C9060) | % | 52.63 | 50 |
| VALOX 315 1001 (C601) | % | 37.37 | 35.5 |
| ENSACO 360G Carbon Powder | % | 10 | 14.5 |
| Total Composition | % | 100 | 100 |
| (Valox 195 / Valox 315) Ratio | | 1.408 | 1.408 |
| Total Resin | | 90 | 85.5 |

FIG. 41A

Table 17

| | CE-5 | | | | | |
|---|---|---|---|---|---|---|
| | 15 minutes (1) | 15 minutes (2) | 15 minutes (3) | 15 minutes (4) | FINAL | |
| Surface Resisitivity (Log Ohm) | 2.07 | 2.17 | 2.17 | 2.15 | 2.16 | 145 |
| Volume Resisitivity (Log Ohm-cm) | 2.58 | 2.59 | 2.61 | 2.91 | 2.28 | |
| Tensile Strength ASTM (PSI) | 6,974 | 7,083 | 6,526 | 7,196 | 7,502 | 191 |
| Tensile Modulus ASTM (PSI) | 470,559 | 461,224 | 463,591 | 456,824 | 443,007 | |
| Izod Impact ASTM (ft-lbf/in) | 0.38 | 0.44 | 0.39 | 0.4 | 0.39 | |

*(No GF → Modulus too low)*

Table 18

| | CE-6 | | | | | | ER042575 TDS (Lab sample) |
|---|---|---|---|---|---|---|---|
| | 15 minutes (1) | 15 minutes (2) | 15 minutes (3) | 15 minutes (4) | FINAL | | |
| Surface Resisitivity (Log Ohm) | 1.77 | 1.81 | 1.81 | 1.78 | 1.84 | 69 | **1.63** |
| Volume Resisitivity (Log Ohm-cm) | 2.19 | 2.19 | 2.19 | 2.2 | 2.21 | 162 | **1.30** |
| Tensile Strength ASTM (PSI) | 5,016 | 5,243 | 5,399 | 5,438 | 5,456 | | **7,200** |
| Tensile Modulus ASTM (PSI) | 513,438 | 512,015 | 513,790 | 506,924 | 505,114 | | **532,730** |
| Izod Impact ASTM (ft-lbf/in) | 0.24 | 0.26 | 0.24 | 0.22 | 0.24 | | **0.32** |

*(No GF → Modulus too low)*

FIG. 41B

Table 19

| | Material Description | ABSORBER PBT-A | ABSORBER PBT-B | ABSORBER PBT-C |
|---|---|---|---|---|
| | Batch | CE-4 | EX-8 | EX-9 |
| Testing | Unit | Results | Results | Results |
| Melt Viscosity Cap. Rheo. | Poises | 1273.9 | 1200.4 | 997 |
| Filler | % | 26.12 | 20.13 | 20.01 |
| Izod Impact ASTM | flb/in | 1.32 | 1.02 | 0.81 |
| Surface Resistivity | Lg/sq | 11.03 | 2.31 | 1.92 |
| Tensile Strenght ASTM | Mpa | 124.89 | 74.81 | 37.68 |
| Tensile Modulus ASTM | Mpa | 9286.69 | 8245.71 | 8981.31 |

Table 20

| | Material Description | ABSORBER PBT-A | ABSORBER PBT-B | ABSORBER PBT-C |
|---|---|---|---|---|
| | Batch | CE-4 | EX-8 | EX-9 |
| Testing | Unit | Results | Results | Results |
| Surface Resistivity | Lg/sq | 11.03 | 2.31 | 1.92 |
| *Volume Resistivity* | Lg/sq | 11.28 | 2.02 | 1.92 |

Table 21

| | Trial CE-5 | | | | |
|---|---|---|---|---|---|
| | 15 minutes (1) | 15 minutes (2) | 15 minutes (3) | 15 minutes (4) | FINAL |
| Surface Resisitivity (Log Ohm) | 2.07 | 2.17 | 2.17 | 2.15 | 2.16 |
| Volume Resisitivity (Log Ohm0cm) | 2.58 | 2.59 | 2.61 | 2.91 | 2.28 |
| Tensile Strength ASTM (PSI) | 6,974 | 7,083 | 6,526 | 7,196 | 7,502 |
| Tensile Modulus ASTM (PSI) | 470,559 | 461,224 | 463,591 | 456,824 | 443,007 |
| Izod Impact ASTM (ft-lbf/in) | 0.38 | 0.44 | 0.39 | 0.4 | 0.39 |

FIG. 42

COMPOSITES HAVING IMPROVED MICROWAVE SHIELDING PROPERTIES

CROSS-REFERENCE TO RELATED APPLICATION

This application is the National Stage of International Application No. PCT/IB2021/056559 filed Jul. 20, 2021, which claims priority to and the benefit of European Application No. 20186793.4 filed Jul. 20, 2020, the disclosures of which are incorporated herein by this reference in their entireties.

FIELD OF THE DISCLOSURE

The present disclosure relates to materials exhibiting microwave absorptive properties, and in particular to materials exhibiting microwave absorptive properties for automotive radar sensor applications.

BACKGROUND OF THE DISCLOSURE

The automotive industry is increasingly employing electronic radar sensors to provide drivers assistance with features such as adaptive cruise control, parking/lane change assist, back-up warning, blind spot detection, collision avoidance, and many others. To ensure proper operation of these sensors, these devices must be protected from potentially spurious sources of electromagnetic radiation Microwave radiation, from about 1 gigahertz (GHz) (300 millimeter (mm) wavelength) to 300 GHz frequency (1 mm wavelength), is the most common source of electromagnetic energy used in the operation of radar sensors for automotive applications. Metals (aluminum, stainless steel, etc.), polymer composite materials containing metallic fillers, such as aluminum flakes, stainless steel fibers and silver-coated polyamide fibers, metalized coatings, inherently conductive polymers (polyacetylene, polypyrrole, polythiophene, polyaniline, etc.), silicon carbide, ferrites (iron(III) oxide and nickel $Fe_2O_3$+Ni/zinc Zn/cadmium Cd/cobalt Co oxide), and carbonil iron are some of the materials that are being used to shield automotive radar sensors from damaging microwave electromagnetic radiation.

Metals are the most common materials for microwave (MW) shielding, but they are heavy and expensive. Metals also require complex processing to be shaped into a final part. Polymers or carbon composites are typically preferred because of their lower density, lower cost, easy of shaping, and ease of manufacture into high volume molded parts. Further, carbon fillers may be used in the composite to trap microwave radiation in enclosure walls thereby protecting the electronic sensors inside the cavity. A moderate electrical conductivity and large dielectric and magnetic losses are usually required for materials used in microwave shielding. Aspects of the present disclosure addresses these and other needs.

SUMMARY

Aspects of the disclosure relate to a composite comprising: from about 50 wt. % to about 97 wt. % of a thermoplastic resin, wherein the thermoplastic resin comprises a polyester; and from about 3 wt. % to about 15 wt. % of a carbon-based filler, wherein the carbon-based filler has a primary surface area of from about 500 to about 1000 square meters per gram ($m^2$/g), wherein the combined weight percent value of all components does not exceed 100 wt. %, and all weight percent values are based on the total weight of the composite. The composite exhibits a dielectric constant ε' of between 5 and 30 and a dissipation loss ε" of between 0.5 and 45, measured at frequencies between about 10 and about 120 GHz. A molded sample of the composite exhibits a percent reflected power measured in transmission mode of at least 15% when observed according to a Free Space method at frequencies from about 75 GHz to 110 GHz.

BRIEF DESCRIPTION OF THE FIGURES

The accompanying figures, which are incorporated in and constitute a part of this specification, illustrate several aspects and together with the description serve to explain the principles of the disclosure.

FIG. 1 presents Table 1 including the formulations of CE-1, CE-2, and EX-1 to EX-3.

FIG. 2 presents Table 2 including properties of carbon black additives.

FIG. 3A presents Table 3A including mechanical, impact, thermal, physical, and electrical properties for EX-1 through EX-3; FIG. 3B presents Table 3B including mechanical, impact, thermal, physical, and electrical properties for CE-1 and CE-2; FIG. 3C presents Table 3B for CE-1 and CE-2.

FIG. 4 presents Table 4 including surface and volume resistivities for CE-1, CE-2, EX-2, and EX-3.

FIG. 6 presents Table 5 including values for the imaginary part ε" and ε' real part as well as the dissipation factor, tan δ (ε"/ε') for each CE-1, CE-2, EX-2, and EX-3.

FIG. 7 presents Table 6 including the values for reflection loss (in decibels, dB) at example frequencies 75 GHz, 92.5 GHz, and 110 GHz.

FIG. 14 presents Table 7 including the formulations for samples EX-4, EX-5, EX-6, EX-7, CE3, and EX-2.

FIG. 15 presents Table 8 including values for real ε' and imaginary ε" parts of the complex permittivity, attenuation constant, total shielding effectiveness, measured reflection loss (metal-backed reflection mode), calculated reflection loss (metal-backed reflection mode), percent absorbed power (metal-backed reflection mode), percent reflected power (transmission mode), percent absorbed power (transmission mode), and percent transmitted power (transmission mode) for samples EX-4, EX-5, EX-6, EX-7, CE3, and EX-2 observed at 77 GHz.

FIG. 21 presents Table 9 including values for volume and surface resistivities for samples EX-4, EX-5, EX-6, EX-7, CE-3, and EX-2.

FIG. 38 shows the formulations CE-4, EX-8, EX-9 of Table 10.

FIG. 39 presents Tables 11, 12, and 13 showing the steady-state shear viscosities of the formulations.

FIG. 40 presents Tables 14 and 15 showing the mechanical properties and volume and surface electrical resistivities of CE-4, EX-8, and EX-9.

FIG. 41A presents Table 16 showing formulations for comparative samples CE-5 and CE-6.

FIG. 41B presents Tables 17 and 18 showing the respective properties for CE-5 and CE-6.

FIG. 42 presents Tables 19, 20, and 21 showing the physical and electrical resistivity properties among the samples.

DETAILED DESCRIPTION

Figure 5:
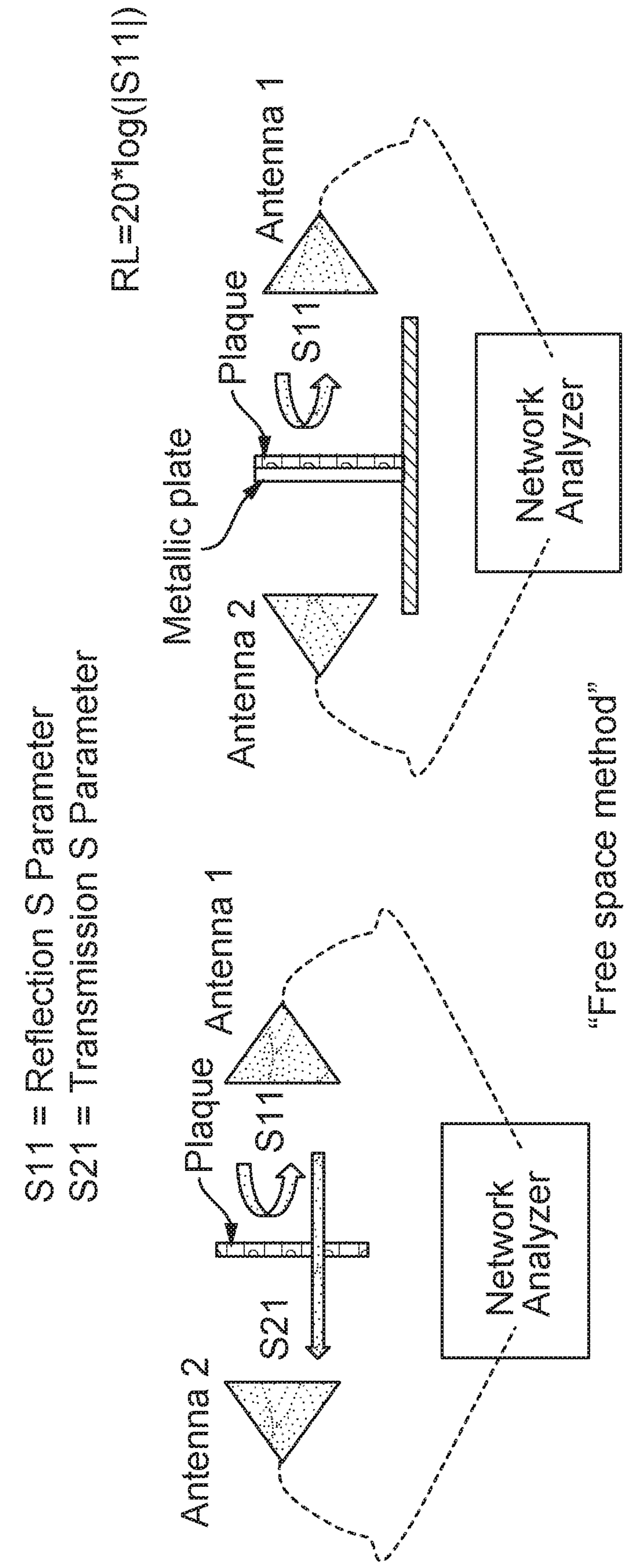
FIG. 5 presents a diagram of the transmission mode and metal-backed reflection mode, respectively, of the Free Space Method for determining dielectric constant ε' and dissipation loss ε".
Figure 8A:
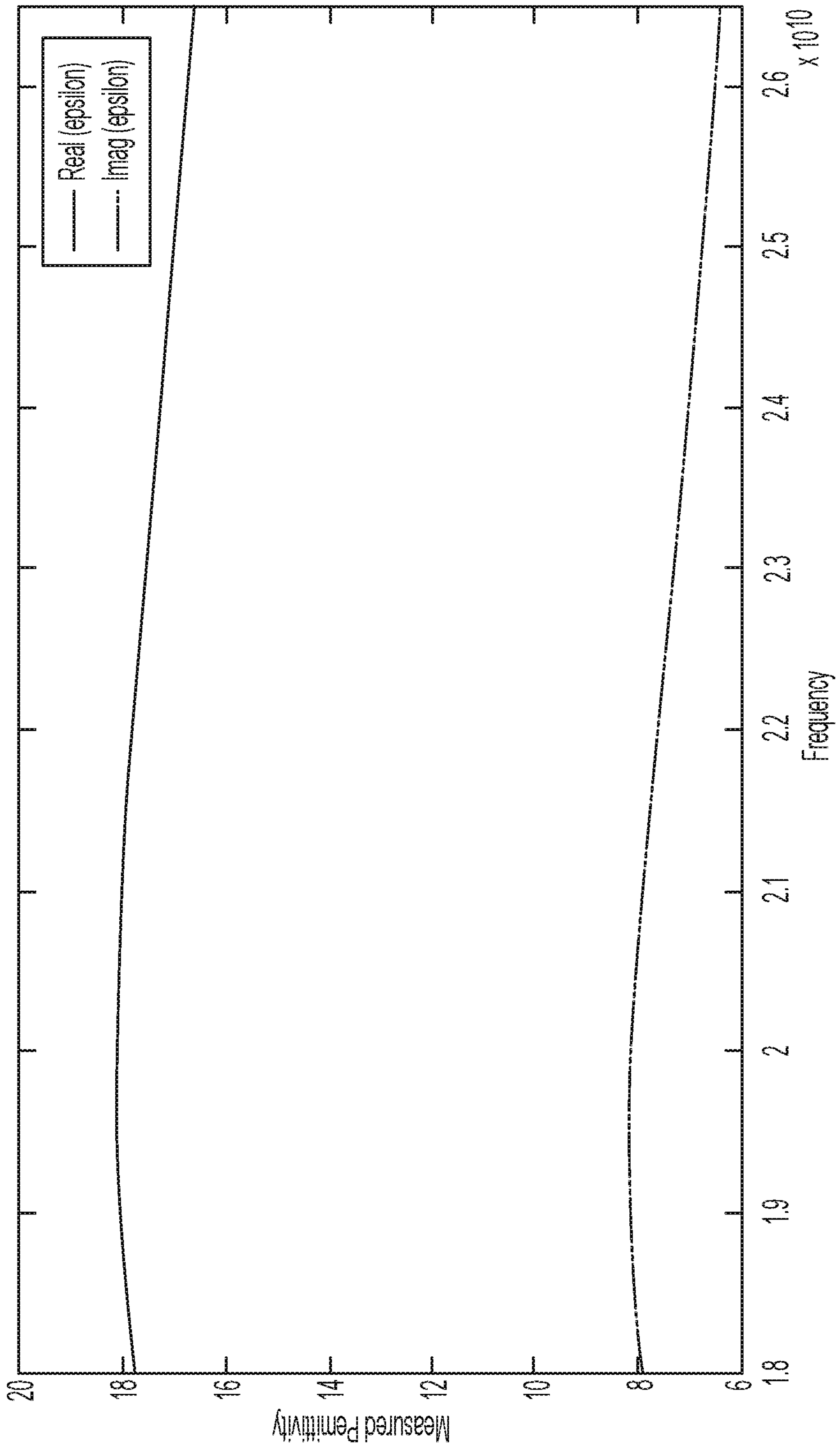
FIG. 8A shows a graphical representation of the real ε' and imaginary ε" parts of the complex permittivity for comparative sample CE-1 at frequencies of 18 GHz to 26.5 GHz (K-band).
Figure 8B:
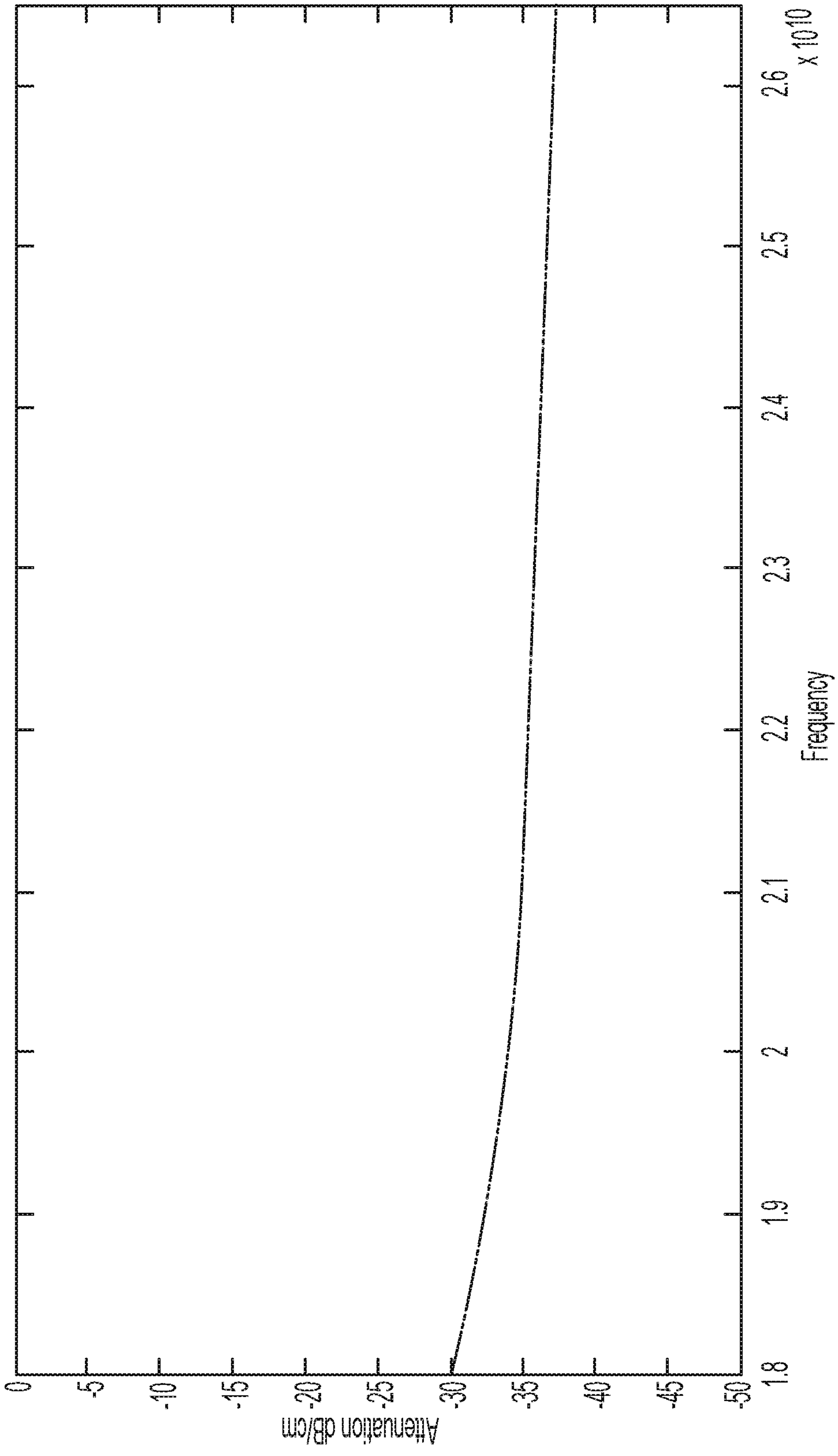
FIG. 8B shows a graphical representation of attenuation constant values (in decibels per centimeter dB/cm) for comparative sample CE-1 at frequencies of 18 GHz to 26.5 GHz (K-band).
Figure 8C:
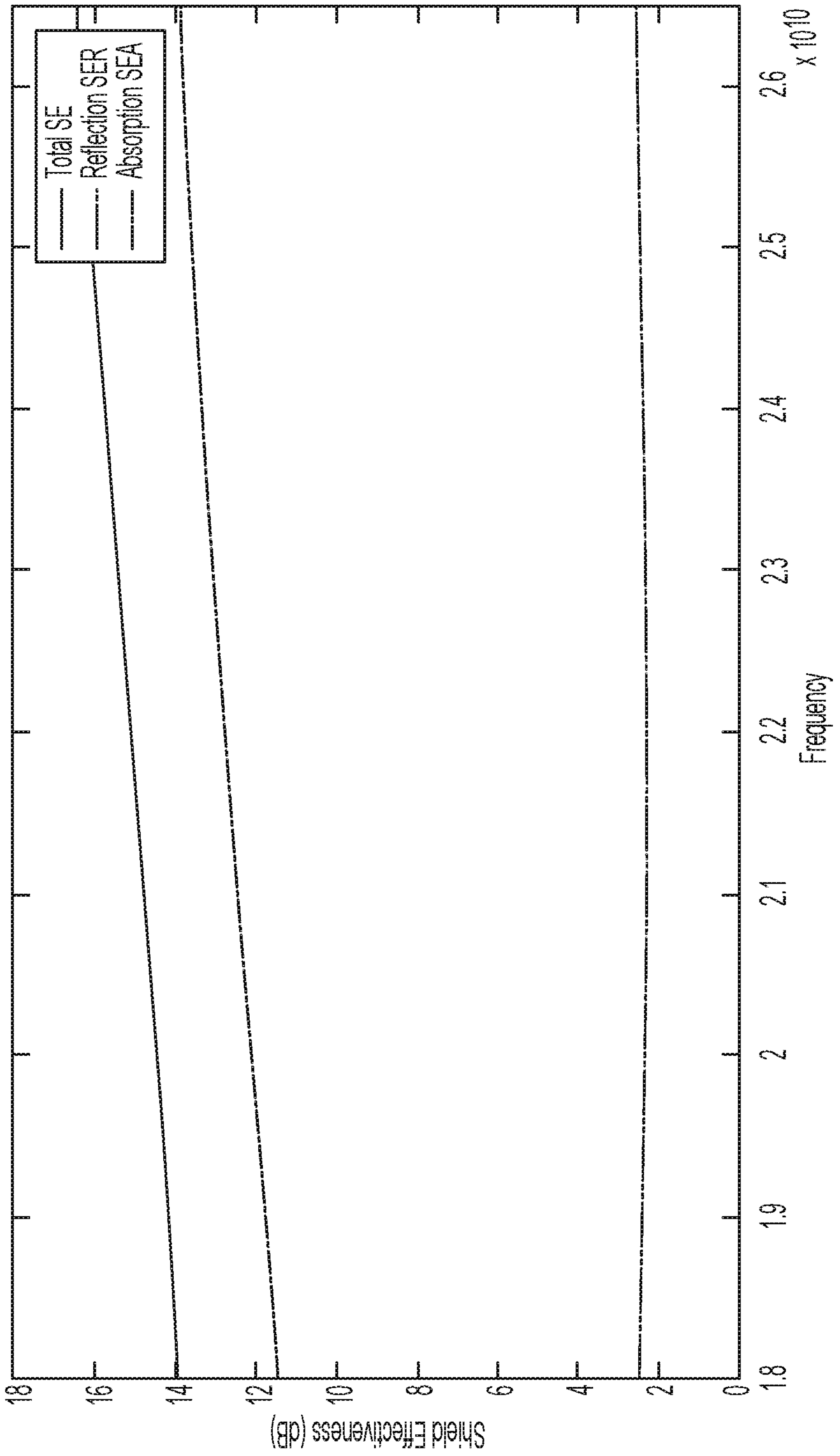
FIG. 8C shows a graphical representation of the shielding effectiveness (in dB) for comparative sample CE-1 at frequencies of 18 GHz to 26.5 GHz (K-band).
Figure 8D:
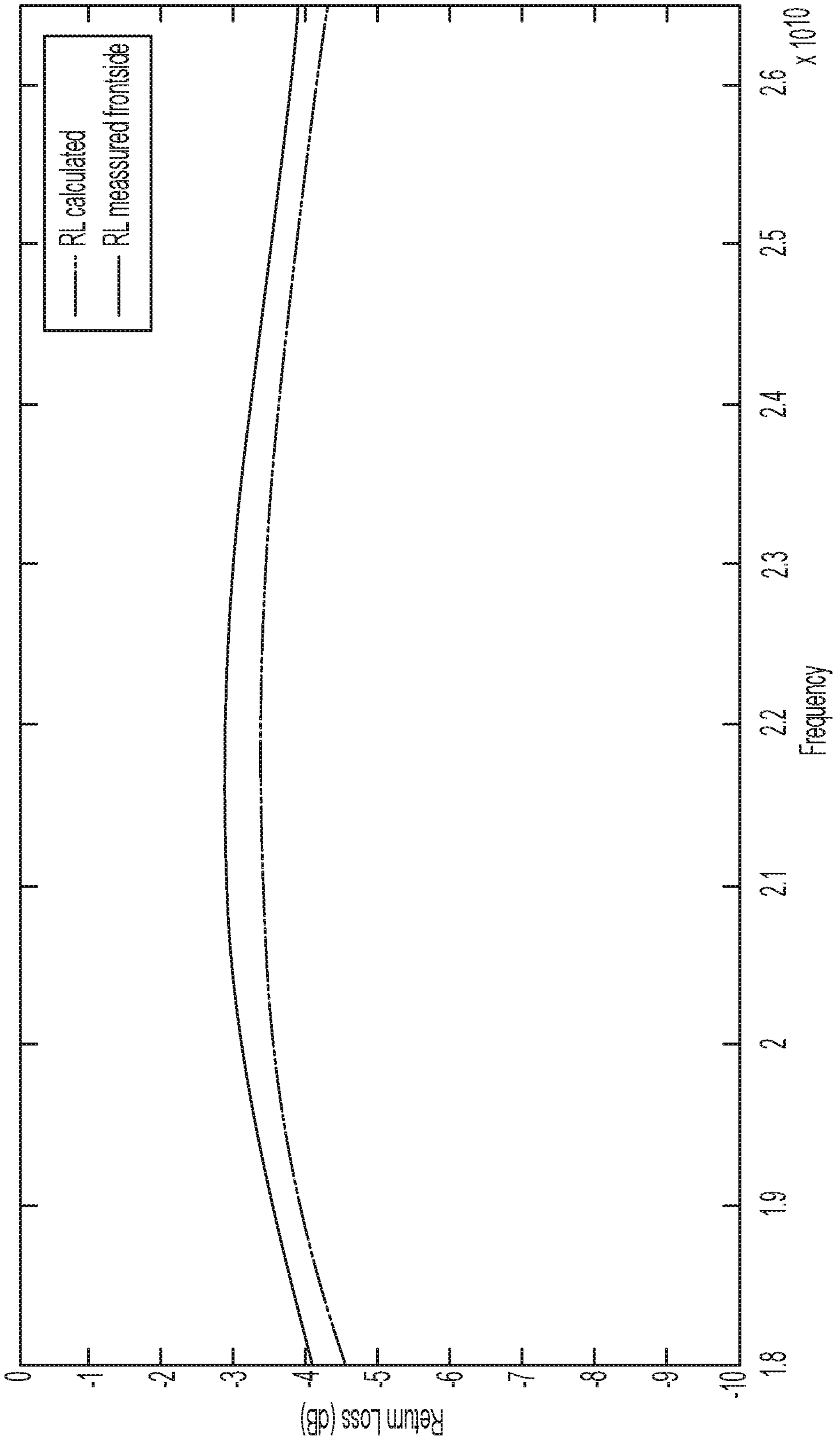
FIG. 8D shows a graphical representation of the return loss in metal-backed reflection mode (in dB) for comparative sample CE-1 at frequencies of 18 GHz to 26.5 GHz (K-band).
Figure 9A:
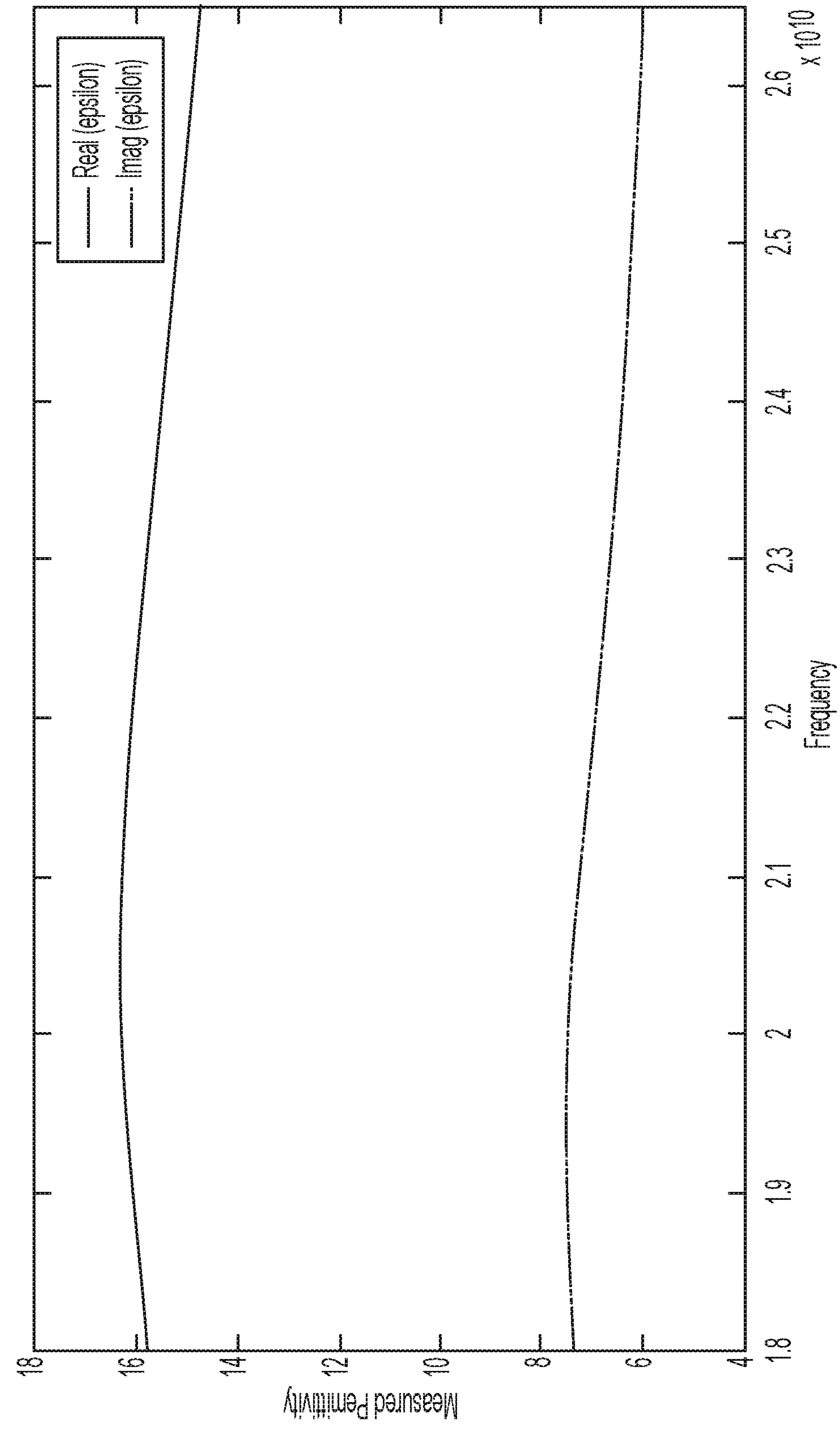
FIG. 9A shows a graphical representation of the real ε' and imaginary ε" parts of the complex permittivity for comparative sample CE-2 at frequencies of 18 GHz to 26.5 GHz (K-band).
Figure 9B:
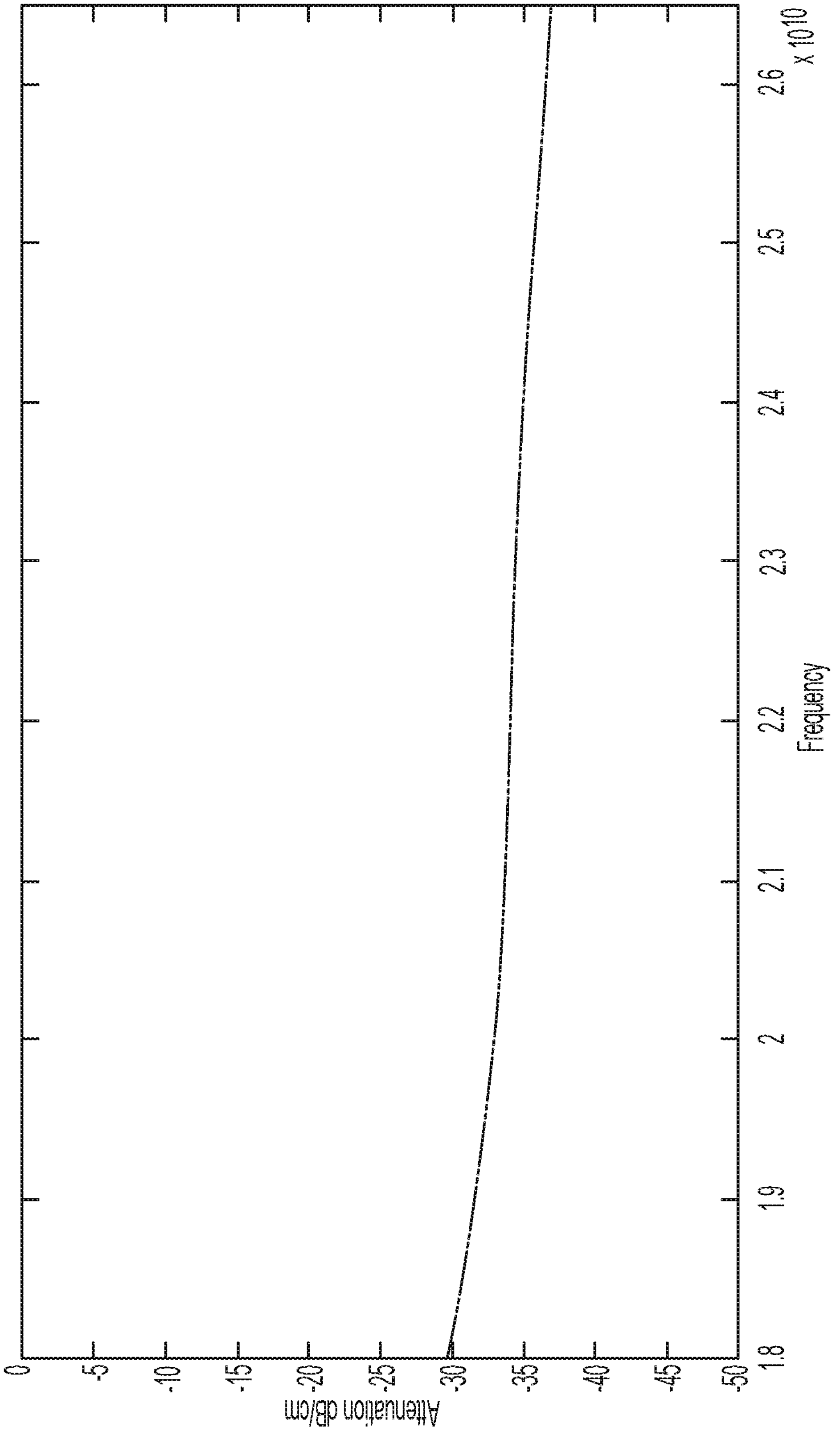
FIG. 9B shows a graphical representation of attenuation constant values (in dB/cm) for comparative sample CE-2 at frequencies of 18 GHz to 26.5 GHz (K-band).
Figure 9C:
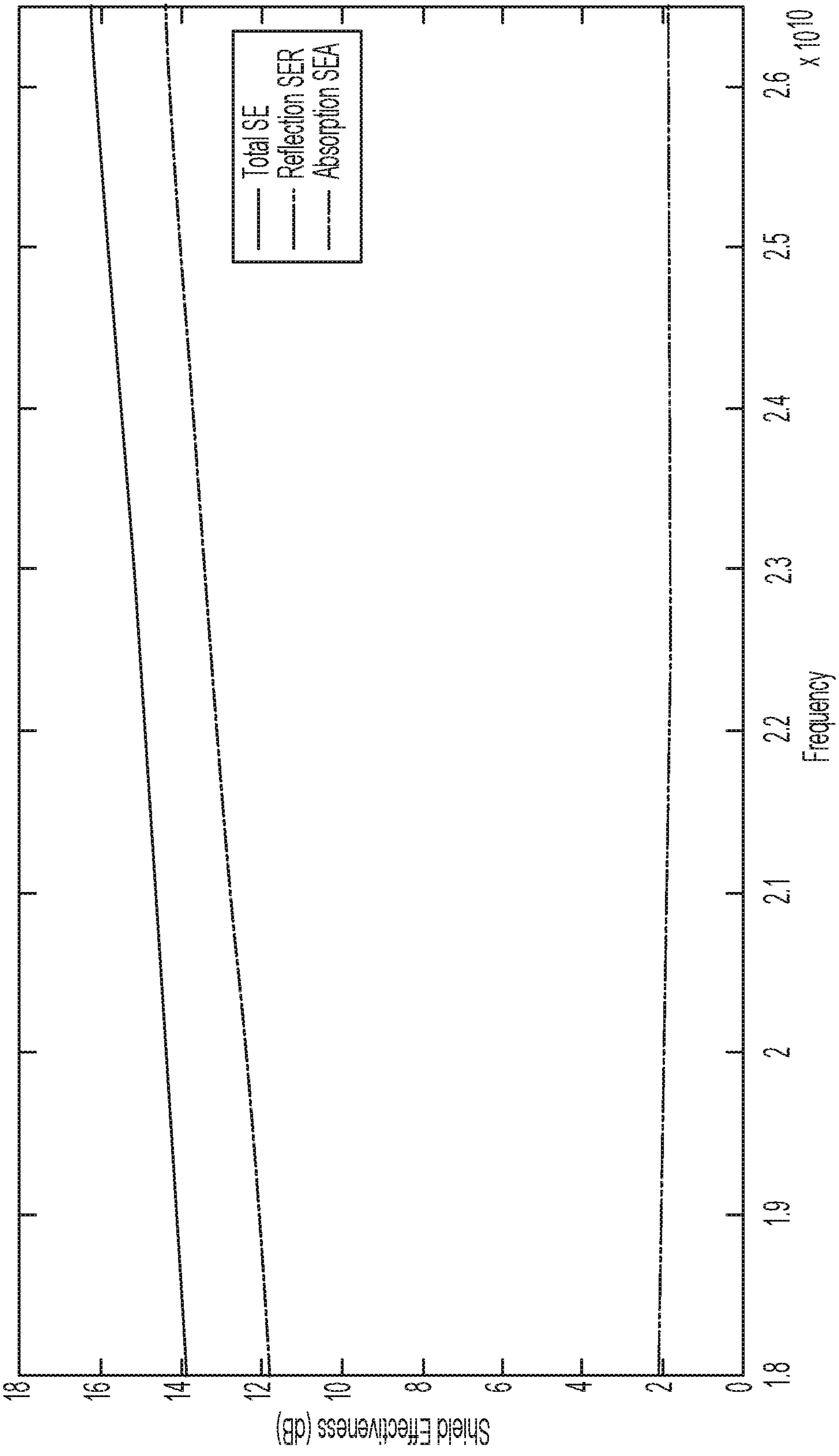
FIG. 9C shows a graphical representation of the shielding effectiveness (in dB) for comparative sample CE-2 at frequencies of 18 GHz to 26.5 GHz (K-band).
Figure 9D:
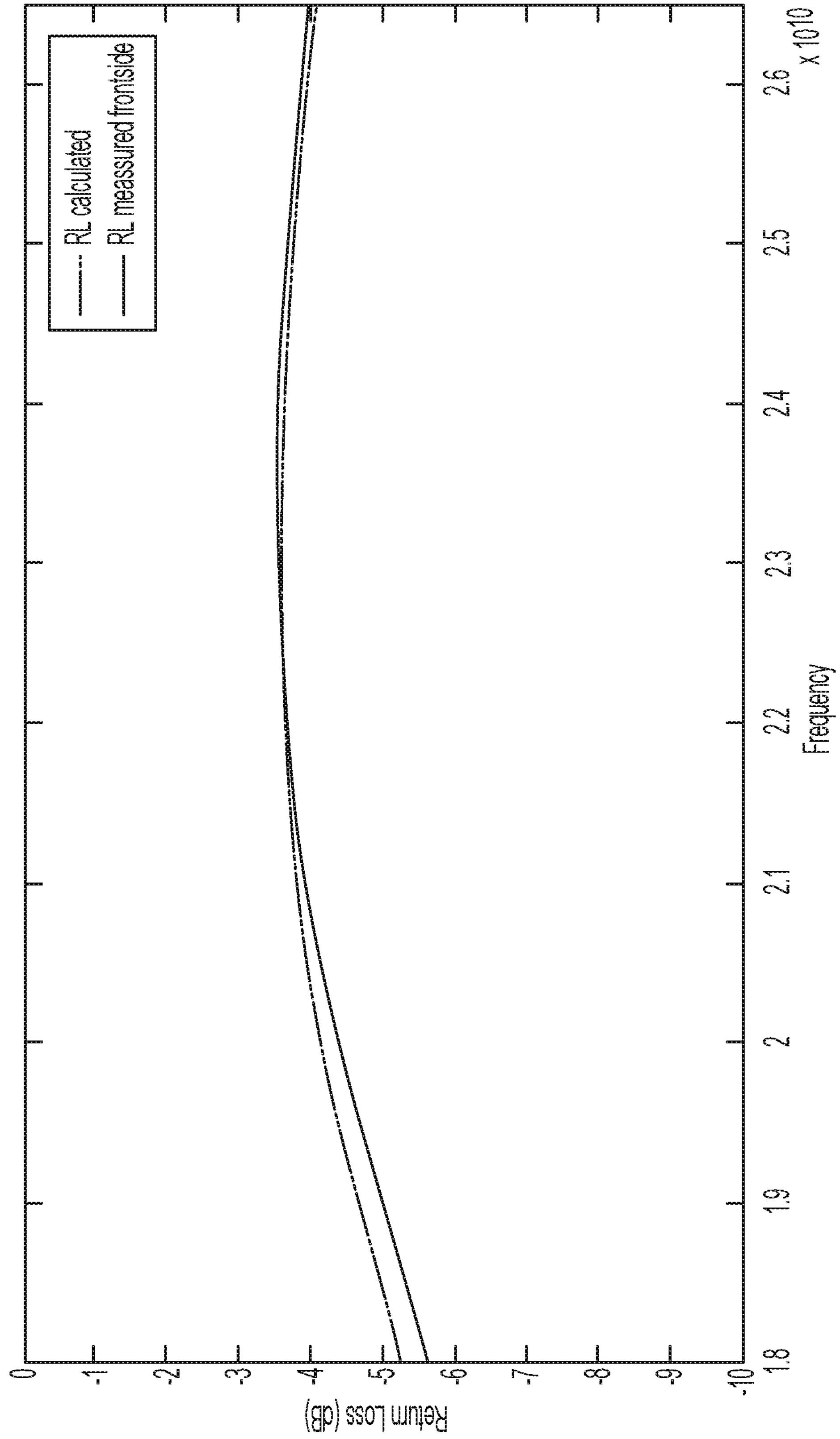
FIG. 9D shows a graphical representation of the return loss in metal-backed reflection mode (in dB) for comparative sample CE-2 at frequencies of 18 GHz to 26.5 GHz (K-band).
Figure 10A:
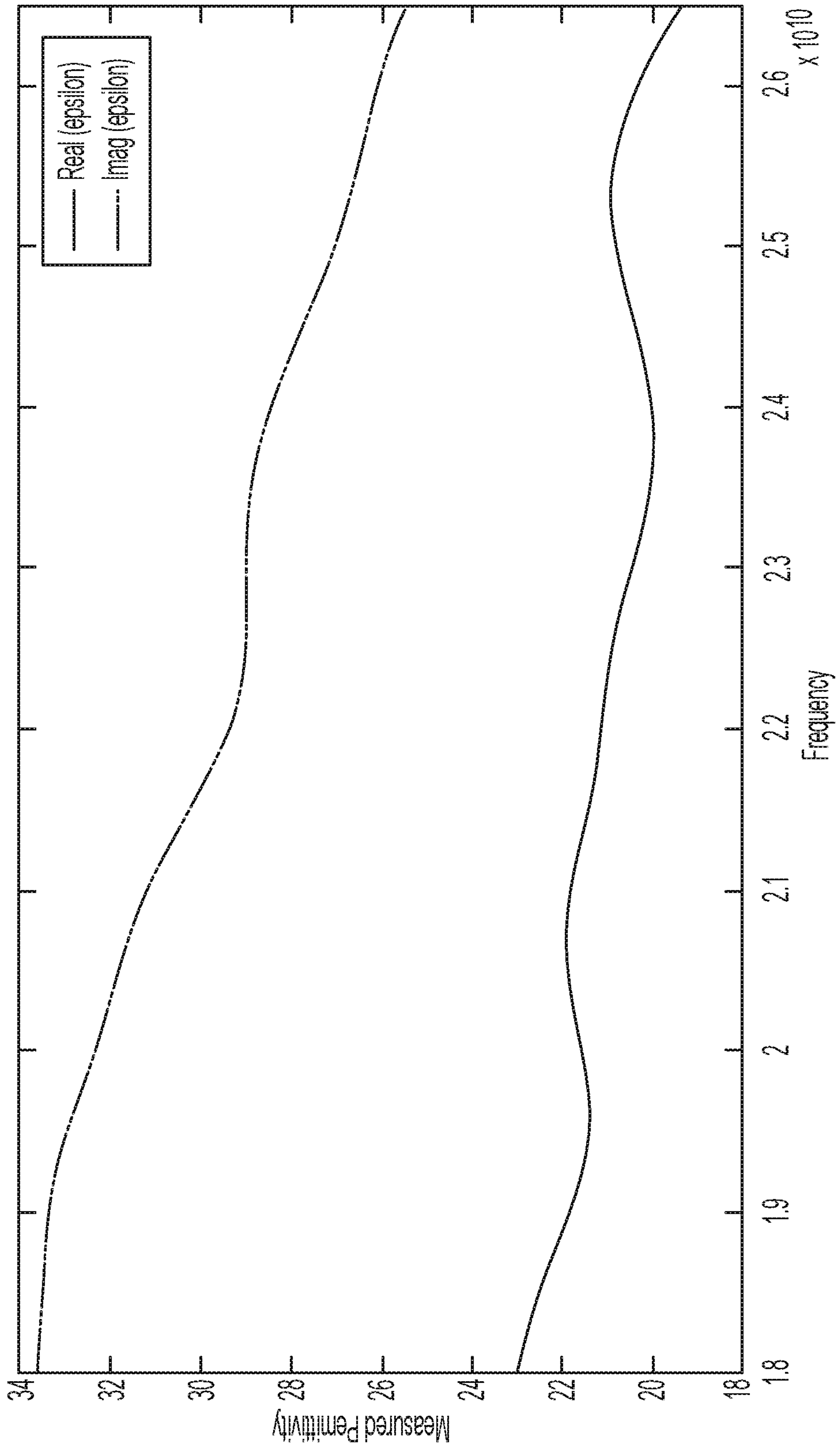
FIG. 10A shows a graphical representation of the real ε' and imaginary ε" parts of the complex permittivity for inventive sample EX-2a at frequencies of 18 GHz to 26.5 GHz (K-band).
Figure 10B:
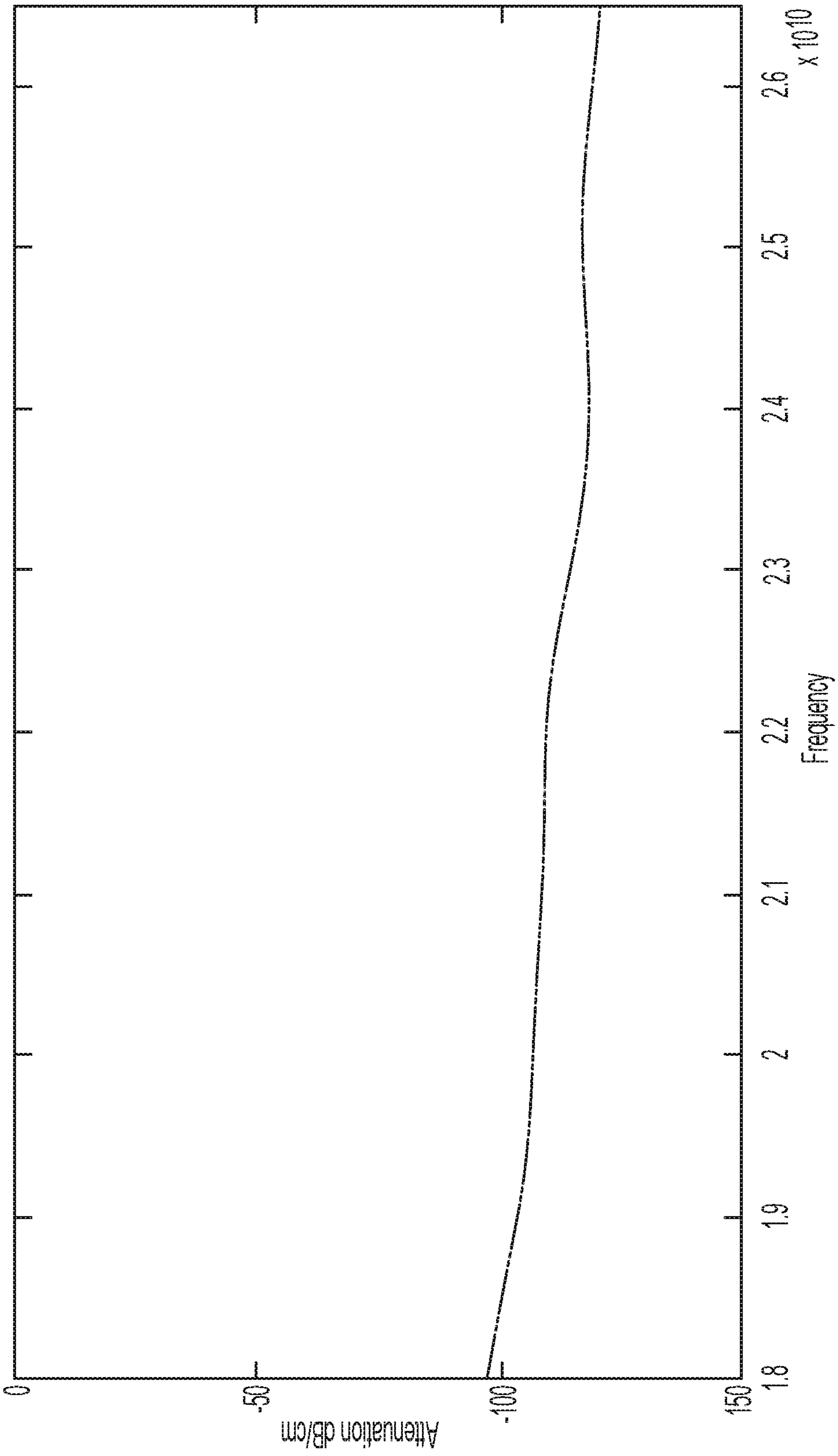
FIG. 10B shows a graphical representation of attenuation constant values (in dB/cm) for inventive sample EX-2a at frequencies of 18 GHz to 26.5 GHz (K-band).
Figure 10C:
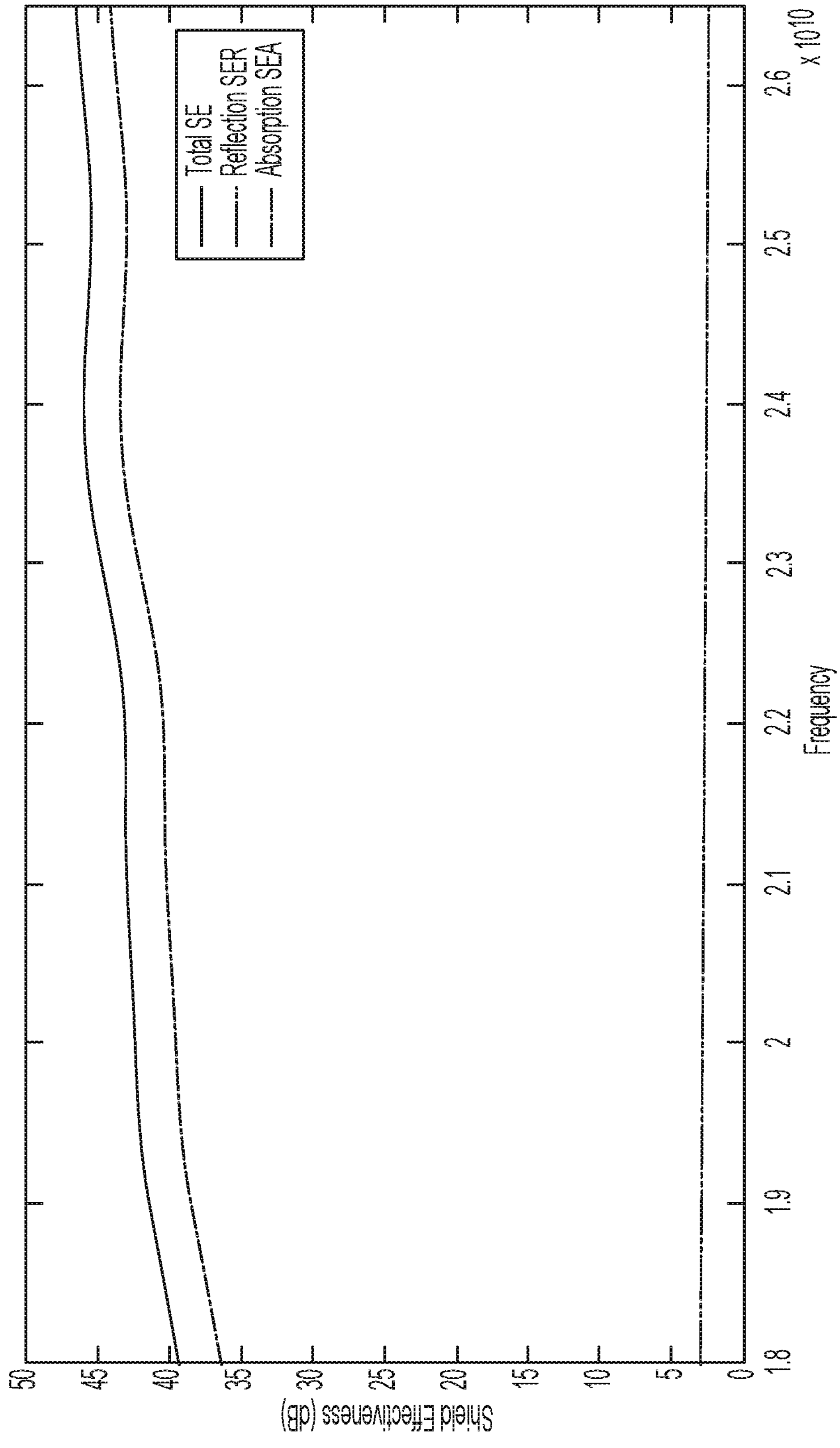
FIG. 10C shows a graphical representation of the shielding effectiveness (in dB) for inventive sample EX-2a at frequencies of 18 GHz to 26.5 GHz (K-band).
Figure 10D:
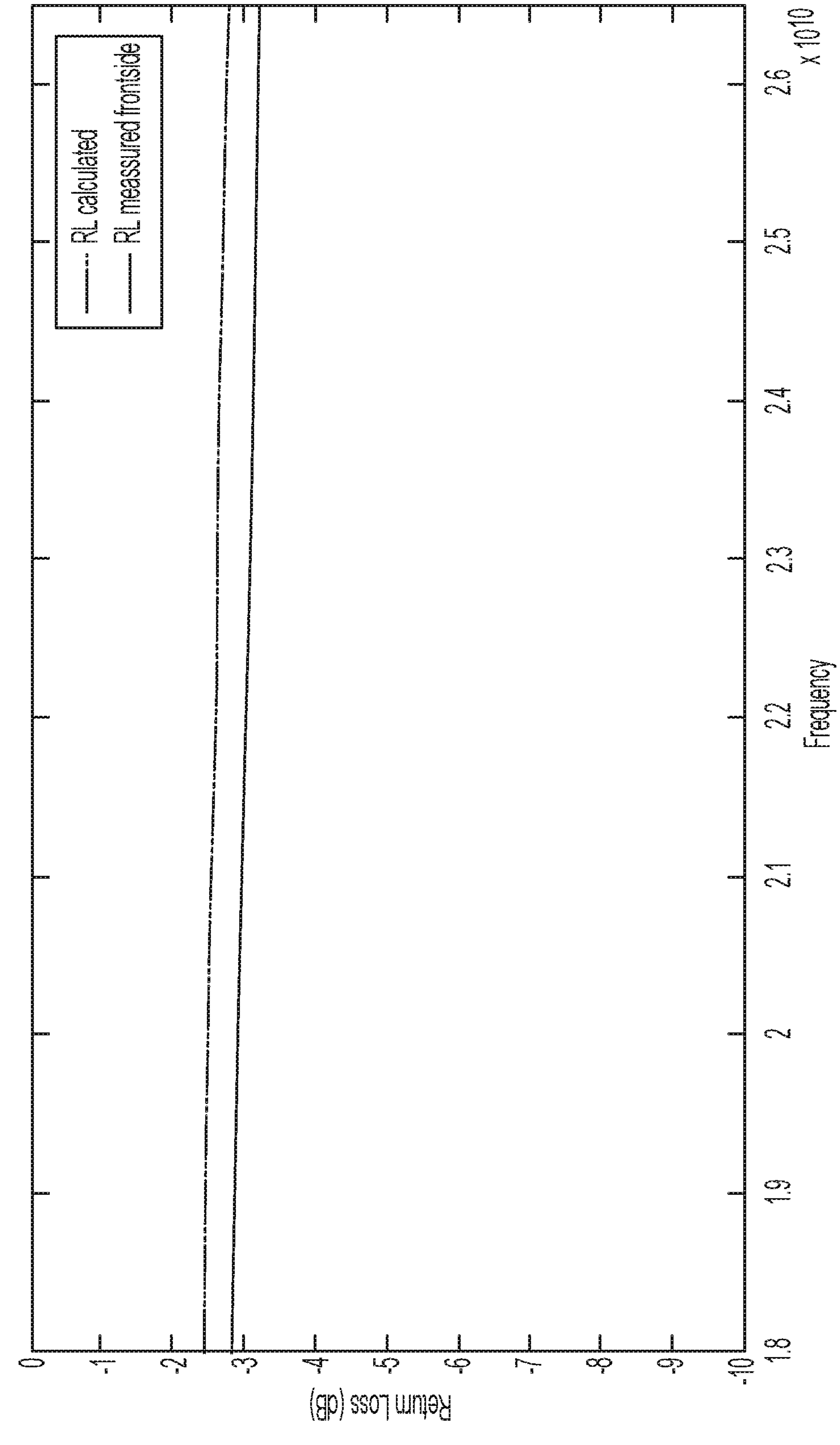
FIG. 10D shows a graphical representation of the return loss in metal-backed reflection mode (in dB) for inventive sample EX-2a at frequencies of 18 GHz to 26.5 GHz (K-band).
Figure 11A:
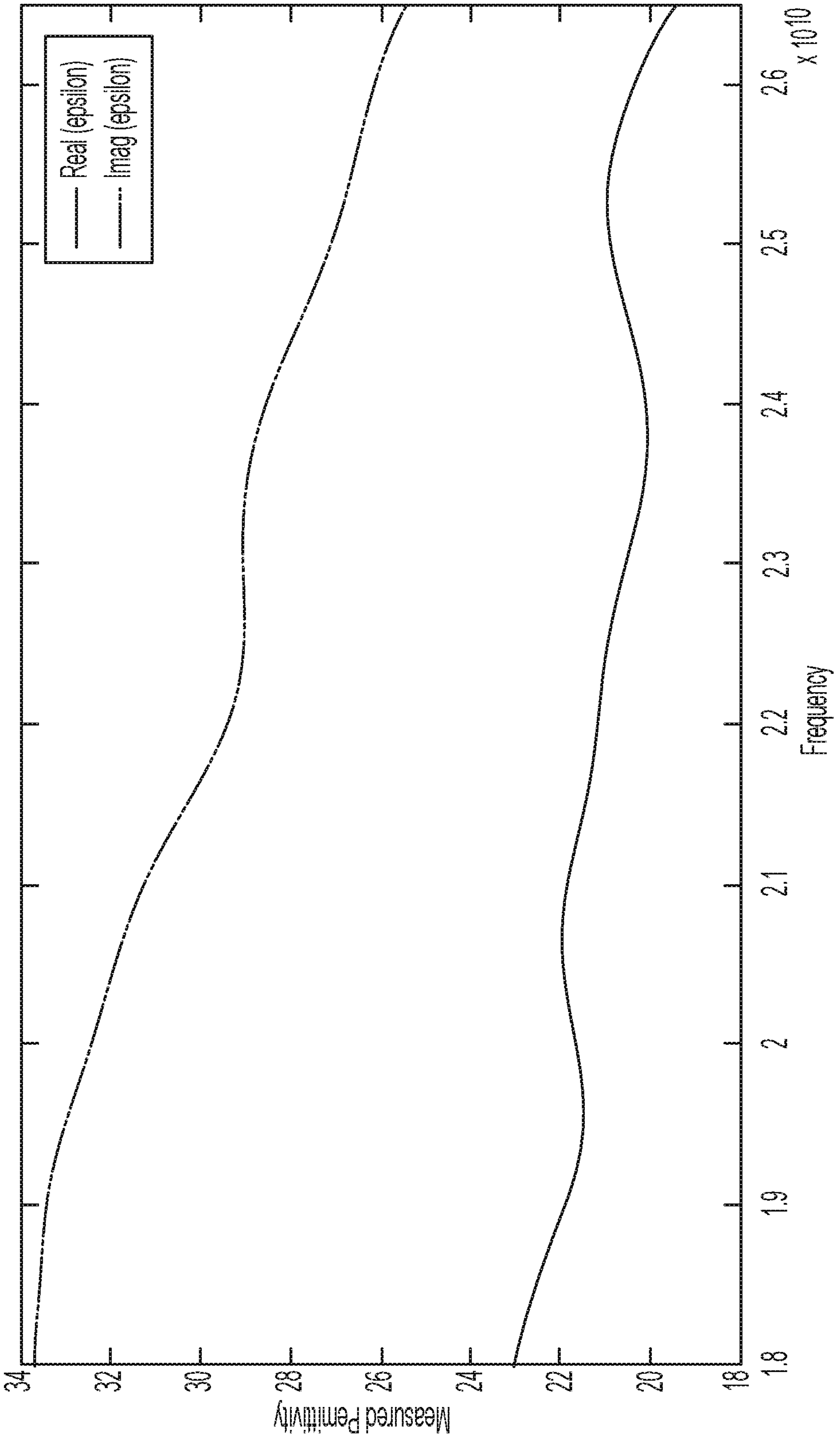
FIG. 11A shows a graphical representation of the real ε' and imaginary ε" parts of the complex permittivity for inventive sample EX-2b at frequencies of 18 GHz to 26.5 GHz (K-band).
Figure 11B:
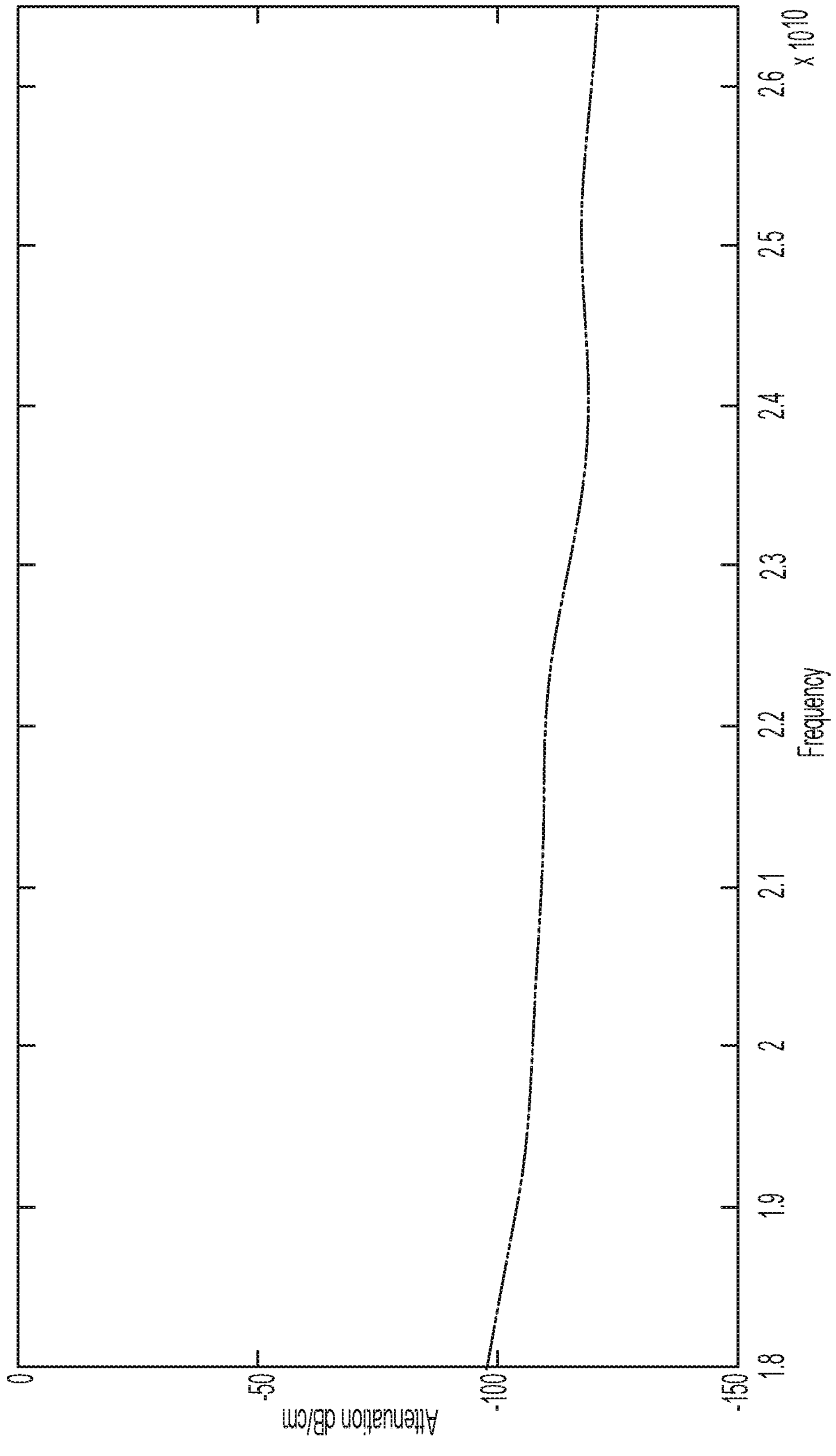
FIG. 11B shows a graphical representation of attenuation constant values (in dB/cm) for inventive sample EX-2b at frequencies of 18 GHz to 26.5 GHz (K-band).
Figure 11C:
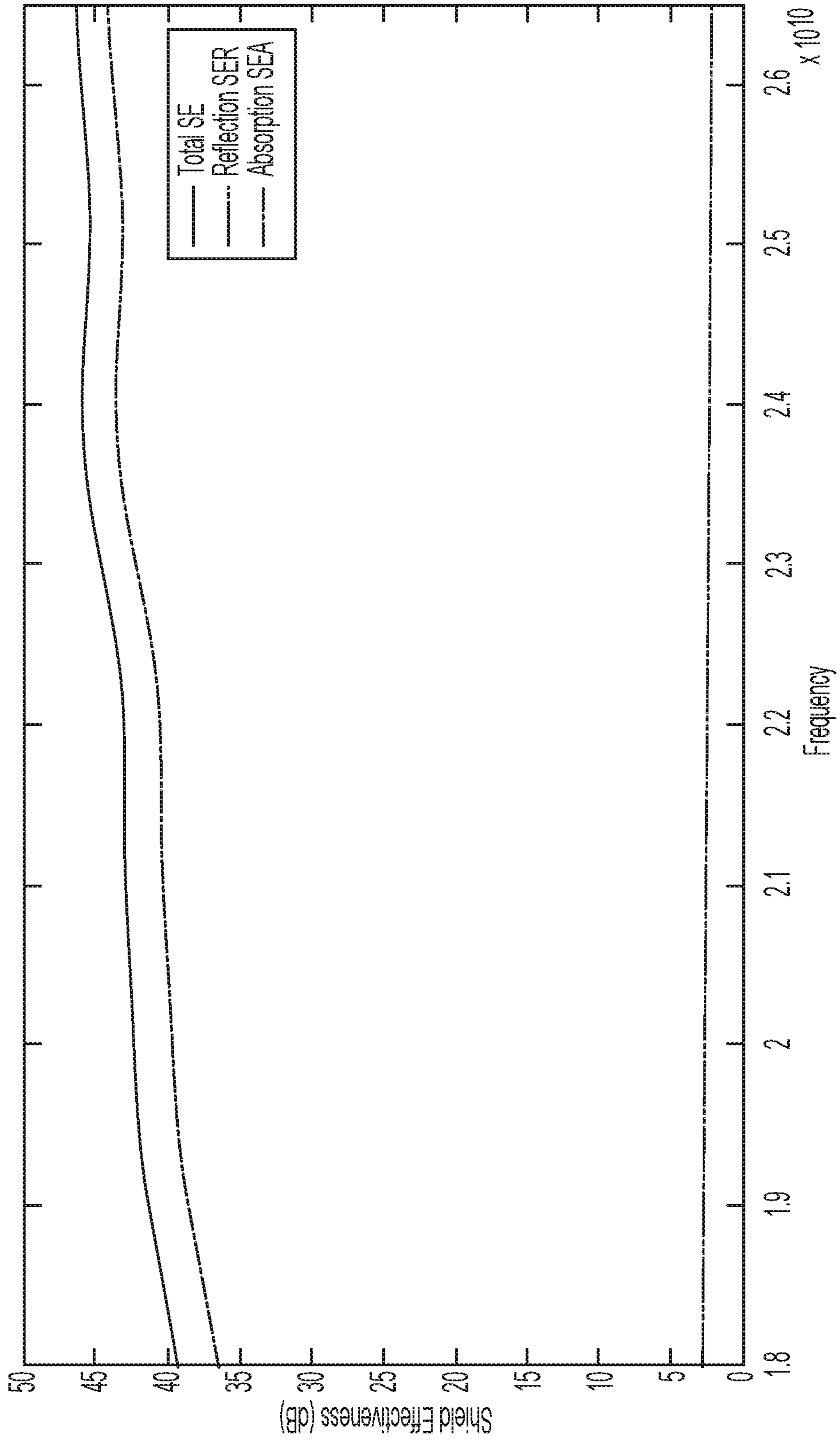
FIG. 11C shows a graphical representation of the shielding effectiveness (in dB) for inventive sample EX-2b at frequencies of 18 GHz to 26.5 GHz (K-band).
Figure 11D:
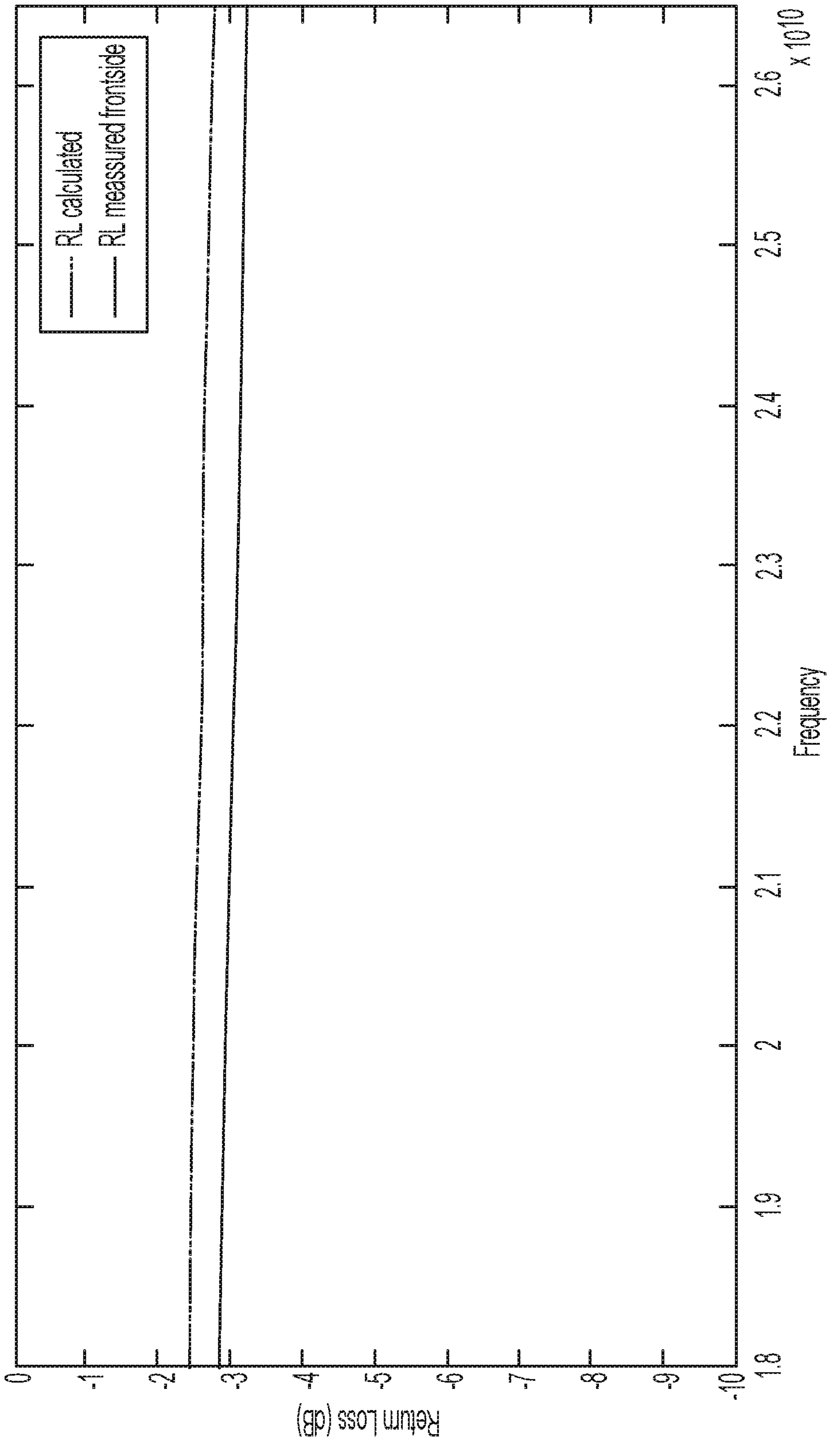
FIG. 11D shows a graphical representation of the return loss in metal-backed reflection mode (in dB) for inventive sample EX-2b at frequencies of 18 GHz to 26.5 GHz (K-band).
Figure 12A:
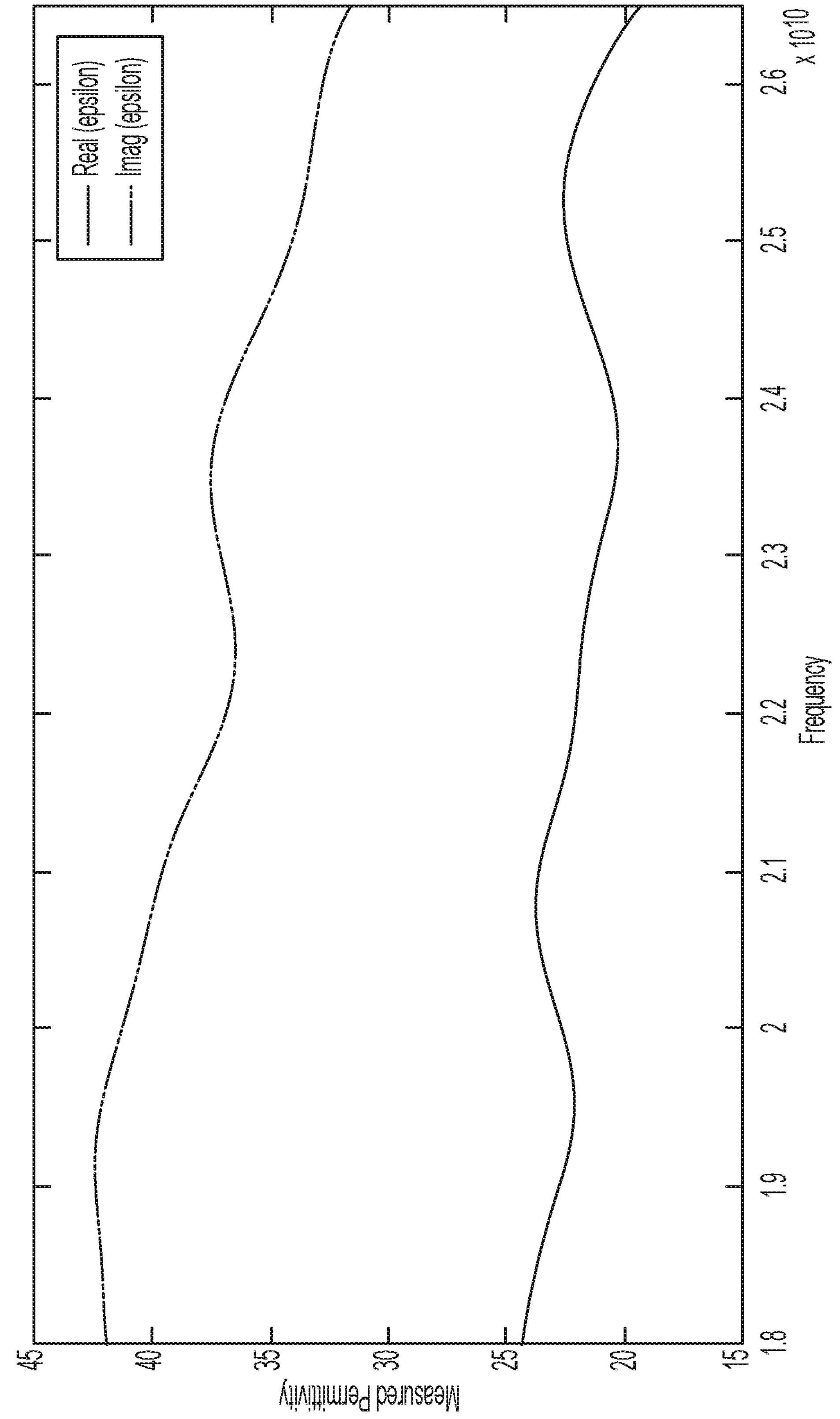
FIG. 12A shows a graphical representation of the real ε' and imaginary ε" parts of the complex permittivity for inventive sample EX-3a at frequencies of 18 GHz to 26.5 GHz (K-band).
Figure 12B:
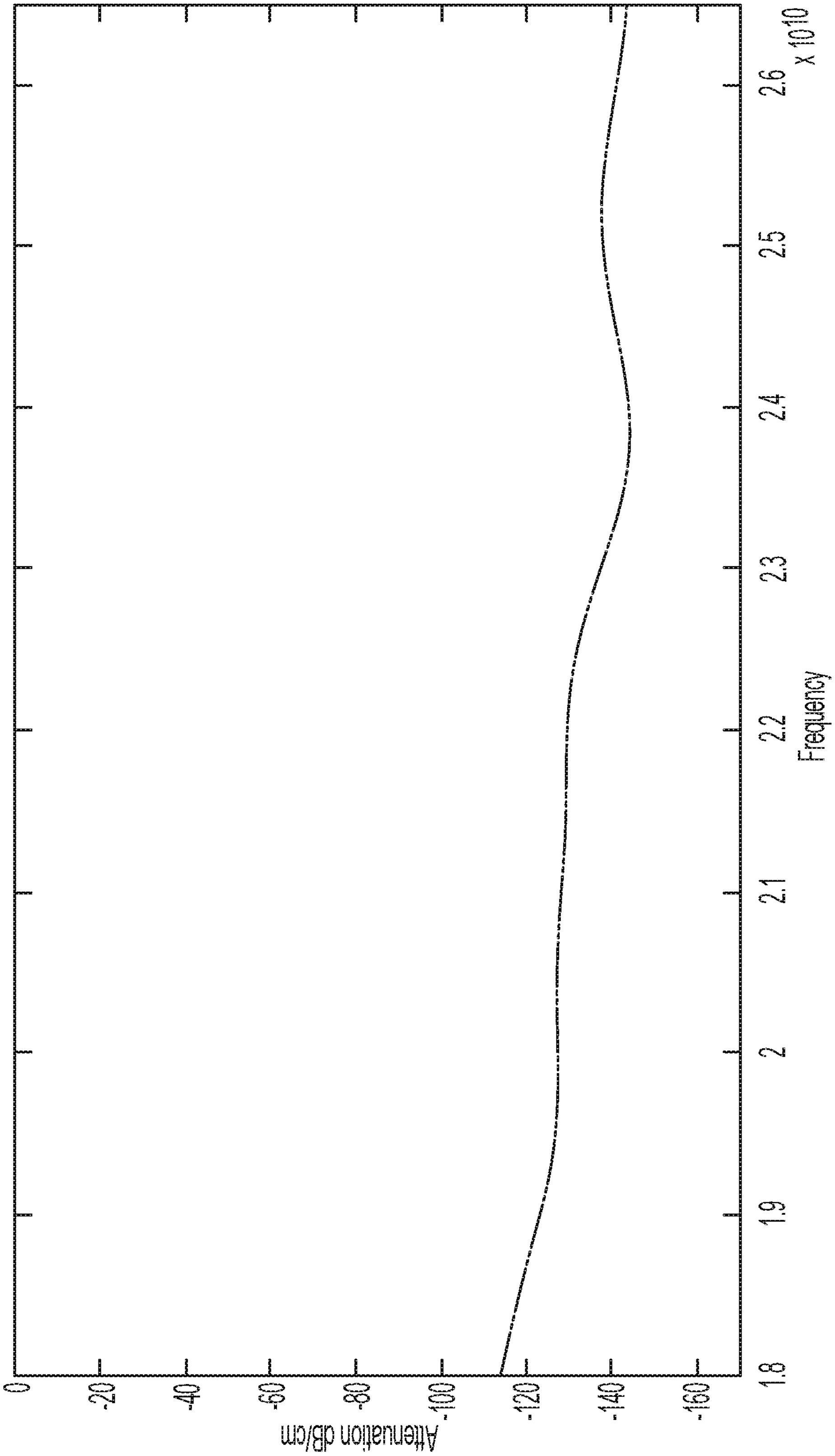
FIG. 12B shows a graphical representation of attenuation constant values (in dB/cm) for inventive sample EX-3a at frequencies of 18 GHz to 26.5 GHz (K-band).
Figure 12C:
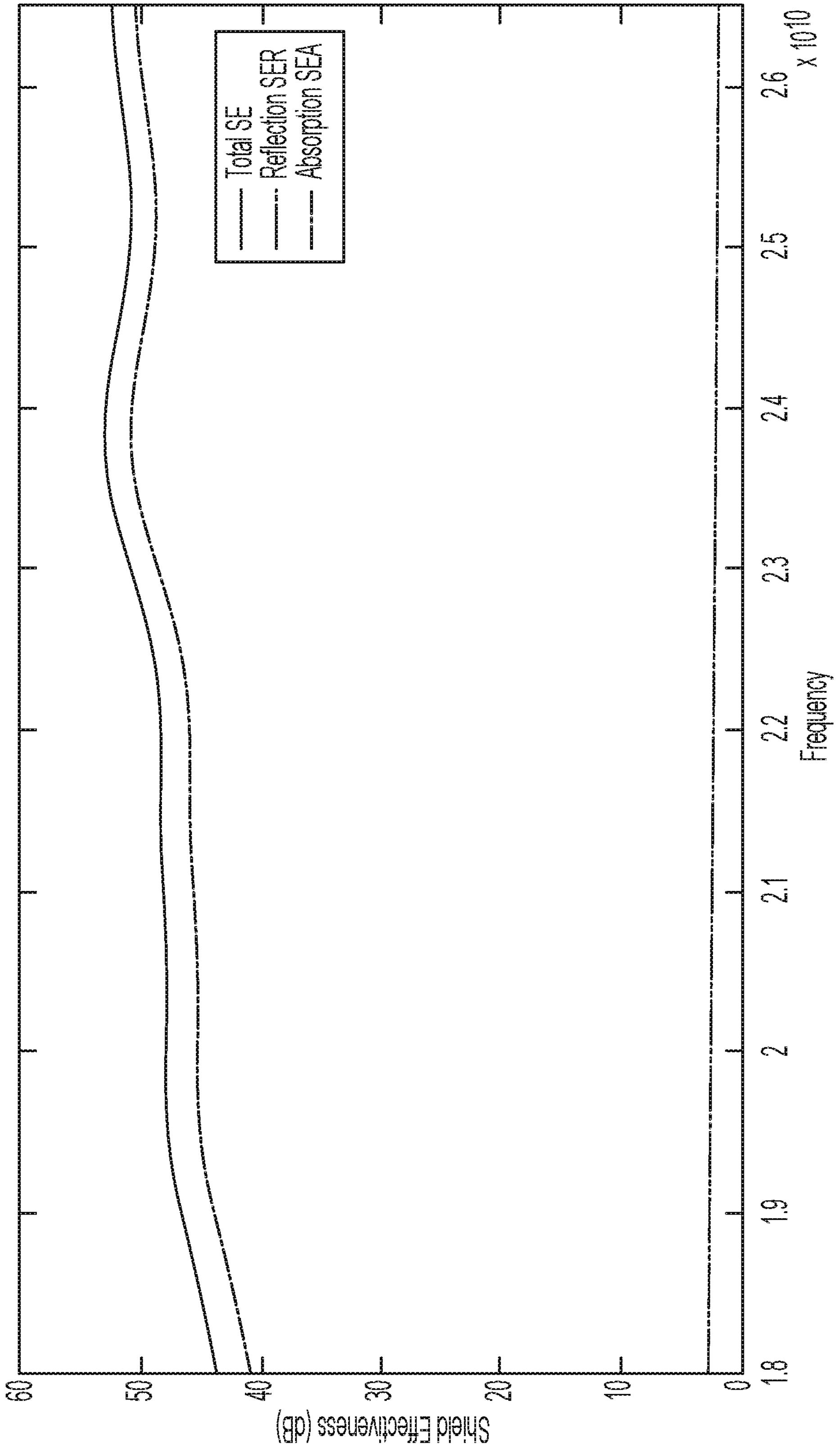
FIG. 12C shows a graphical representation of the shielding effectiveness (in dB) for inventive sample EX-3a at frequencies of 18 GHz to 26.5 GHz (K-band).
Figure 12D:
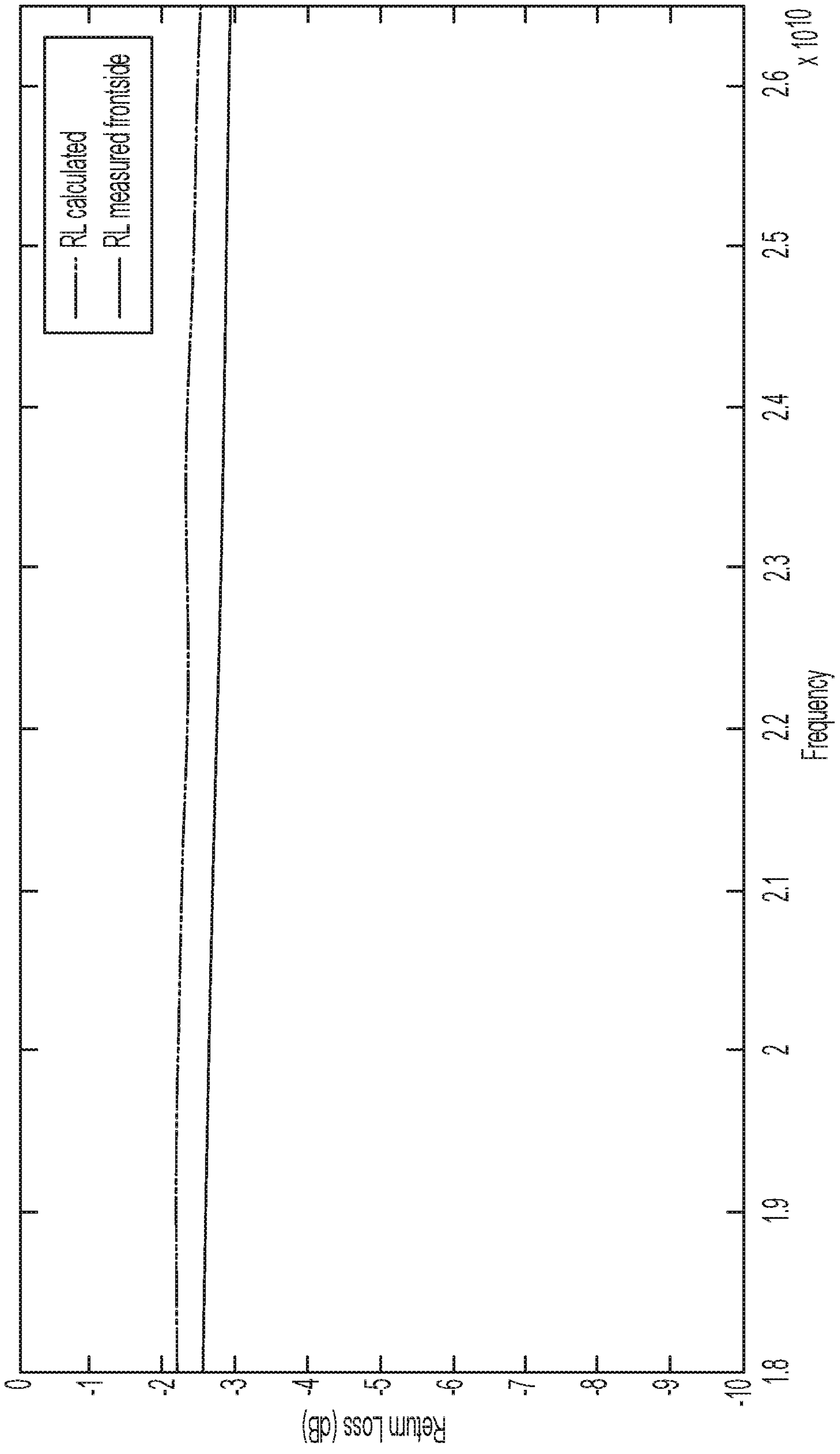
FIG. 12D shows a graphical representation of the return loss in metal-backed reflection mode (in dB) for inventive sample EX-3a at frequencies of 18 GHz to 26.5 GHz (K-band).
Figure 13A:
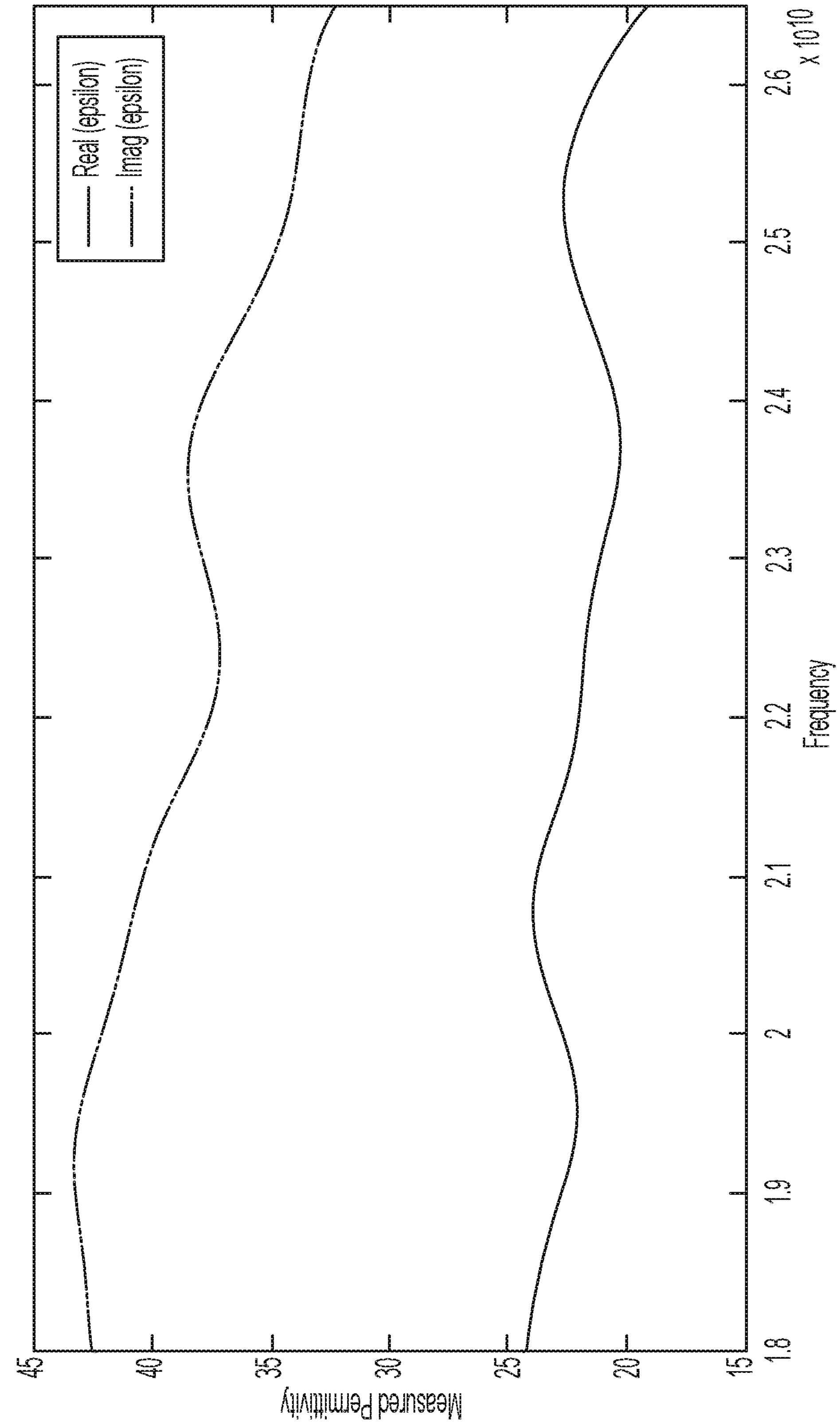
FIG. 13A shows a graphical representation of the real ε' and imaginary ε" parts of the complex permittivity for inventive sample EX-3b at frequencies of 18 GHz to 26.5 GHz (K-band).
Figure 13B:
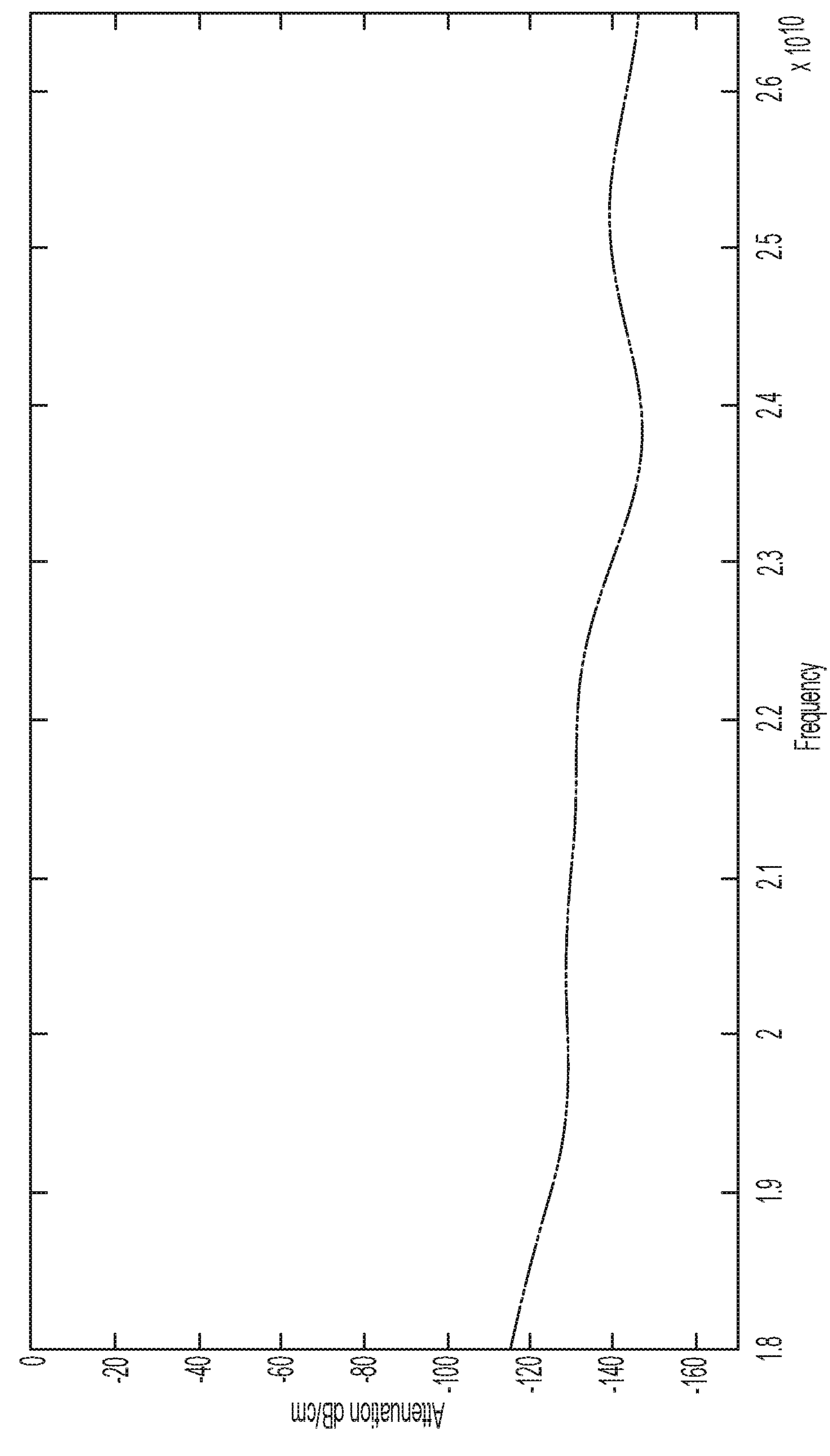
FIG. 13B shows a graphical representation of attenuation constant values (in dB/cm) for inventive sample EX-3b at frequencies of 18 GHz to 26.5 GHz (K-band).
Figure 13C:
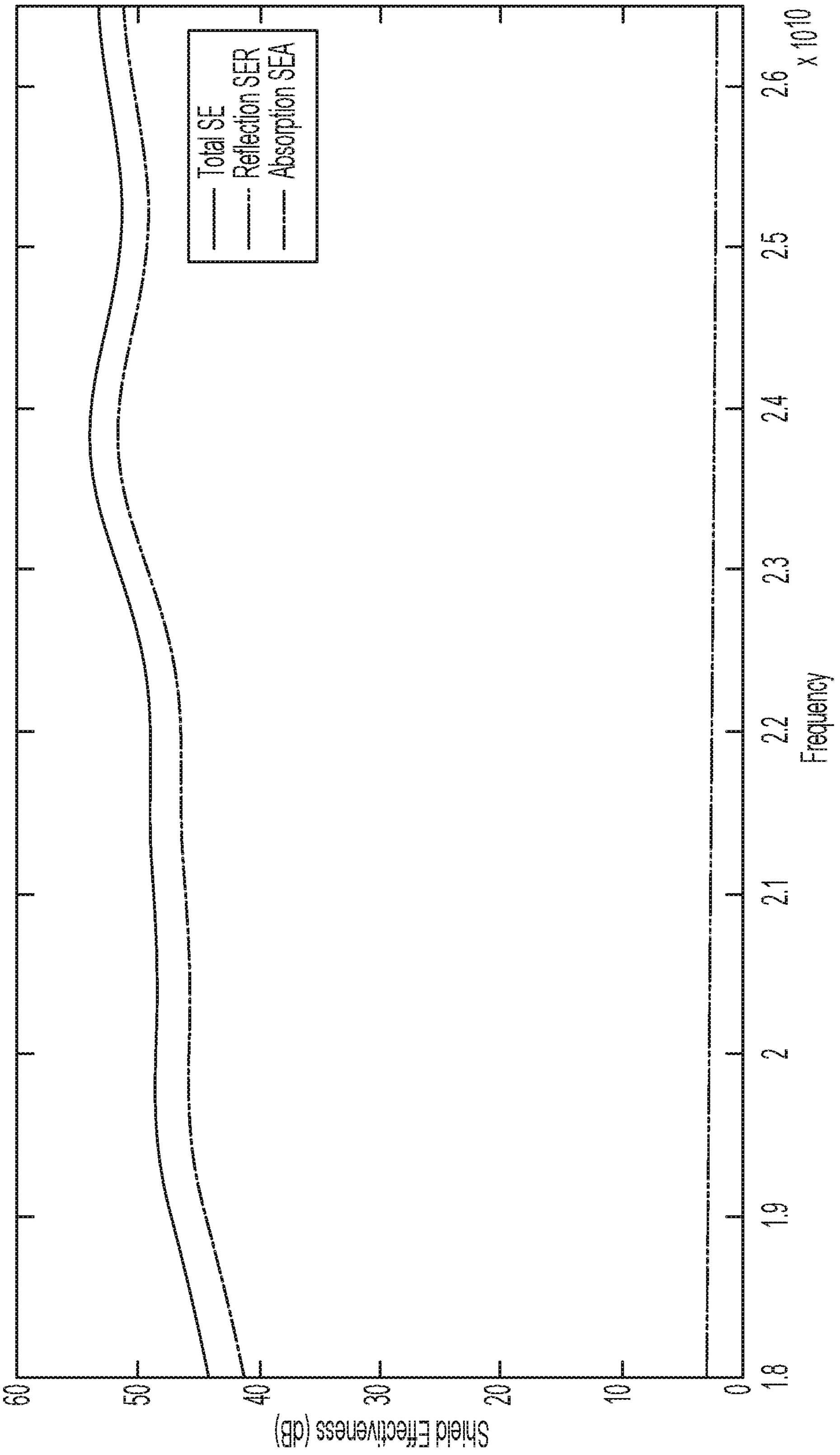
FIG. 13C shows a graphical representation of the shielding effectiveness (in dB) for inventive sample EX-3b at frequencies of 18 GHz to 26.5 GHz (K-band).
Figure 13D:
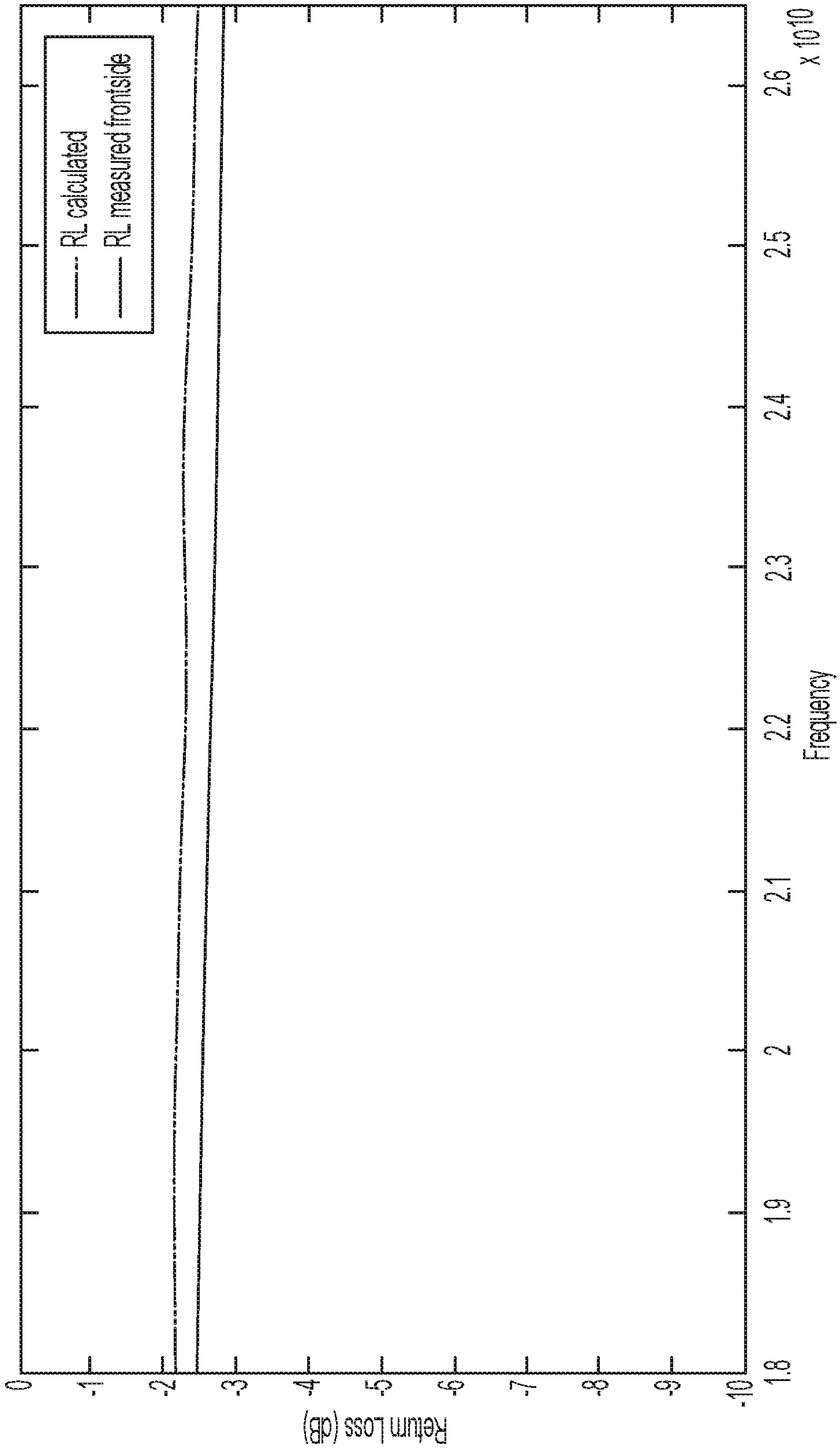
FIG. 13D shows a graphical representation of the return loss in metal-backed reflection mode (in dB) for inventive sample EX-3b at frequencies of 18 GHz to 26.5 GHz (K-band).

The present disclosure relates to microwave shielding and absorptive composite materials. Electronic radar sensors are used in the automotive industry to aid drivers in a variety of operations including cruise control, lane change assistance, self-parking, and blind spot detection, among others. These sensors must be protected from electromagnetic interference that can damage their normal operation. Metals, such as aluminum and stainless steel, are commonly used as microwave shielding materials, but they are heavy, expensive, and demand complex processing to be shaped into a final part. Polymer/carbon composites may be more desirable as a lower density, lower cost alternative. Polymer/carbon composites are also more easily molded and manufactured into high volume molded parts. Carbon fillers of the composite may isolate microwave radiation in enclosure walls to protect the electronic sensors inside the cavity.

Accordingly, moderate electrical conductivity, and large dielectric and magnetic losses are some of the features required for materials used in microwave shielding. The present disclosure provides a series of polymer-based materials comprising carbon as a microwave absorbing filler, and having a polymer/filler ratio that provides an appropriate balance between electrical conductivity and microwave absorption efficiency.

As demonstrated herein, composites having a relatively high electrical conductivity (corresponding to a volume resistivity of less than about 100 Ohm·cm) behave dielectrically more as metals than plastics, and therefore show microwave reflecting characteristics similar to metals. Radar absorbing materials are currently primarily sold commercially in the form of elastomer-based flexible sheets or blankets, liquid paints, and closed-cell polymer foams. The present disclosure provides thermoplastic-based carbon-filled materials that are rigid and of high modulus that maintain a certain shape when molded, and are suitable as internal or external components to trap or isolate electromagnetic radiation in automotive sensor applications.

Carbon fillers, including but not limited to powder, platelets, fibers, nanotubes, are currently used to impart electromagnetic interference properties to polymers, which when unfilled are mostly transparent (non-absorbing, non-reflecting) to microwave radiation. When used in under-the-hood automotive enclosures, for example, polymer-carbon composites can protect the radar sensors located inside the enclosure thus preventing the electromagnetic radiation from an outside, or even an inside, source to deteriorate the sensor's electronic performance. Also, carbon-containing elastomers such as silicone, polyurethane and nitrile rubber, among several others, can be used as high-loss protective blankets to attenuate the resonant frequencies generated by the normal operation of the sensors inside the cavity. The present disclosure describes thermoplastic-based carbon-filled materials that are rigid and of high modulus that maintain a certain shape when molded, and they can be used as internal or external components to trap electromagnetic radiation in automotive sensor applications.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Various combinations of elements of this disclosure are encompassed by this disclosure, for example, combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

Composite

Aspects of the disclosure relate to a composite comprising a thermoplastic polymer component (including a polyester) and a carbon filler. The thermoplastic polymer component may include any suitable thermoplastic polymer. Examples include, but are not limited to, polycarbonate, polyetherimide, liquid crystal polymer, polyamide, polyimide, polyester, copolymers thereof, blends thereof, or combinations thereof.

In certain aspects, the composite has a surface electrical resistivity of at least 30 Ohms per square (Ω/sq) and a volume electrical resistivity of at least 10 Ohm-centimeters (Ω·cm) when measured according to ASTM D257 and using a specimen having a thickness of 0.125 inches (3.175 mm). Further, the composite may exhibit a dielectric constant Dk (real part of complex permittivity ε') of from about 5 to about 30 and may exhibit a dissipation loss (imaginary part of complex dielectric permittivity ε") of from about 0.5 and 45. The ratio of the dissipation loss to the dielectric constant, ε"/ε', (referred to as the dissipation factor, Df, or tan delta) for the composite may be from about 0.01 to about 2.

A molded plaque formed from the disclosed composite may be suitable as an external or internal component of an electric device used in microwave absorbing or shielding applications. Experimentation showed that plaques molded from the materials of this invention are capable of reflecting at least 14% of incoming microwave radiation at frequencies from about 75 GHz to about 110 GHz. The molded plaque may have a thickness of from 1 millimeter (mm) to about 5 mm. In various examples, the molded plaque may have a thickness of 0.125 inches (3.175 mm).

In various aspects, the present disclosure provides composite materials useful for the manufacture of enclosures that can isolate electronic sensors from damaging microwave electromagnetic energy. These materials have been evaluated for dielectric properties, such as complex permittivity, reflection and insertion loss, attenuation, and shielding effectiveness, among others, at frequencies from about 10 GHZ and 120 GHz. Further disclosed herein are radar sensor components (plates, enclosures, covers, etc) manufactured from these materials, and articles (sensors, cameras, electronic control units (ECUs)) manufactured from these components.

In yet further aspects, the composite may comprise a thermoplastic polymer component (including a polyester), a carbon filler, and a glass fiber filler. The composite may comprise about 50 wt. % to about 97 wt. % of a thermoplastic resin, from about 5 wt. % to about 15 wt. % of a carbon-based filler, and from about 0.01 wt. % to about 25 wt. % of a glass fiber filler. Such a glass fiber-filled composite may exhibit a tensile modulus less than 9,000 megapascals MPa when tested in accordance with ASTM D638, a volume electrical resistivity less than $1.0\times10^{11}$ Ω·cm, and a dielectric constant ε' of between 5 and 30 and a dissipation loss ε" of between 0.5 and 45, measured at frequencies between about 10 and about 120 GHz. A molded sample of the composite may exhibit a percent Absorbed power measured in transmission mode of at least 55% when observed according to a Free Space method at frequencies from about 10 GHz to 120 GHz.

In some aspects, a composite comprising: from about 50 wt. % to about 97 wt. % of a thermoplastic resin, wherein the thermoplastic resin comprises a polyester; and from about 3 wt. % to about 15 wt. % of a carbon black filler, wherein the carbon black filler has a primary surface area of from about 500 to about 1000 $m^2/g$, wherein the composite exhibits a dielectric constant ε' of between 5 and 30 and a dissipation loss ε" of between 0.5 and 45, measured at frequencies between about 10 and about 120 GHz, wherein a molded sample of the composite exhibits a percent reflected power measured in transmission mode of at least 15% when observed according to a Free Space method at frequencies from about 75 GHz to 110 GHz, and wherein the combined weight percent value of all components does not exceed 100 wt. %, and all weight percent values are based on the total weight of the composite.

Further disclosed is a component of an automotive radar sensor, such as, for example, a plate, enclosure, or cover, which is molded from a material comprising a polymer and a carbon filler, with the molded part having certain design, average thickness, microwave absorption efficiency, absorption bandwidth, and a certain surface and volume electrical resistivity. Still another aspect of the present disclosure is an article, such as, for example, a radar sensor, camera, ECU, comprising a molded part made from a radar absorbing material, with such molded part having at least two openings to allow the transmission of microwave radiation between a transmitting antenna and a receiving antenna located in the printed circuit board of the sensor. Automotive radar sensors for lane-change assistance, self-parking, blind spot detection and collision avoidance typically operate at 24 GHz of frequency; those for adaptive cruise control operate at 77 GHz frequency. Accordingly, composites of the present disclosure have been observed in the K-band, which includes the 24 GHz frequency, and in the W-band, which includes the 77 GHz frequency.

Thermoplastic Resin

In an aspect, the polymer composition may comprise a polymer base resin. In various aspects, the polymer base resin can comprise a thermoplastic resin or a thermoset resin. The thermoplastic resin can comprise polypropylene, polyethylene, ethylene based copolymer, polyamide, polycarbonate, polyester, polyoxymethylene (POM), polybutylene terephthalate (PBT), polyethylene terephthalate (PET), polycyclohexylendimethylene terephthalate (PCT), liquid crystal polymers (LCP), polyphenylene sulfide (PPS), polyphenylene ether (PPE), polyphenylene oxide-polystyrene blends, polystyrene, high impact modified polystyrene, acrylonitrile-butadiene-styrene (ABS) terpolymer, acrylic polymer, polyetherimide (PEI), polyurethane, polyetheretherketone (PEEK), polylactic acid (PLA) based polymers, poly ether sulphone (PES), and combinations thereof. The thermoplastic resin can also include thermoplastic elastomers such as polyamide and polyester based elastomers. The base substrate can also comprise blends and/or other types of combination of resins described above. In various aspects, the polymer base resin can also comprise a thermosetting polymer. Appropriate thermosetting resins can include phenol resin, urea resin, melamine-formaldehyde resin, ureaformaldehyde latex, xylene resin, diallyl phthalate resin, epoxy resin, aniline resin, furan resin, polyurethane, or combinations thereof.

In various aspects of the present disclosure, the thermoplastic resin may comprise a polyester. For example, the thermoplastic resin may comprise a polyalkylene ester (a polyester), such as a polyalkylene terephthalate polymer.

Polyesters have repeating units of the following formula (A):

(A)

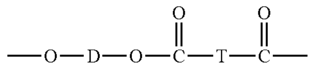

wherein T is a residue derived from a terephthalic acid or chemical equivalent thereof, and D is a residue derived from polymerization of an ethylene glycol, butylene diol, specifically 1,4-butane diol, or chemical equivalent thereof. Chemical equivalents of diacids include dialkyl esters, for example, dimethyl esters, diaryl esters, anhydrides, salts, acid chlorides, acid bromides, and the like. Chemical equivalents of ethylene diol and butylene diol include esters, such as dialkylesters, diaryl esters, and the like. In addition to units derived from a terephthalic acid or chemical equivalent thereof, and ethylene glycol or a butylene diol, specifically 1,4-butane diol, or chemical equivalent thereof, other T and/or D units can be present in the polyester, provided that the type or amount of such units do not significantly adversely affect the desired properties of the thermoplastic compositions. Poly(alkylene arylates) can have a polyester structure according to formula (A), wherein T comprises groups derived from aromatic dicarboxylates, cycloaliphatic dicarboxylic acids, or derivatives thereof.

Examples of specifically useful T groups include, but are not limited to, 1,2-, 1,3-, and 1,4-phenylene; 1,4- and 1,5-naphthylenes; cis- or trans-1,4-cyclohexylene; and the like. Specifically, where T is 1,4-phenylene, the poly(alkylene arylate) is a poly(alkylene terephthalate). In addition, for poly(alkylene arylate), specifically useful alkylene groups D include, for example, ethylene, 1,4-butylene, and bis-(alkylene-disubstituted cyclohexane) including cis- and/or trans-1,4-(cyclohexylene)dimethylene.

Examples of polyalkylene terephthalate include polyethylene terephthalate (PET), poly(1,4-butylene terephthalate) (PBT), and poly(propylene terephthalate) (PPT). Also useful are poly(alkylene naphthoates), such as poly(ethylene naphthanoate) (PEN), and poly(butylene naphthanoate) (PBN). A useful poly(cycloalkylene diester) is poly(cyclohexanedimethylene terephthalate) (PCT). Combinations including at least one of the foregoing polyesters may also be used.

Copolymers including alkylene terephthalate repeating ester units with other ester groups can also be useful. Useful ester units can include different alkylene terephthalate units, which can be present in the polymer chain as individual units, or as blocks of poly(alkylene terephthalates) Specific examples of such copolymers include poly(cyclohexanedimethylene terephthalate)-co-poly(ethylene terephthalate), abbreviated as PETG where the polymer includes greater than or equal to 50 mol % of poly(ethylene terephthalate), and abbreviated as PCTG where the polymer comprises greater than 50 mol % of poly(1,4-cyclohexanedimethylene terephthalate). Poly(cycloalkylene diester)s can also include poly(alkylene cyclohexanedicarboxylate)s. Of these, a specific example is poly(1,4-cyclohexane-dimethanol-1,4-cyclohexanedicarboxylate) (PCCD), having recurring units of formula (B):

(B)

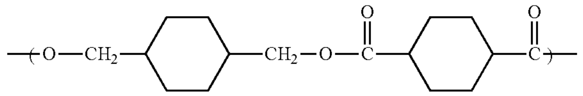

wherein, as described using formula (A), $R^2$ is a 1,4-cyclohexanedimethylene group derived from 1,4-cyclohexanedimethanol, and T is a cyclohexane ring derived from cyclohexanedicarboxylate or a chemical equivalent thereof, and can comprise the cis-isomer, the trans-isomer, or a combination comprising at least one of the foregoing isomers.

In another aspect, the composition can further comprise poly(1,4-butylene terephthalate) or "PBT" resin. PBT may be obtained by polymerizing a glycol component of which at least 70 mol %, preferably at least 80 mol %, consists of tetramethylene glycol and an acid or ester component of which at least 70 mol %, preferably at least 80 mol %, consists of terephthalic acid and/or polyester-forming derivatives thereof. Commercial examples of PBT include those available under the trade names VALOX™ 315, VALOX™ 195 and VALOX™ 176, manufactured by SABIC™, having an intrinsic viscosity of 0.1 deciliters per gram (dl/g) to about 2.0 dl/g (or 0.1 dl/g to 2 dl/g) as measured in a 60:40 phenol/tetrachloroethane mixture or similar solvent at 23 degrees Celsius (° C.) to 30° C. In one aspect, the PBT resin has an intrinsic viscosity of 0.1 dl/g to 1.4 dl/g (or about 0.1 dl/g to about 1.4 dl/g), specifically 0.4 dl/g to 1.4 dl/g (or about 0.4 dl/g to about 1.4 dl/g).

As described herein, the composition may comprise from about 40 wt. % to about 97 wt. % of a polyalkylene polymer. In further examples, the composition may comprise from about 50 wt. % to about 97 wt. % of a polyalkylene polymer, or from about 40 wt. % to about 97 wt. % of a polyalkylene polymer, or from about 55 wt. % to about 97 wt. % of a polyalkylene polymer, or from about 60 wt. % to about 97 wt. % of a polyalkylene polymer, or from about 70 wt. % to about 97 wt. % of a polyalkylene polymer, or from about 40 wt. % to about 95 wt. % of a polyalkylene polymer, or from about 55 wt. % to about 95 wt. % of a polyalkylene polymer, or from about 60 wt. % to about 95 wt. % of a polyalkylene polymer, or from about 75 wt. % to about 97 wt. %.

In further aspects, the thermoplastic resin may comprise a polycarbonate copolymer. A polycarbonate can include any polycarbonate material or mixture of materials, for example, as recited in U.S. Pat. No. 7,786,246, which is hereby incorporated in its entirety for the specific purpose of disclosing various polycarbonate compositions and methods. The term polycarbonate can be further defined as compositions having repeating structural units of the formula (1):

(1)

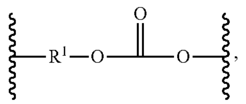

in which at least 60 percent of the total number of $R^1$ groups are aromatic organic radicals and the balance thereof are aliphatic, alicyclic, or aromatic radicals. In a further aspect, each $R^1$ is an aromatic organic radical and, more preferably, a radical of the formula (2):

$$-A^1-Y^1-A^2- \quad (2),$$

wherein each of $A^1$ and $A^2$ is a monocyclic divalent aryl radical and $Y^1$ is a bridging radical having one or two atoms that separate $A^1$ from $A^2$. In various aspects, one atom separates $A^1$ from $A^2$. For example, radicals of this type include, but are not limited to, radicals such as —O—, —S—, —S(O)—, —$S(O_2)$—, —C(O)—, methylene, cyclohexyl-methylene, 2-[2.2.1]-bicycloheptylidene, ethylidene, isopropylidene, neopentylidene, cyclohexylidene, cyclopentadecylidene, cyclododecylidene, and adamantylidene. The bridging radical $Y^1$ is preferably a hydrocarbon group or a saturated hydrocarbon group such as methylene, cyclohexylidene, or isopropylidene.

In various further aspects, "polycarbonates" and "polycarbonate resins" as used herein further include homopolycarbonates, copolymers including different $R^1$ moieties in the carbonate (referred to herein as "copolycarbonates"), copolymers including carbonate units and other types of polymer units, such as ester units, polysiloxane units, and combinations including at least one of homopolycarbonates and copolycarbonates. As used herein, "combination" is inclusive of blends, mixtures, alloys, reaction products, and the like.

Non-limiting examples of polysiloxane-polycarbonate copolymers can comprise various copolymers available from SABIC. In an aspect, the polysiloxane-polycarbonate copolymer can contain 6% by weight polysiloxane content based upon the total weight of the polysiloxane-polycarbonate copolymer. In various aspects, the 6% by weight polysiloxane block copolymer can have a weight average molecular weight (Mw) of from about 23,000 to 24,000 Daltons using gel permeation chromatography with a bisphenol A polycarbonate absolute molecular weight standard. In certain aspects, the 6% weight siloxane polysiloxane-polycarbonate copolymer can have a melt volume flow rate (MVR) of about 10 $cm^3$/10 min at 300° C./1.2 kg (see C9030T, a 6% by weight polysiloxane content copolymer available from SABIC Innovative Plastics as "transparent" EXL C9030T resin polymer). In another example, the polysiloxane-polycarbonate block can comprise 20% by weight polysiloxane based upon the total weight of the polysiloxane-polycarbonate block copolymer. For example, an appropriate polysiloxane-polycarbonate copolymer can be a bisphenol A polysiloxane-polycarbonate copolymer endcapped with para-cumyl phenol (PCP) and having a 20% polysiloxane content (see C9030P, commercially available from SABIC as the "opaque" EXL C9030P). In various aspects, the weight average molecular weight of the 20% polysiloxane block copolymer can be about 29,900 Daltons to about 31,000 Daltons when tested according to a polycarbonate standard using gel permeation chromatography (GPC) on a cross-linked styrene-divinylbenzene column and calibrated to polycarbonate references using a UV-VIS detector set at 264 nm on 1 mg/ml samples eluted at a flow rate of about 1.0 ml/minute. Moreover, the 20% polysiloxane block copolymer can have a melt volume rate (MVR) at 300° C./1.2 kg of 7 $cm^3$/10 min and can exhibit siloxane domains sized in a range of from about 5 micron to about 20 micrometers (microns, μm).

Certain aspects of the composition include from about 50 wt. % to about 97 wt. % of a thermoplastic resin, or from about 40 wt. % to about 97 wt. % of a polymer base resin, or from about 55 wt. % to about 97 wt. % of a polymer base resin, or from about 60 wt. % to about 97 wt. % of a polymer base resin, or from about 70 wt. % to about 97 wt. % of a polymer base resin, or from about 40 wt. % to about 95 wt. % of a polymer base resin, or from about 55 wt. % to about 95 wt. % of a polymer base resin, or from about 60 wt. % to about 95 wt. % of a polymer base resin, or from about 75 wt. % to about 97 wt. % of a polymer base resin.

Carbon-Based Filler

In various aspects, the composite comprises a carbon-based filler. Generally, carbon-based fillers may comprise carbon fibers, carbon powder, graphite, graphene, carbon platelets, or carbon nanotubes. Carbon-based filler may further refer to a particulate carbonaceous material, such as, for example, a furnace carbon black, a thermal black, a surface modified carbon black, a heat-treated carbon black, an activated carbon, a graphite, carbon fibers, carbon nanotubes or a combination thereof. According to certain aspects of the present disclosure, the carbon-based filler comprises carbon powder. Moreover, the carbon-based filler may comprise a carbon powder and may be free of or substantially free of carbon nanotubes, carbon platelets, or carbon fibers.

In one example, the carbon-based filler is carbon black. Carbon black may refer to an amorphous form of carbon with a high surface-area-to-volume ratio. Further, carbon black may include a chemisorbed oxygen complex (such as, carboxylic, quinonic, lactonic, phenolic groups and the like) on its surface to varying degrees, depending on the conditions of manufacture. Carbon black properties such as particle size, structure, and purity may vary depending on the type of carbon black chosen. In one aspect, carbon black can disperse well within the polymer phase, maintain the integrity of its structure or network, and have a consistent particle size.

The conductivity of the polymer-carbon black composite may be measured using the surface resistivity (SR) of the conductive film. In one aspect, the conductivity can depend upon the polymer phase, the type of conductive carbon black, the loading of the conductive carbon black, and the dispersion of the conductive carbon black. The conductive carbon black may be furnace black or acetylene black or an extra conductive carbon black. Conductive carbon black such as furnace black or acetylene black has a high-volume resistivity within a range of from 1 to $10^2$ Ωcm. Such a carbon black may exhibit a BET (Brunauer, Emmett and Teller) primary surface area of about at 500 meters squared per gram ($m^2/g$) to about 1000 $m^2/g$, which may be referred to as a high structure or high surface area carbon black. For reference, a low structure carbon black may have a relatively low surface area, such as less than 300 $m^2/g$, less than 200 $m^2/g$, or less than 150 $m^2/g$. In another aspect, the carbon black powder exhibits an oil absorption from about at least 100 milliliters (ml)/100 gram (g). In a specific aspect, the conductive filler comprises an ENSACO™ 350 G or 360 G carbon powder, available from Earache Europe or Imerys Graphite & Carbon Switzerland.

In some aspects, the polymer composition may comprise carbon-based filler having at least one dimension of a particular size. The carbon-based filler may comprise a powder having a particular particle size distribution. For example, the carbon-based filler (such as carbon black) may have at least one dimension that is less than 100 nm. In some aspects, the carbon-based filler may have a particular diameter. The polymer composition of claim 1, wherein the carbon-based filler may comprise a powder of a particle size. For example, the carbon-based filler may have a primary particle diameter of 10 nanometers (nm) to 50 nm. In a yet further aspect, the carbon-based filler may have a DBP absorption amount from about 80 milliliters per 100 grams (ml/100 g) to 500 ml/100 g.

In some aspects, the composition can comprise from about 0.01 wt. % to about 15 wt. % of a carbon-based filler based on the total weight of the polymer composition. The ratio of thermoplastic resin to carbon filler may be from about 32:1 to about 6:1 or from about 24:1 to about 6:1. In further aspects the composition may include from about 4 wt. % to about 8 wt. %, or from about 0.01 wt. % to about 3 wt. %, or from about 0.1 wt. % to about 3 wt. %, or from about 0.01 wt. % to about 2.5 wt. %, or from about 0.5 wt. % to about 3 wt. % of a carbon-based filler, or from about 1 wt. % to about 3 wt. % of a carbon-based filler or from about 0.5 wt. % to about 2.5 wt. % of a carbon-based filler.

Additives

The disclosed thermoplastic composition can comprise one or more additives conventionally used in the manufacture of molded thermoplastic parts with the proviso that the optional additives do not adversely affect the desired properties of the resulting composition. Mixtures of optional additives can also be used. Such additives can be mixed at a suitable time during the mixing of the components for forming the composite mixture. Exemplary additives can include ultraviolet agents, ultraviolet stabilizers, heat stabilizers, antistatic agents, anti-microbial agents, anti-drip agents, radiation stabilizers, pigments, dyes, fibers, fillers, plasticizers, fibers, flame retardants, antioxidants, lubricants, wood, glass, and metals, and combinations thereof. According to certain aspects, the polymer compositions may maintain mechanical performance and dielectric strength even with high levels of fillers (for example, greater than 30 wt. % filler based on the total weight of the polymer composition). It is noted however that the disclosed compositions do not require the addition of permanent anti-static agents to affect certain properties, such as to further reduce the surface and volume electrical resistivity of these materials, and to achieve their desired dielectric performance. Thus, the composition may be free of or substantially free of anti-static agents. Compositions of the present disclosure may feature a single electrically conductive filler, namely a carbon black, of relatively large surface area (greater than 500 $m^2/g$ when tested in accordance with BET methods) to achieve the disclosed properties.

The composite disclosed herein can comprise one or more additional fillers. The filler can be selected to impart additional impact strength and/or provide additional characteristics that can be based on the final selected characteristics of the polymer composition. In some aspects, the filler(s) can comprise inorganic materials which can include clay, titanium oxide, asbestos fibers, silicates and silica powders, boron powders, calcium carbonates, talc, kaolin, sulfides, barium compounds, metals and metal oxides, wollastonite, glass spheres, glass fibers, flaked fillers, fibrous fillers, natural fillers and reinforcements, and reinforcing organic fibrous fillers. In certain aspects, the composite may comprise a glass fiber filler. For example, the composite may comprise from about 0.01 wt. % to about 25 wt. %, from about 10 wt. % to about 25 wt. %, from about 15 wt. % to about 25 wt. %, of a glass fiber filler based on the total weight of the composite. In yet further aspects, the composite may be free or substantially free of a glass filler.

Appropriate fillers or reinforcing agents can include, for example, mica, clay, feldspar, quartz, quartzite, perlite, tripoli, diatomaceous earth, aluminum silicate (mullite), synthetic calcium silicate, fused silica, fumed silica, sand, boron-nitride powder, boron-silicate powder, calcium sulfate, calcium carbonates (such as chalk, limestone, marble, and synthetic precipitated calcium carbonates) talc (including fibrous, modular, needle shaped, and lamellar talc), wollastonite, hollow or solid glass spheres, silicate spheres, cenospheres, aluminosilicate or (armospheres), kaolin, whiskers of silicon carbide, alumina, boron carbide, iron, nickel, or copper, continuous and chopped carbon fibers or glass fibers, molybdenum sulfide, zinc sulfide, barium titanate, barium ferrite, barium sulfate, heavy spar, titanium dioxide, aluminum oxide, magnesium oxide, particulate or fibrous aluminum, bronze, zinc, copper, or nickel, glass flakes, flaked silicon carbide, flaked aluminum diboride, flaked aluminum, steel flakes, natural fillers such as wood flour, fibrous cellulose, cotton, sisal, jute, starch, lignin, ground nut shells, or rice grain husks, reinforcing organic fibrous fillers such as poly(ether ketone), polyimide, polybenzoxazole, poly(phenylene sulfide), polyesters, polyethylene, aromatic polyamides, aromatic polyimides, polyetherimides, polytetrafluoroethylene, and poly(vinyl alcohol), as well combinations comprising at least one of the foregoing fillers or reinforcing agents. The fillers and reinforcing agents can be coated or surface treated, with silanes for example, to improve adhesion and dispersion with the polymer matrix. Fillers generally can be used in amounts of 1 to 200 parts by weight, based on 100 parts by weight of based on 100 parts by weight of the total composition.

In some aspects, the thermoplastic composition may comprise a synergist. In various examples fillers may serve as flame retardant synergists. The synergist facilitates an improvement in the flame retardant properties when added to the flame retardant composition over a comparative composition that contains all of the same ingredients in the same quantities except for the synergist. Examples of mineral fillers that may serve as synergists are mica, talc, calcium carbonate, dolomite, wollastonite, barium sulfate, silica, kaolin, feldspar, barytes, or the like, or a combination comprising at least one of the foregoing mineral fillers. Metal synergists, for example, antimony oxide, can also be used with the flame retardant. In one example, the synergist may comprise magnesium hydroxide and phosphoric acid. The mineral filler may have an average particle size of about 0.1 to about 20 micrometers, specifically about 0.5 to about 10 micrometers, and more specifically about 1 to about 3 micrometers.

The thermoplastic composition can comprise an antioxidant. The antioxidants can include either a primary or a secondary antioxidant. For example, antioxidants can include organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene(3,5-di-tert-butyl-4-hydroxyhydrocinnamate)] methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl) propionate or the like; amides of beta-(3,5-di-tert-butyl-4- hydroxyphenyl)-propionic acid or the like, or combinations including at least one of the foregoing antioxidants. Antioxidants can generally be used in amounts of from 0.01 to 0.5 parts by weight, based on 100 parts by weight of the total composition, excluding any filler.

In various aspects, the thermoplastic composition can comprise a mold release agent. Exemplary mold releasing agents can include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from about 0.1 to about 1.0 parts by weight, based on 100 parts by weight of the total composition, excluding any filler.

In an aspect, the thermoplastic composition can comprise a heat stabilizer. As an example, heat stabilizers can include, for example, organo phosphites such as triphenyl phosphite, tris-(2,6-dimethylphenyl)phosphite, tris-(mixed mono- and di-nonylphenyl)phosphite or the like; phosphonates such as dimethylbenzene phosphonate or the like, phosphates such as trimethyl phosphate, or the like, or combinations including at least one of the foregoing heat stabilizers. Heat stabilizers can generally be used in amounts of from 0.01 to 0.5 parts by weight based on 100 parts by weight of the total composition, excluding any filler.

In further aspects, light stabilizers can be present in the thermoplastic composition. Exemplary light stabilizers can include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers can generally be used in amounts of from about 0.1 to about 1.0 parts by weight, based on 100 parts by weight of the total composition, excluding any filler. The thermoplastic composition can also comprise plasticizers. For example, plasticizers can include phthalic acid esters such as dioctyl-4,5-epoxy-hexahydrophthalate, tris-(octoxycarbonylethyl) isocyanurate, tristearin, epoxidized soybean oil or the like, or combinations including at least one of the foregoing plasticizers. Plasticizers are generally used in amounts of from about 0.5 to about 3.0 parts by weight, based on 100 parts by weight of the total composition, excluding any filler.

Ultraviolet (UV) absorbers can also be present in the disclosed thermoplastic composition. Exemplary ultraviolet absorbers can include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[(2-cyano-3,3-diphenylaciyloyl)oxy]-2,2-bis[[(2-cyano-3, 3-diphenylacryloyl)oxy]methyl]propane (UVINUL™ 3030); 2,2'-(1,4-phenylene) bis(4H-3,1-benzoxazin-4-one); 1,3-bis[(2-cyano-3,3-diphenylaciyloyl)oxy]-2,2-bis[[(2-cyano-3,3-diphenylacryloyl)oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight of the total composition, excluding any filler.

The thermoplastic composition can further comprise a lubricant. As an example, lubricants can include for example, fatty acid esters such as alkyl stearyl esters, for example, methyl stearate or the like; mixtures of methyl stearate and hydrophilic and hydrophobic surfactants including polyethylene glycol polymers, polypropylene glycol polymers, and copolymers thereof for example, methyl stearate and polyethylene-polypropylene glycol copolymers in a suitable solvent; or combinations including at least one of the foregoing lubricants. Lubricants can generally be used in amounts of from about 0.1 to about 5 parts by weight, based on 100 parts by weight of the total composition, excluding any filler.

Anti-drip agents can also be used in the composition, for example a fibril forming or non-fibril forming fluoropolymer such as polytetrafluoroethylene (PTFE). The anti-drip agent can be encapsulated by a rigid copolymer, for example styrene-acrylonitrile copolymer (SAN). PTFE encapsulated in SAN is known as TSAN. In one example, TSAN can comprise 50 wt. % PTFE and 50 wt. % SAN, based on the total weight of the encapsulated fluoropolymer. The SAN can comprise, for example, 75 wt. % styrene and 25 wt. % acrylonitrile based on the total weight of the copolymer. An antidrip agent, such as TSAN, can be used in amounts of 0.1 to 10 parts by weight, based on 100 parts by weight of the total composition, excluding any filler.

As an example, the disclosed composition can comprise an impact modifier. The impact modifier can be a chemically reactive impact modifier. By definition, a chemically reactive impact modifier can have at least one reactive group such that when the impact modifier is added to a polymer composition, the impact properties of the composition (expressed in the values of the IZOD impact) are improved. In some examples, the chemically reactive impact modifier can be an ethylene copolymer with reactive functional groups selected from, but not limited to, anhydride, carboxyl, hydroxyl, and epoxy.

In further aspects of the present disclosure, the composition can comprise a rubbery impact modifier. The rubber impact modifier can be a polymeric material which, at room temperature, is capable of recovering substantially in shape and size after removal of a force. However, the rubbery impact modifier should typically have a glass transition temperature of less than 0° C. In certain aspects, the glass transition temperature (Tg) can be less than −5° C., −10° C., −15° C., with a Tg of less than −30° C. typically providing better performance. Representative rubbery impact modifiers can include, for example, functionalized polyolefin ethylene-acrylate terpolymers, such as ethylene-acrylic esters-maleic anhydride (MAH) or glycidyl methacrylate (GMA). The functionalized rubbery polymer can optionally contain repeat units in its backbone which are derived from an anhydride group containing monomer, such as maleic anhydride. In another scenario, the functionalized rubbery polymer can contain anhydride moieties which are grafted onto the polymer in a post polymerization step.

Properties and Articles

In certain aspects, the disclosed composites may exhibit microwave absorption and shielding properties. A molded article or plaque comprising the composite may exhibit a dielectric constant between 5 and 30 and a dissipation loss between 0.5 and 45 measured at frequencies between about 10 and about 120 GHz. The dissipation factor Df (tan delta, $\varepsilon''/\varepsilon'$) may be between 0.01 and 2 at frequencies of about 10 to about 120 GHz. Plaques molded from the disclosed composite may exhibit certain microwave absorption properties. For example, molded plaques at a thickness of about 0.125 inches (3.175 mm) may reflect at least 14% of incident microwave radiation at frequencies from about 75 GHz to 110 GHz. Such performance may be apparent for molded plaques at thicknesses between 1 mm and 5 mm. Plaques molded from the disclosed composite may exhibit certain attenuation properties. As the carbon filler content increased, attenuation increased. For example, attenuation values of from at least −5 dB/cm to about −150 dB/cm in the K band and −25 dB/cm to about −200 dB/cm in the W band were observed. Plaques molded from the disclosed composite may exhibit certain shielding properties. Total shielding may improve as the amount of carbon black increases. For example, shielding effectiveness values of at least from 2 dB to about 30 dB in the K-band and at least from 10 dB to 60 dB in the W-band were observed.

However, absorption and reflection performed differently with increasing carbon black filler in the PBT resin. Surprisingly, a maximum microwave absorption was found at about 4 wt. % carbon filler. In some examples, the composite may comprise from about 3 wt. % to about 7 wt. % of a carbon filler and may thus exhibit a percent absorbed power measured in transmission mode of at least 74% when observed at 77 GHz.

In various aspects, the present disclosure relates to articles comprising the compositions herein. The compositions can be molded into useful shaped articles by a variety of means such as injection molding, extrusion, rotational molding, blow molding and thermoforming to form articles. The compositions can be useful in the manufacture of articles requiring materials with good flow, good impact strength, and good dielectric strength. In various aspects, the compositions may be useful for as well as electrically conducting purposes. The advantageous characteristics of the compositions disclosed herein can make them appropriate for an array of uses.

Methods for Making the Composite

Aspects of the disclosure further relate to methods for making a composite including a thermoplastic polymer component. In many aspects, the compositions can be prepared according to a variety of methods. The compositions of the present disclosure can be blended, compounded, or otherwise combined with the aforementioned ingredients by a variety of methods involving intimate admixing of the materials with any additional additives desired in the formulation. Because of the availability of melt blending equipment in commercial polymer processing facilities, melt processing methods can be used. In various further aspects, the equipment used in such melt processing methods can include, but is not limited to, co-rotating and counter-rotating extruders, single screw extruders, co-kneaders, disc-pack processors and various other types of extrusion equipment. In a further aspect, the extruder is a twin-screw extruder. In various further aspects, the composition can be processed in an extruder at temperatures from about 180° C. to about 350° C., particularly 250° C. to 300° C.

Methods may further comprise processing the composite to provide a plaque of a desired thickness. Plaques can be extruded, injection molded, compression molded or injection-compression molded, and may have a thickness between about 0.5 mm and 6 mm. Other processes could also be applied to the thin thermoplastic film, including but not limited to, lamination, co-extrusion, thermo-forming or hot pressing. In such aspects, further layers of other materials (for example, other thermoplastic polymer layers, metallic layers, etc.) could be combined with the composite. Various combinations of elements of this disclosure are encompassed by this disclosure, for example, combinations of elements from dependent claims that depend upon the same independent claim.

Definitions

It is also to be understood that the terminology used herein is for the purpose of describing particular aspects only and is not intended to be limiting. As used in the specification and in the claims, the term "comprising" can include the embodiments "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a thermoplastic polymer component" includes mixtures of two or more thermoplastic polymer components. As used herein, the term "combination" is inclusive of blends, mixtures, alloys, reaction products, and the like.

Ranges can be expressed herein as from one value (first value) to another value (second value). When such a range is expressed, the range includes in some aspects one or both of the first value and the second value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the designated value, approximately the designated value, or about the same as the designated value. It is generally understood, as used herein, that it is the nominal value indicated ±10% variation unless otherwise indicated or inferred. The term is intended to convey that similar values promote equivalent results or effects recited in the claims That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not. For example, the phrase "optional additional processes" means that the additional processes can or cannot be included and that the description includes methods that both include and that do not include the additional processes.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the disclosure. Thus, if there are a variety of additional steps that can be performed it is understood that each of these additional steps can be performed with any specific aspect or combination of aspects of the methods of the disclosure.

References in the specification and concluding claims to parts by weight of a particular element or component in a composition or article, denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included.

The terms "residues" and "structural units", used in reference to the constituents of the polymers, are synonymous throughout the specification.

In one aspect, "substantially free of" can be less than about 0.5 weight percent (wt. %). In another aspect, substantially free of can be less than about 0.1 wt. %. In another aspect, substantially free of can be less than about 0.01 wt. %. In yet another aspect, substantially free of can be less than about 100 ppm. In yet another aspect, substantially free can refer to an amount, if present at all, below a detectable level.

As used herein the terms "weight percent," "wt %," and "wt. %," which can be used interchangeably, indicate the percent by weight of a given component based on the total weight of the composition, unless otherwise specified. That is, unless otherwise specified, all wt % values are based on the total weight of the composition. It should be understood that the sum of wt % values for all components in a disclosed composition or formulation is 100.

Unless otherwise stated to the contrary herein, all test standards are the most recent standard in effect at the time of filing this application. Each of the materials disclosed herein are either commercially available and/or the methods for the production thereof are known to those of skill in the art. It is understood that the compositions disclosed herein have certain functions. Disclosed herein are certain structural requirements for performing the disclosed functions and it is understood that there are a variety of structures that can perform the same function that are related to the disclosed structures, and that these structures will typically achieve the same result.

ASPECTS OF THE DISCLOSURE

The present disclosure pertains to and includes at least the following aspects.

Aspect 1. A composite comprising: from about 50 wt. % to about 97 wt. % of a thermoplastic resin, wherein the thermoplastic resin comprises a polyester; and from about 3 wt. % to about 15 wt. % of a carbon-based filler, wherein the carbon-based filler has a primary surface area of from about 500 to about 1000 $m^2/g$, wherein the composite exhibits a dielectric constant ε' of between 5 and 30 and a dissipation loss ε" of between 0.5 and 45, measured at frequencies between about 10 and about 120 GHz, wherein a molded sample of the composite exhibits a percent reflected power measured in transmission mode of at least 15% when observed according to a Free Space method at frequencies from about 75 GHz to 110 GHz, and wherein the combined weight percent value of all components does not exceed 100 wt. %, and all weight percent values are based on the total weight of the composite.

Aspect 2. The composite according to aspect 1, wherein the polyester comprises a polyalkylene terephthalate polymer.

Aspect 3. The composite according to any one of aspects 1-2, wherein the polyester comprises polybutylene terephthalate.

Aspect 4. The composite according to any one of aspects 1-3, wherein the composite has a dissipation factor (Df) of from about 0.01 to about 2 when determined as a ratio of ε" and ε' measured in transmission mode.

Aspect 5. The composite according to any one of aspects 1-4, wherein a 3.175 mm ($1/8^{th}$ in.) thick molded plaque comprising the composite absorbs about 60% or more of incident microwave radiation at frequencies from about 75 GHz to 110 GHz.

Aspect 6. The composite according to any one of aspects 1-5, wherein a 3.175 ($1/8^{th}$ in.) mm thick molded plaque comprising the composite reflects at least 14% of incident microwave radiation at frequencies from about 75 GHz to 110 GHz.

Aspect 7. The composite of any one of aspects 1-6, wherein a molded plaque comprising the composite exhibits microwave Attenuation of at least about −30 dB/cm in the W-band, and a total Shielding Effectiveness of at least about 7 dB in the W-band when measured according to a Free Space method.

Aspect 8. The composite of any one of aspects 1-7, wherein the composite exhibits a surface resistivity of at least 30 ohms per square when tested in accordance with ASTM D 257.

Aspect 9. The composite of any one of aspects 1-7, wherein the composite exhibits a volume resistivity of at least 10 ohms cm when tested in accordance with ASTM D 257.

Aspect 10. The composite of any one of aspects 1-7, wherein a ratio of thermoplastic resin to carbon-based filler is from about 32:1 to about 6:1.

Aspect 11. The composite according to aspects 1-10, wherein the carbon-based filler is present in an amount of from 3 wt. % to 7 wt. % and wherein the percent Absorption measured in Transmission mode is at least 74% when observed at 77 GHz frequency.

Aspect 12. The composite of any one of aspects 1-11, wherein the carbon-based filler comprises carbon fibers, carbon powder, graphite, graphene, carbon platelets, carbon nanotubes, or a combination thereof.

Aspect 13. The composite of any one of aspects 1-11, wherein the carbon-based filler comprises carbon powder and is free of or substantially free of carbon nanotubes, carbon platelets, or carbon fibers.

Aspect 14. The composite of any one of aspects 1-11, wherein the carbon-based filler comprises carbon black powder.

Aspect 15. The composite of any one of aspects 1-11, wherein the carbon-based filler comprises carbon black powder and wherein the carbon black powder has a surface area of at least 700 $m^2/g$ when determined according to the BET method.

Aspect 16. The composite of any one of aspects 1-11, wherein the carbon-based filler has a primary particle diameter of 10 nm to 50 nm.

Aspect 17. The composite of any one of aspects 1-11, wherein the carbon-based filler has a DBP absorption amount from 80 ml/100 g to about 500 ml/100 g.

Aspect 18. The composite of any one of aspects 1-15, wherein the composite is free of or substantially free of glass fiber.

Aspect 19. The composite of any one of aspects 1-16, further comprising an additive material selected from the group consisting of: an antioxidant; a colorant; a de-molding agent; a dye; a flow promoter; a flow modifier; a light stabilizer; a lubricant; a mold release agent; a pigment; a colorant, a quenching agent; a thermal stabilizer; an ultraviolet (UV) absorbant; a UV reflectant; a UV stabilizer; an epoxy chain extender; a flame retardant; and combinations thereof.

Aspect 20. The composite of any one of aspects 1-17, wherein the composite is a component of an automotive radar sensor.

Aspect 21. The composite of any one of aspects 1-18, wherein the composite is a microwave absorptive device or a component thereof.

Aspect 22. An autoradar sensor for electromagnetic radiation comprising a composite, the composite comprising: from about 50 wt. % to about 97 wt. % of a thermoplastic resin, wherein the thermoplastic resin comprises a polyalkylene terephthalate; and from about 0.05 wt. % to about 50 wt. % of a carbon-based filler, wherein the composite exhibits a dielectric constant ε' of between 5 and 30 and a dissipation loss ε" of between 0.5 and 45, measured at frequencies between about 10 and about 120 GHz, wherein a molded sample of the composite exhibits a percent reflected power measured in transmission mode of at least 15% when observed according to a Free Space method at frequencies from about 75 GHz to 110 GHz, and wherein the combined weight percent value of all components does not exceed 100 wt. %, and all weight percent values are based on the total weight of the composite.

Aspect 23. A composite comprising: from about 50 wt. % to about 97 wt. % of a thermoplastic resin, wherein the thermoplastic resin comprises a polyester; and from about 3 wt. % to about 7 wt. % of a carbon-based filler, wherein the carbon-based filler has an average surface area of from about 500 to about 1000 $m^2/g$, wherein the composite exhibits a dielectric constant ε' of between 5 and 30 and a dissipation loss ε" of between 0.5 and 45, measured at frequencies between about 10 and about 120 GHz, wherein a molded sample of the composite exhibits a percent Absorbed power measured in transmission mode of at least 74% when observed according to a Free Space method at frequencies from about 75 GHz to 110 GHz, and wherein the combined weight percent value of all components does not exceed 100 wt. %, and all weight percent values are based on the total weight of the composite.

Aspect 24. A composite comprising: from about 50 wt. % to about 97 wt. % of a thermoplastic resin, wherein the thermoplastic resin comprises a polyester; from about 5 wt. % to about 15 wt. % of a carbon-based filler, wherein the carbon-based filler has an average surface area of from about 500 to about 1000 $m^2/g$, and from about 0.01 wt. % to about 25 wt. % of a glass fiber filler, wherein the composite exhibits a tensile modulus less than 9,000 MPa when tested in accordance with ASTM D638, wherein the composite exhibits a volume electrical resistivity less than $1.0\times10^{11}$ Ω·cm, wherein the composite exhibits a dielectric constant ε' of between 5 and 30 and a dissipation loss ε" of between 0.5 and 45, measured at frequencies between about 10 and about 120 GHz, wherein a molded sample of the composite exhibits a percent Absorbed power measured in transmission mode of at least 55% when observed according to a Free Space method at frequencies from about 10 GHz to 120 GHz, and wherein the combined weight percent value of all components does not exceed 100 wt. %, and all weight percent values are based on the total weight of the composite.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (for example, amounts, temperature, etc.), but some errors and deviations should be accounted for. Unless indicated otherwise, parts are parts by weight, temperature is in ° C. or is at ambient temperature, and pressure is at or near atmospheric. Unless indicated otherwise, percentages referring to composition are in terms of wt %.

There are numerous variations and combinations of mixing conditions, for example, component concentrations, extruder design, feed rates, screw speeds, temperatures, pressures and other mixing ranges and conditions that can be used to optimize the product purity and yield obtained from the described process. Only reasonable and routine experimentation will be required to optimize such process conditions.

Example I. Comparing Polyethoimide and Polycarbonate Compositions to PBT Resins (W-Band)

Various composite samples were prepared. The formulations are presented in Table 1 (FIG. 1). Comparative samples included a blend of polycarbonate or polyetherimide resins and carbon black and are designated CE-1 and CE-2. Inventive samples EX-1 through EX-3 combine a blend of polybutylene terephthalate resin and carbon black, where the carbon blacks are Ensaco 350 G (CB1) and Ensaco 360 G (CB2). FIG. 2 presents a comparison among commercially available carbon blacks according to particle sizes 250 G, 350 G, and 360 G from Ensaco™. As shown, CB1 and CB2 used herein have a surface area greater than 700 $m^2/g$ and far greater than that of 250 G.

Composite samples were prepared on a 40 mm diameter, co-rotating intermeshing twin-screw extruder, where the ingredients of the different formulations were added to the extruder, melted, mixed and pushed out of the extruder through a five-hole die plate. The extruder was operated at 200 rpm of screw speed, at a rate of 45 lb/hr (0.0225 ton/hr) and at a torque of about 40% of the maximum torque. The extruder barrel temperature was maintained between about 180-195° C. (upstream, extruder's feed throat) and about 250° C. (downstream, extruder's die plate). The die plate temperature was maintained at about 250° C., and the temperature of the melt exiting the extruder was measured at about 275° C.

Mechanical and physical properties are presented in Table 3 (FIG. 3). As shown, the PBT inventive samples EX-1 through EX-3 have comparable performance to those of CE-1 and CE-2.

Electrical surface resistivity and volume resistivity were observed for comparative and inventive samples at room temperature, measured according to ASTM D257 on 4 inch by 5 inch and ⅛ inch thick (10.2 cm by 12.7 cm and 0.32 cm thickness) molded plaques, at a range of 10-100V of voltage, at 50% relative humidity (RH) and 23° C. ambient conditions. Table 4 (FIG. 4) presents the values observed for CE-1, CE-2, EX-2, and EX-3.

Values for complex dielectric permittivities (dielectric constant ε' and dissipation loss ε") were also observed according to the Free Space Method. The Free Space Method consists of a Vector Network Analyzer connected to two antennas (a transmitting antenna and a receiving antenna) to focus microwave energy at or through a slab of material. The method can be run in Transmission Mode (all three modes of energy transfer, Transmission, Absorption and Reflection are allowed) or Metal-backed Reflection Mode (only Absorption and Reflection are allowed, with Transmission being suppressed by the use of a metallic plate behind the sample). This method is non-contacting and is especially useful at mm-wave frequencies. Samples were evaluated in two modes: (a) Transmission mode and (b) Metal-backed reflection mode as presented in FIG. 5.

The dielectric constant (ε', real part) was observed for samples CE-1, CE-2, EX-2 and EX-3 at 75-110 GHz frequency. Two different specimens of each sample were observed. Table 5 (shown in FIG. 6) presents the values for the imaginary part ε" and real part ε' of the complex permittivity as well as the dissipation loss, tan δ (ε"/c'), for CE-1, CE-2, EX-2 and EX-3 at 75 GHz, 92.5 GHz and 110 GHz frequencies. The dielectric constant of the PBT-CB inventive resins at high frequencies was about twice as large as those of the PC- and PEI-based resins for similar type and carbon black loading.

Reflection loss in metal-backed reflection mode for all frequencies was investigated (75 GHz-110 GHz). All samples had the same thickness (⅛ in.). It was apparent that reflection loss was constant with frequency. Table 6 (FIG. 7) presents the data observed for reflection loss in metal-backed reflection mode, as measured in two plaques A and B molded from the same resin, for CE-1, CE-2, EX-2 and EX-3 at 75 GHz, 92.5 GHz and 110 GHz frequencies. As shown, the reflection loss of the inventive samples at high frequencies was similar to that of the comparative PC- and PEI-based resins for similar carbon black loading (14.5%).

Example II. Comparing Polyetherimide and Polycarbonate Compositions to PBT Resins (K-Band)

Complex Permittivities were also observed at moderate frequencies in the K-band (18-26.5 GHz). Real and imaginary parts of permittivity were observed for CE-1, CE-2, EX-2, and EX-3 with Teflon used as a control or standard Inventive samples EX-2 and EX-3 were each observed in two specimens corresponding to EX-2a, 2b and EX-3a, 3b. FIGS. 8A-8D present the real and imaginary parts of permittivity; attenuation (decibels per centimeter, dB/cm); shielding effectiveness (dB); and return loss in metal-backed reflection mode (d/B) for CE1; FIGS. 9A-9D, for CE2; FIGS. 10A-10D, for EX-2a; FIGS. 11A-11D, for EX-2b; FIGS. 12A-12D, for EX-3a; and FIGS. 13A-13D, for EX-3b.

Values of the real ε' and imaginary ε" complex permittivities observed in the inventive PBT compositions varied between 18 and 25, and 24 and 45, respectively, whereas the same values for the comparative compositions varied between 14 and 18, and 6 and 8, respectively. The values of Attenuation observed in the inventive PBT compositions varied between −90 and −150 dB/cm, whereas the same values for the comparative compositions varied between −30 and −40 dB/cm. The values of Shielding Effectiveness observed in the inventive PBT compositions varied between 35 and 55 dB, whereas the same values for the comparative compositions varied between 13 and 18 dB. The values of Reflection Loss measured in metal-backed reflection mode observed in the inventive PBT compositions varied between −2 and −4 dB, whereas the same values for the comparative compositions varied between −3 and −6 dB. These results showed that higher values of the real ε' and imaginary ε" parts of the complex permittivities observed in the PBT inventive compositions resulted in higher values of Attenuation and Shielding Effectiveness when compared to similar control compositions that contained the same carbon black added at similar loadings but an amorphous matrix resin (PC or PEI) instead of a semi-crystalline matrix resin (PBT).

Example III. PBT Composites with Varying Carbon Black in K-Band (18-26.5 GHz) and W-Band (75-110 GHz)

To further investigate the role of carbon black, PBT-CB composites were prepared with varying amounts of carbon black. Namely, 2 wt. % (CE3), 4 wt. % (EX-4), 6 wt. % (EX-5), 8 wt. % (EX-6), and 10 wt. % (EX-7) were evaluated with EX-2 (14.5%). Formulations are presented in Table 7 (FIG. 14).

Figure 16A:
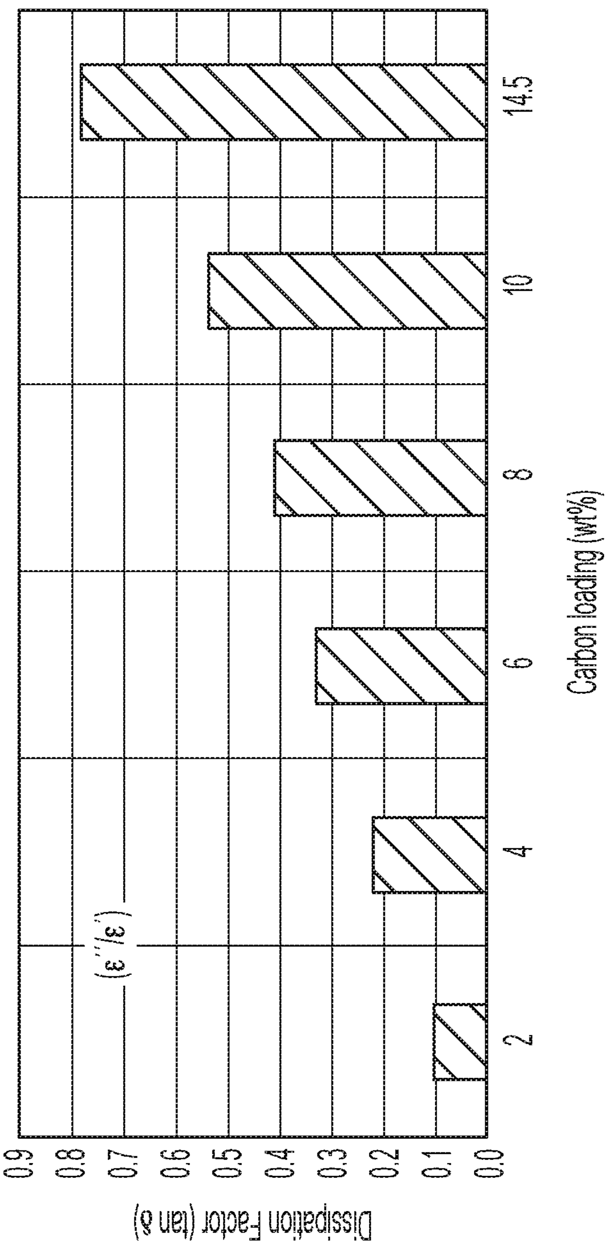
FIG. 16A presents a graphical representation of the dissipation factor, tan δ (ε"/ε') for samples EX-4, EX-5, EX-6, EX-7, CE3, and EX-2 observed at 77 GHz.
Figure 16B:
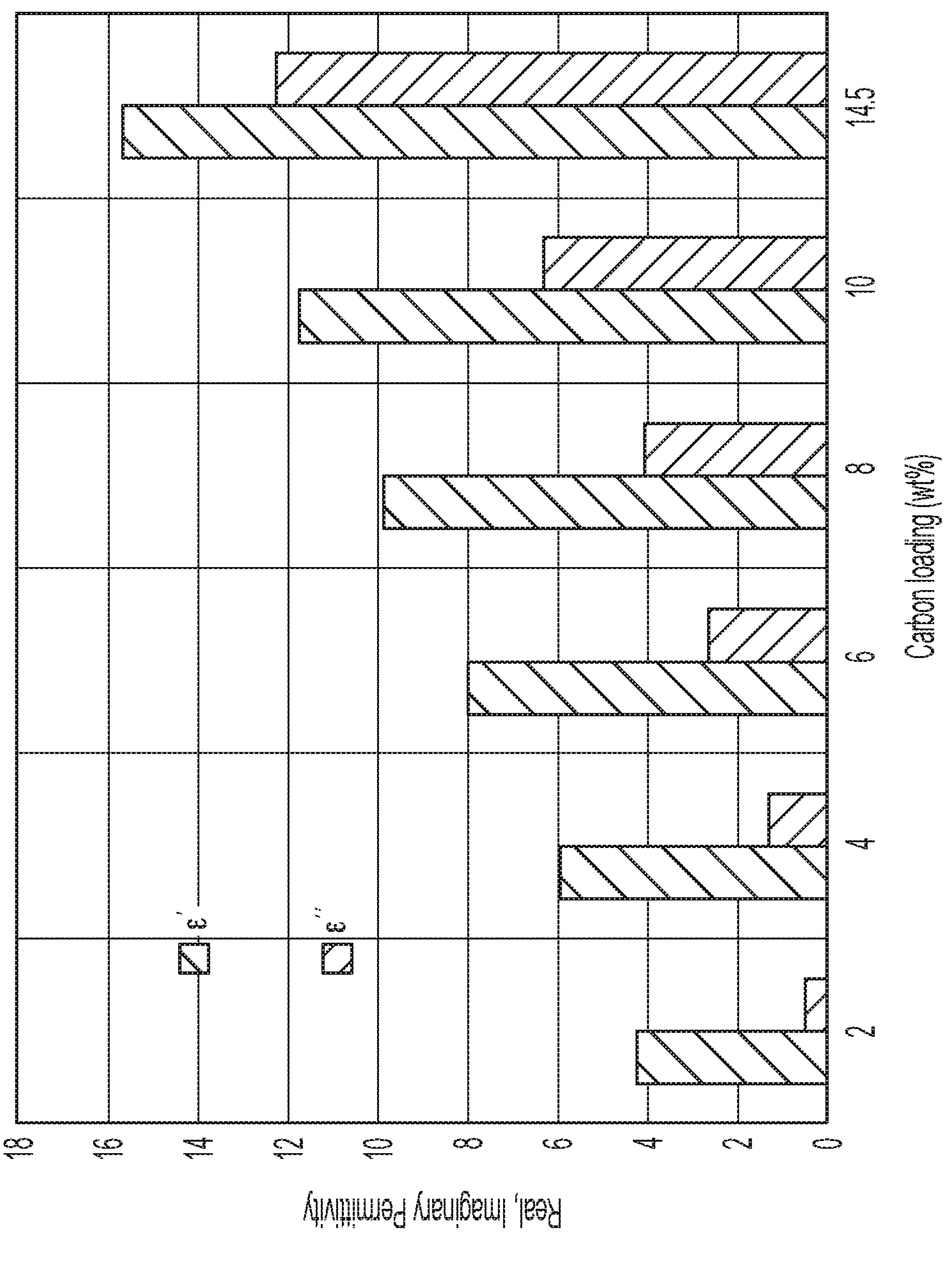
FIG. 16B presents a graphical representation of the real and imaginary parts of permittivity for samples EX-4, EX-5, EX-6, EX-7, CE3, and EX-2 observed at 77 GHz.

Dielectric properties were observed on 3.175 mm (0.125 in.) samples at 77 GHz. Values are presented in Table 8 (FIG. 15). As evidenced, increasing the amount of carbon black increased the value of the dielectric constant. FIG. 16A is a graphical representation of the dissipation factor, tan δ, showing that the ε"/ε' ratio increases with carbon loading. FIG. 16B is a graphical representation of the real and imaginary parts of the complex permittivity, each increasing with the increase in carbon black loading, with ε" increasing more rapidly than ε' when carbon loading was increased.

Figure 17:
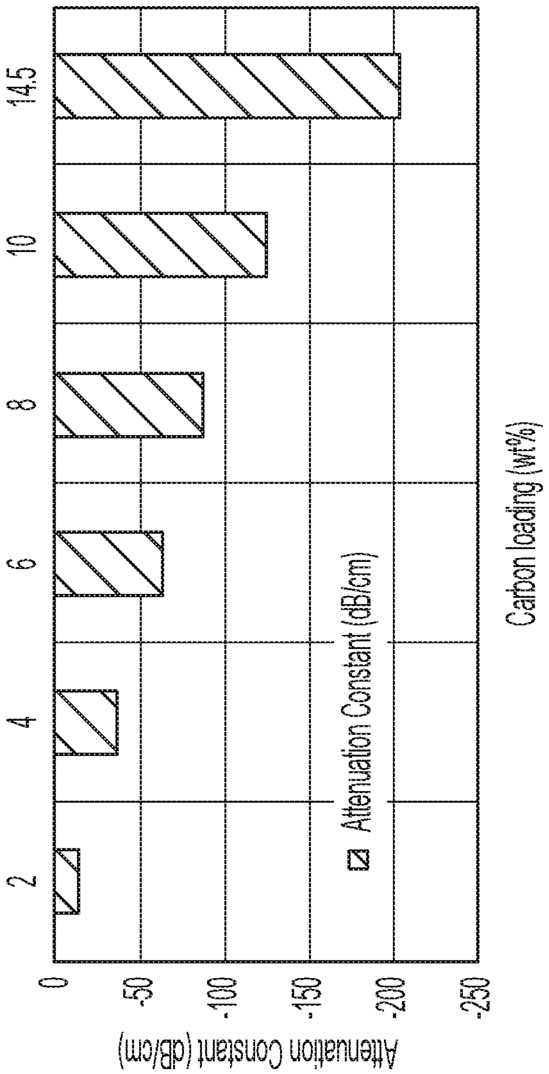
FIG. 17 shows a graphical representation of the attenuation constant values for samples EX-4, EX-5, EX-6, EX-7, CE3, and EX-2 observed at 77 GHz.
Figure 18:
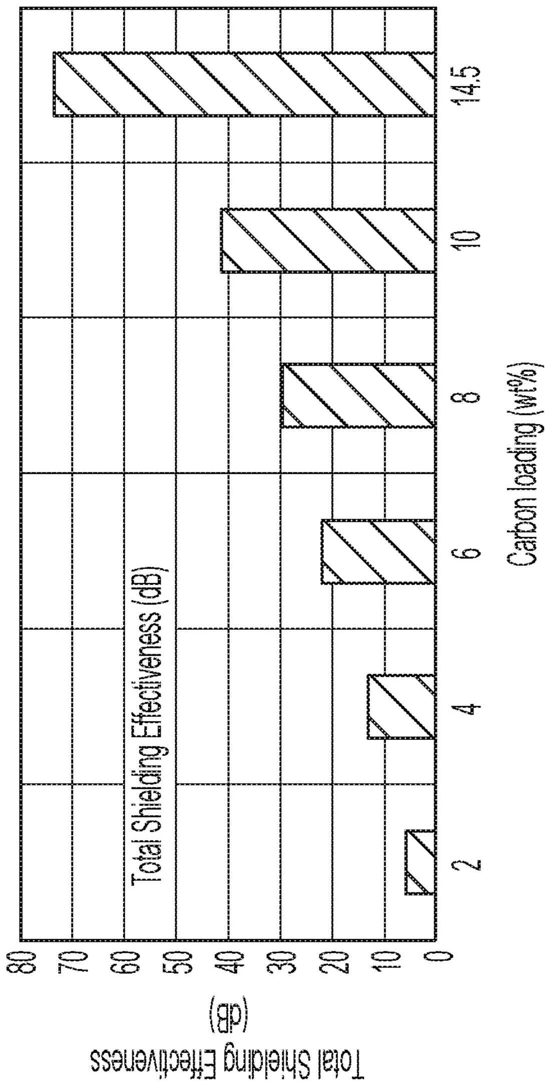
FIG. 18 shows a graphical representation of the Total Shielding Effectiveness (SE) values for samples EX-4, EX-5, EX-6, EX-7, CE3, and EX-2 observed at 77 GHz.

FIG. 17 is a graphical representation of the attenuation constant, which appeared to become increasingly more negative with the increasing amount of carbon black. FIG. 18 is a graphical representation of the total shielding effectiveness, which similarly follows the trend of increasing carbon black content.

Figure 19:
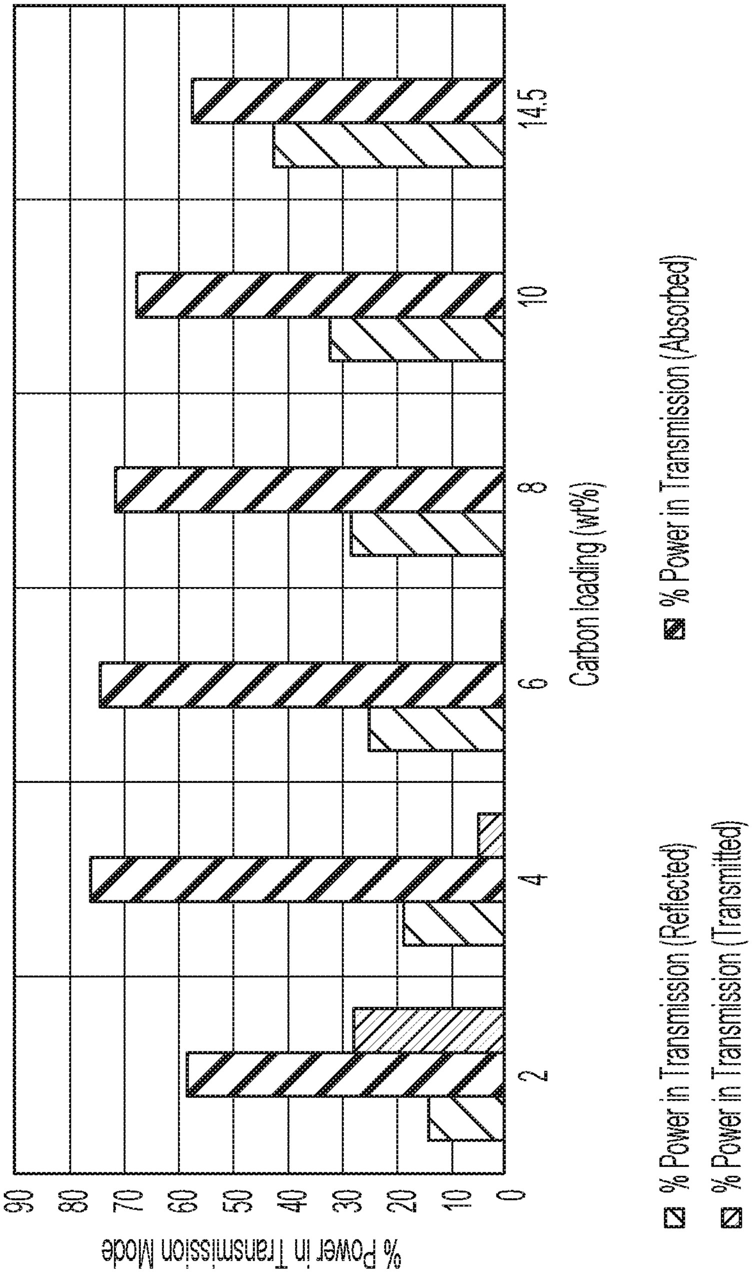
FIG. 19 shows a graphical representation of the percent reflected power (transmission mode), percent absorbed power (transmission mode), and percent transmitted power (transmission mode) for EX-4, EX-5, EX-6, EX-7, CE3, and EX-2 observed at 77 GHz.
Figure 20:
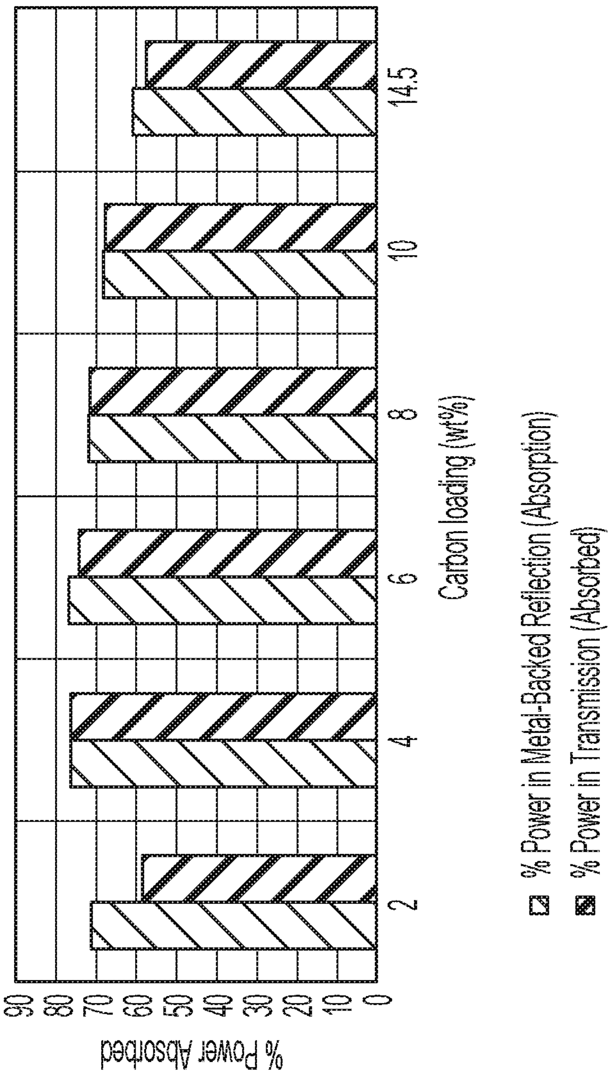
FIG. 20 shows a graphical representation of the percent absorbed power (metal-backed reflection mode) and percent absorbed power (transmission mode) for samples EX-4, EX-5, EX-6, EX-7, CE3, and EX-2 observed at 77 GHz.

FIG. 19 shows a graphical representation of the percent power in transmission mode in terms of the amount of carbon added to the formulation. The sum of Absorption, Reflection and Transmission at each frequency has to amount to 100% of the incoming MW radiation. As this Figure shows, Transmission through the sample decreased when carbon black content increased as the material becomes more and more opaque to microwave radiation Reflected power increased with carbon black loading as the material becomes more electrically conductive, behaving dielectrically more as a metal than a polymer when the carbon amount increases. Surprisingly, however, the percent power Absorbed in transmission mode increased until about 4 wt. % carbon loading and began to decrease after 5 or 7 wt. %. Thus, the carbon loading for maximum (about 76%) microwave Absorption was about 4 wt. % carbon black. FIG. 20 is a graphical representation of the percent power absorbed in transmission and metal-backed reflection modes. Here, where transmission is low (samples with 8, 10, and 14.5 wt. % carbon black), there is almost no difference between the results observed in transmission and metal-backed reflection modes. The observed results in transmission and metal-backed reflection modes when microwave transmission through the sample is low can be explained in terms of transmission being blocked either artificially or naturally. In metal-back reflection mode transmission is blocked purposely by intercalating a metal plate (almost zero transmission) between the receiving antenna and the sample under test. In transmission mode, on the other hand, transmission through the sample is blocked naturally by the presence of high levels of carbon particles in the sample that act to block any passage of microwave energy from the sample to the receiving antenna in very much the same way as the metal plate acts to block through-radiation when using the metal-backed reflection mode of measurement.

Figure 22A:
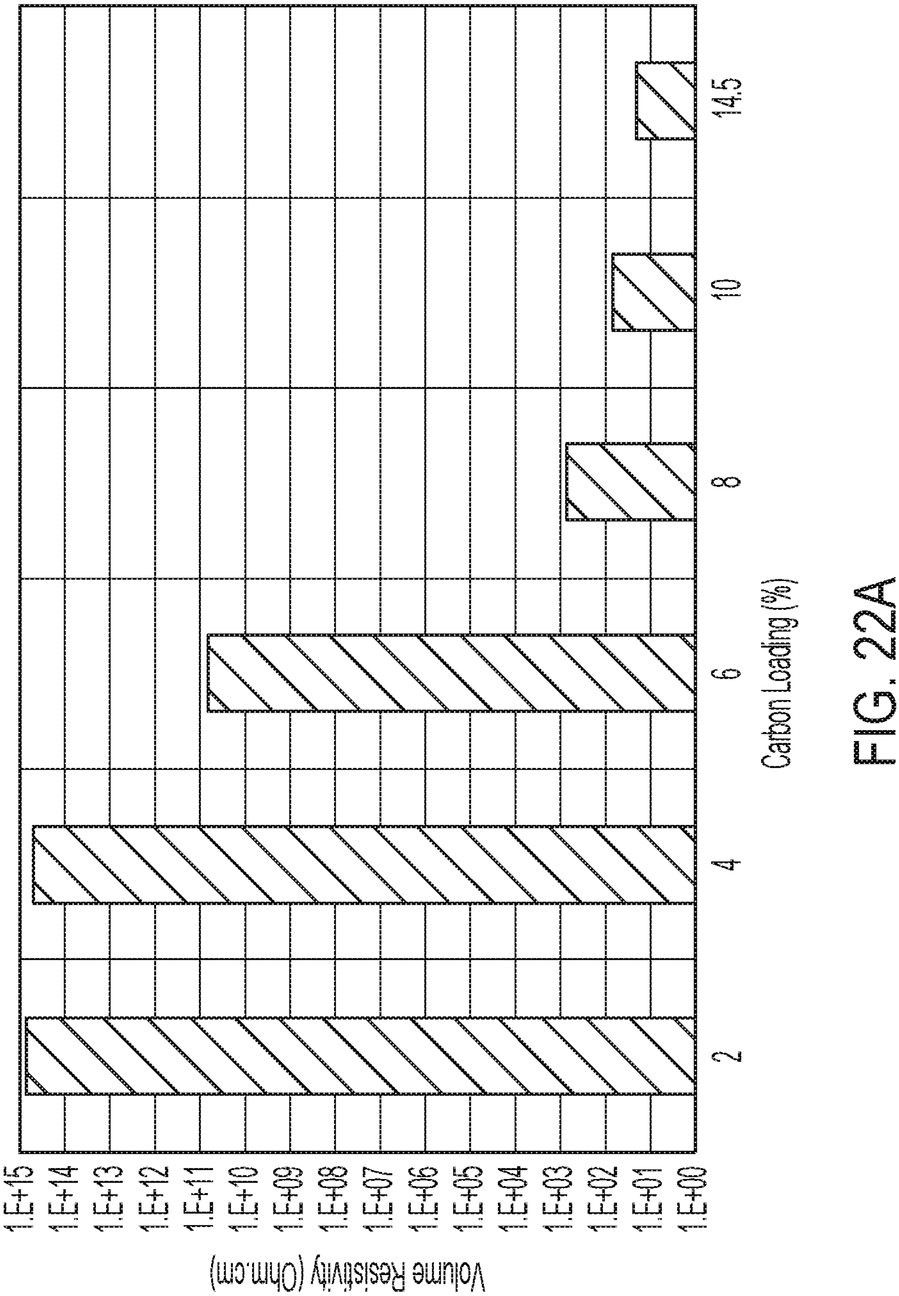
FIG. 22A is a graphical representation of the volume resistivity as a function of carbon loading for samples EX-4, EX-5, EX-6, EX-7, CE-3, and EX-2.
Figure 22B:
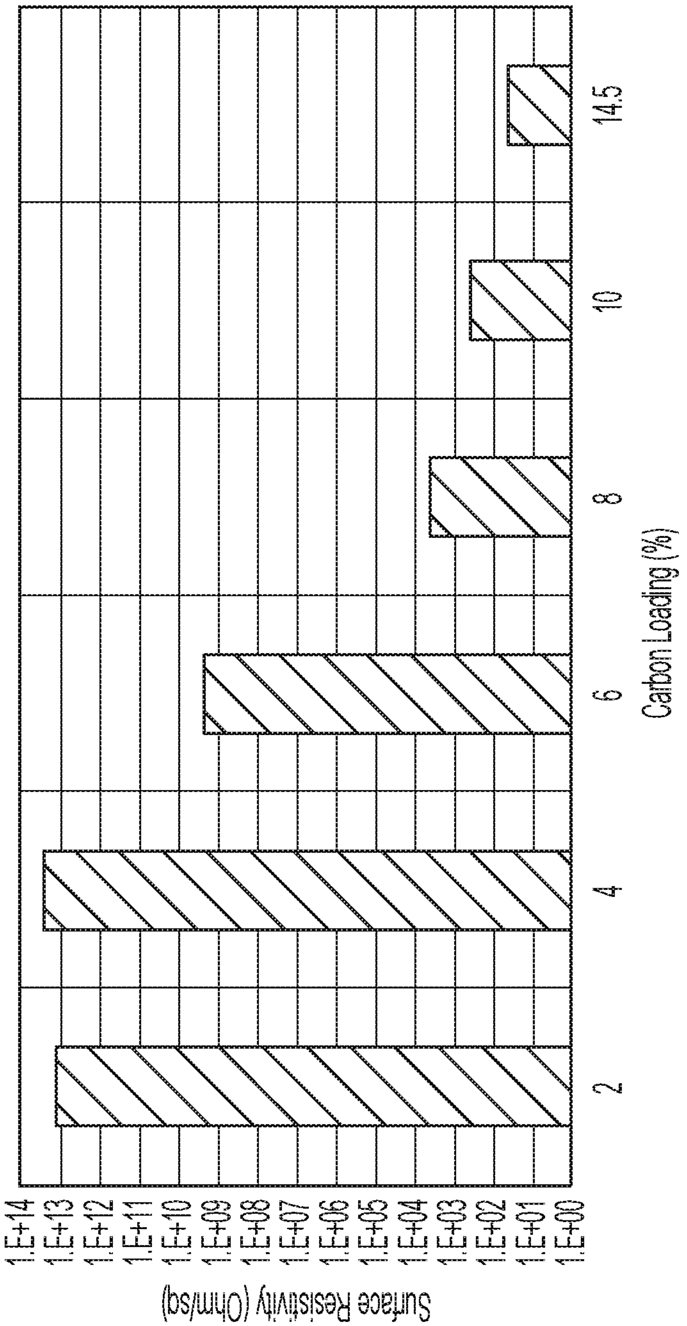
FIG. 22B is a graphical representation of the surface resistivity as a function of carbon loading for samples EX-4, EX-5, EX-6, EX-7, CE-3, and EX-2.

Table 9 (shown in FIG. 21) presents the volume and surface resistivities for EX-4 through EX-7, CE3 and EX-2 (14.5 wt. % carbon black). FIGS. 22A and 22B are graphical representations of the volume resistivity and surface resistivity, respectively, as a function of carbon loading. It was apparent that the percolation threshold was between 4 wt. % and 8 wt. % carbon black. Dielectric properties of compositions EX-4 through EX-7, CE3 and EX-2 were also observed at moderate frequencies (K-band: 18-26.5 GHz) and high frequencies (W-band: 75-110 GHz).

Figure 23A:
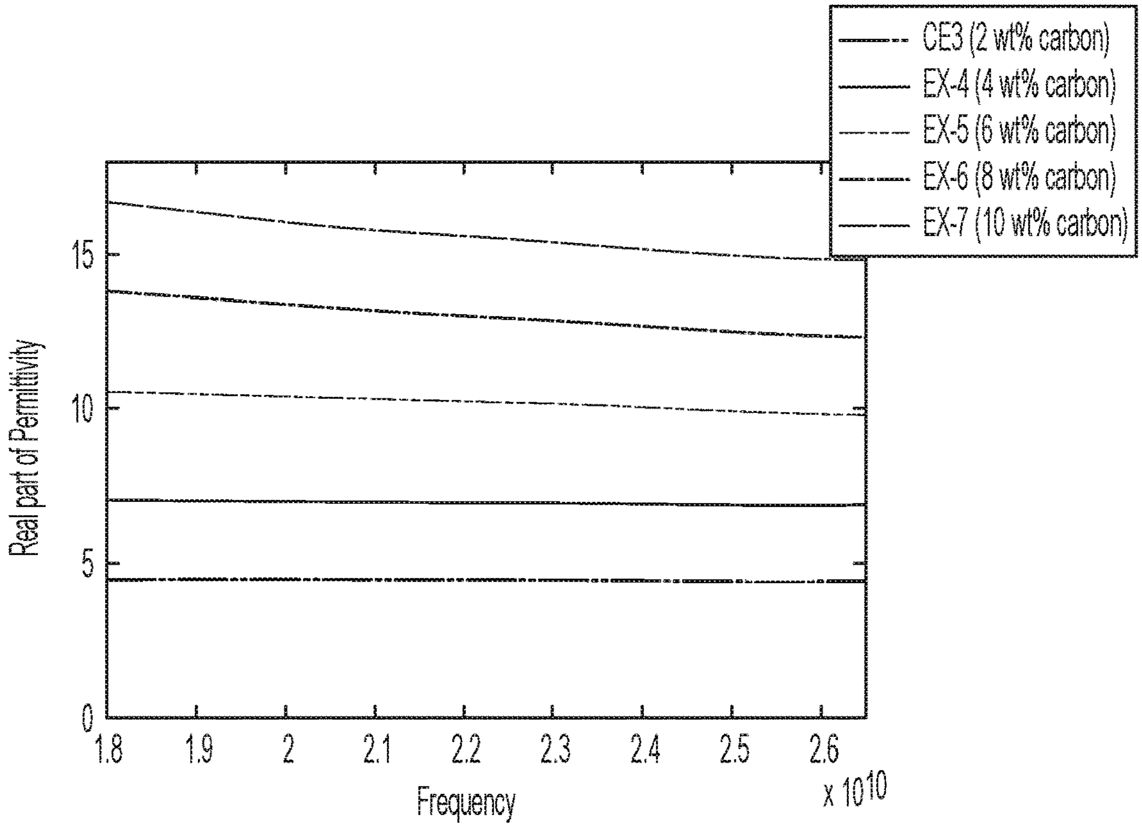
FIG. 23A is a graphical representation of the real part of permittivity for samples EX-4, EX-5, EX-6, EX-7, and CE-3 observed in the K-band.
Figure 23B:
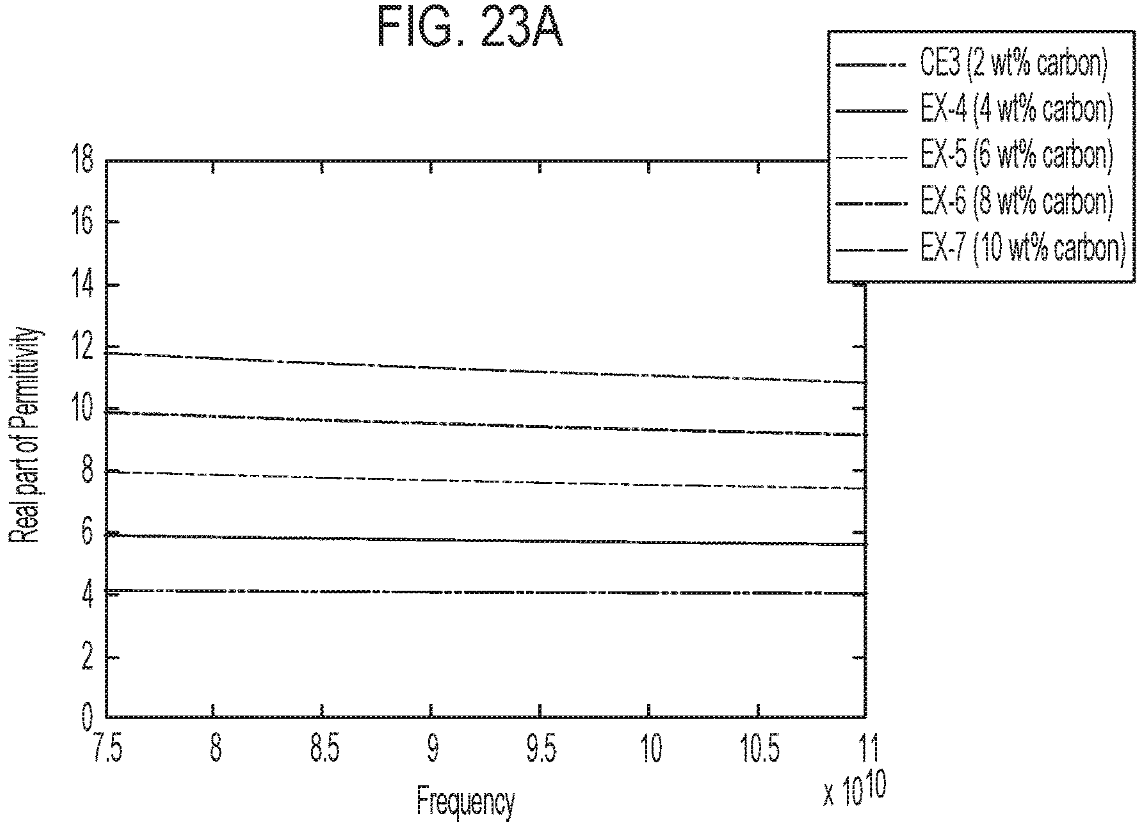
FIG. 23B is a graphical representation of the real part of permittivity for samples EX-4, EX-5, EX-6, EX-7, and CE-3 observed in the W-band.
Figure 24A:
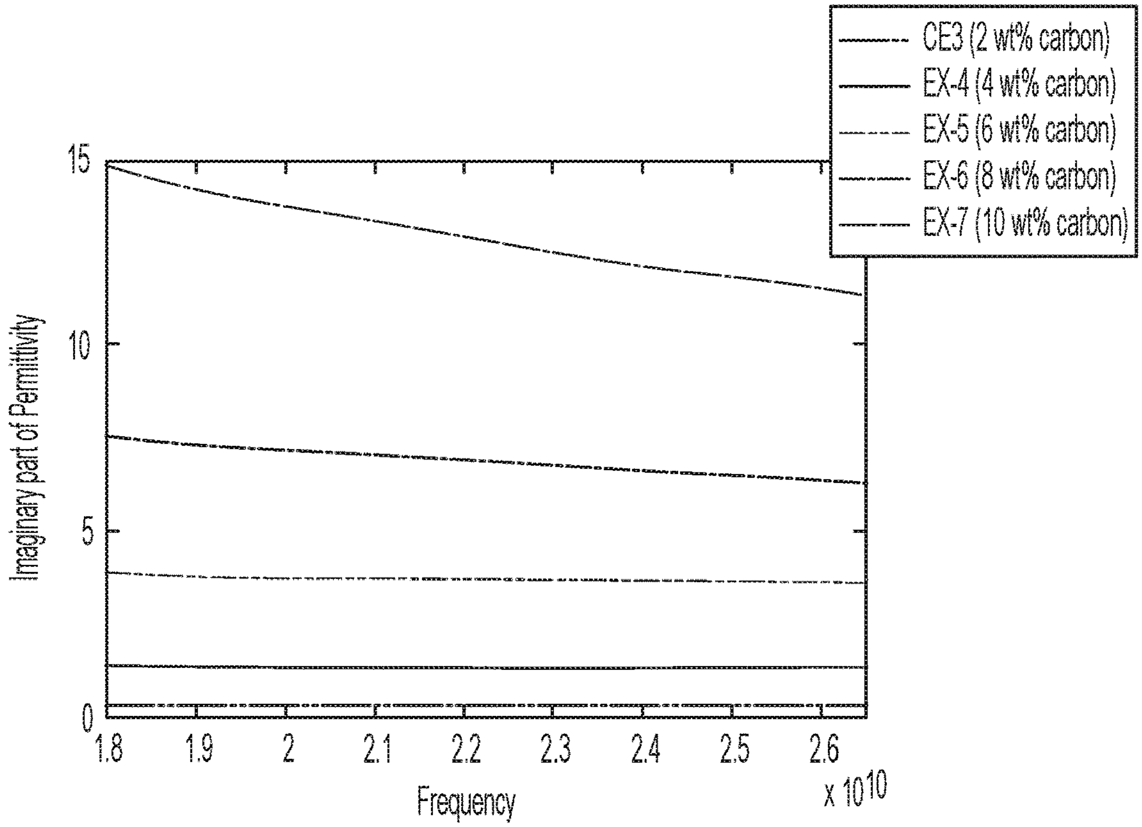
FIG. 24A is a graphical representation of the imaginary part of permittivity for samples EX-4, EX-5, EX-6, EX-7, and CE-3, observed in the K-band.
Figure 24B:
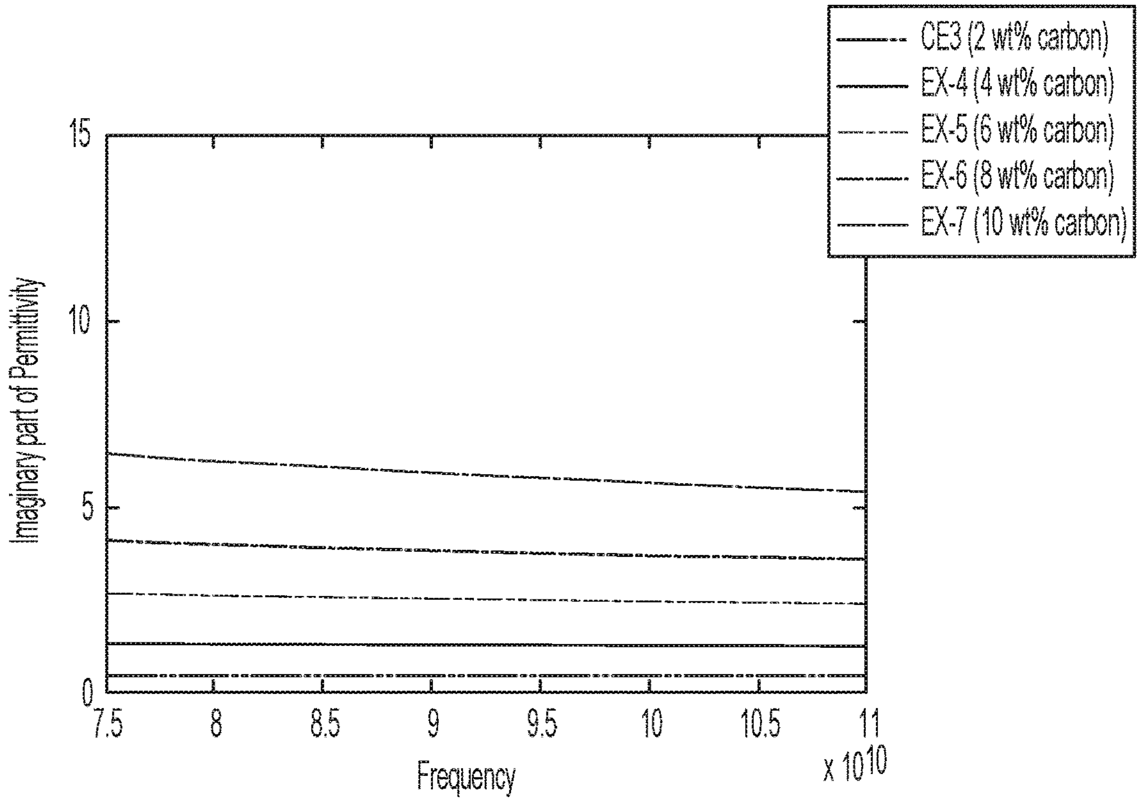
FIG. 24B is a graphical representation of the imaginary part of permittivity for samples EX-4, EX-5, EX-6, EX-7, and CE-3 observed in the W-band.
Figure 25A:
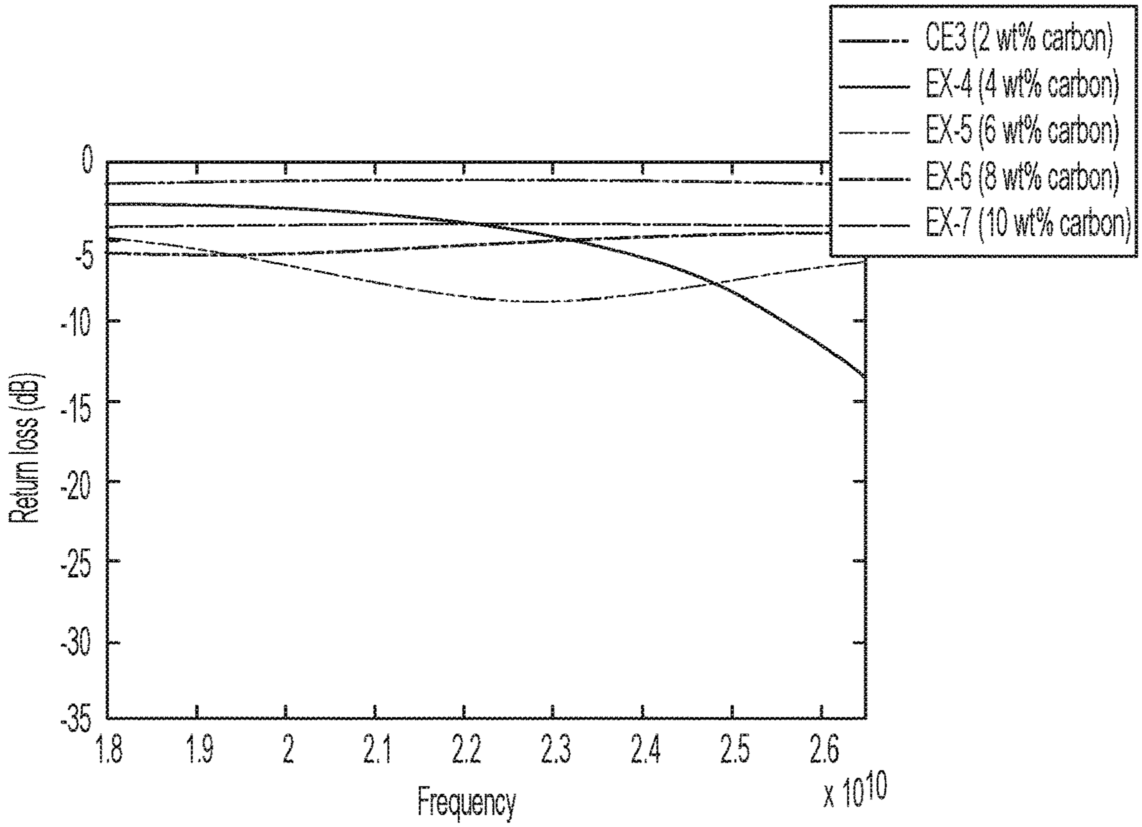
FIG. 25A is a graphical representation of the reflection loss measured in metal-backed reflection mode for samples EX-4, EX-5, EX-6, EX-7, CE-3, observed in the K-band.
Figure 25B:
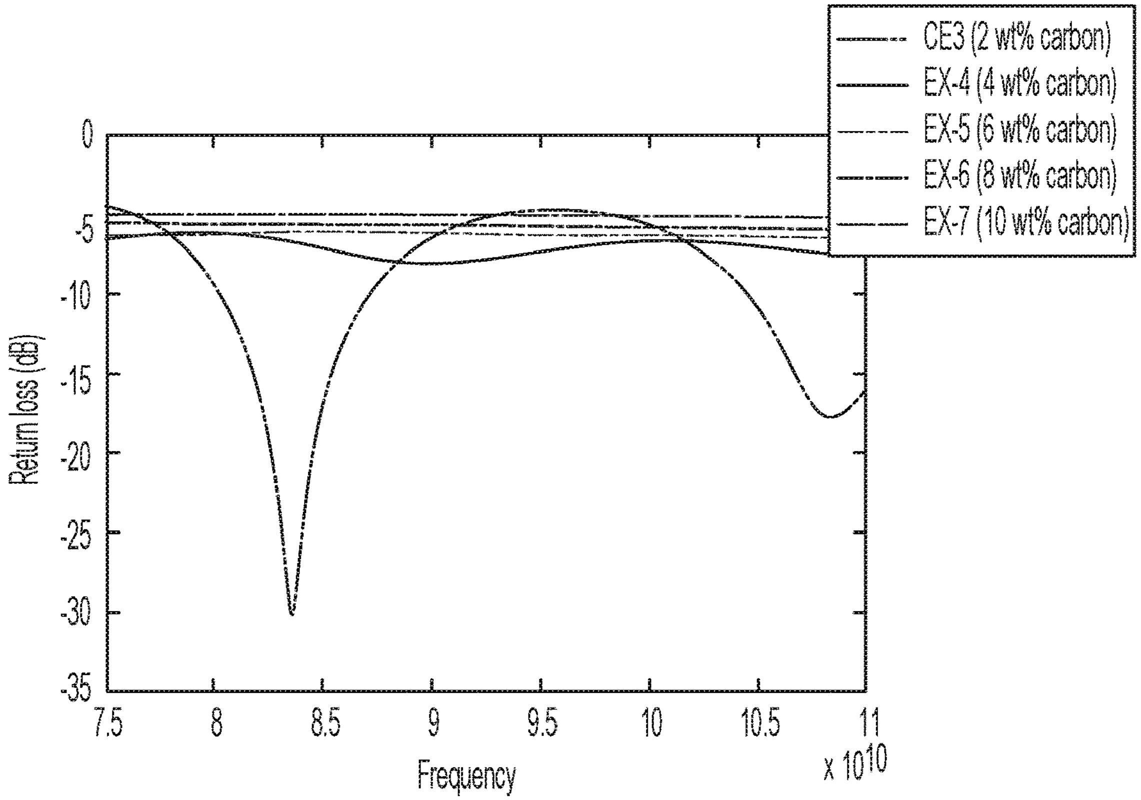
FIG. 25B is a graphical representation of the reflection loss measured in metal-backed reflection mode for samples EX-4, EX-5, EX-6, EX-7, and CE-3 observed in the W-band.

FIGS. 23A and 23B provide a graphical representation of the real part ε' of the complex permittivity of compositions EX-4 through EX-7 and CE3 when observed at moderate frequencies (K-band: 18-26.5 GHz) and high frequencies (W-band: 75-110 GHz). FIGS. 24A and 24B provide a graphical representation of the imaginary part ε" of the complex permittivity of compositions EX-4 through EX-7 and CE3 when observed at moderate frequencies (K-band: 18-26.5 GHz) and high frequencies (W-band: 75-110 GHz). FIGS. 25A and 25B provide a graphical representation of the Return Loss in metal-backed reflection mode of compositions EX-4 through EX-7 and CE3 when observed at moderate frequencies (K-band: 18-26.5 GHz) and high frequencies (W-band: 75-110 GHz).

Figure 26A:
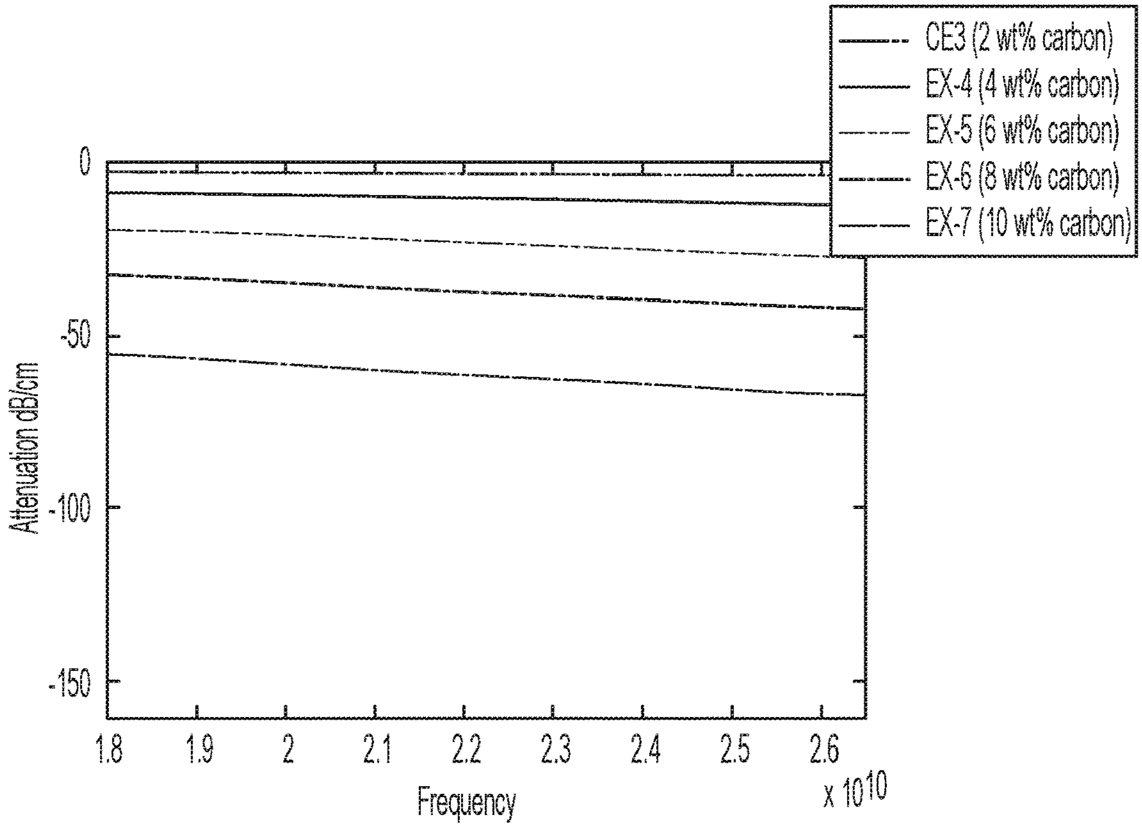
FIG. 26A is a graphical representation of the attenuation constant values for samples EX-4, EX-5, EX-6, EX-7, and CE-3 observed in the K-band.
Figure 26B:
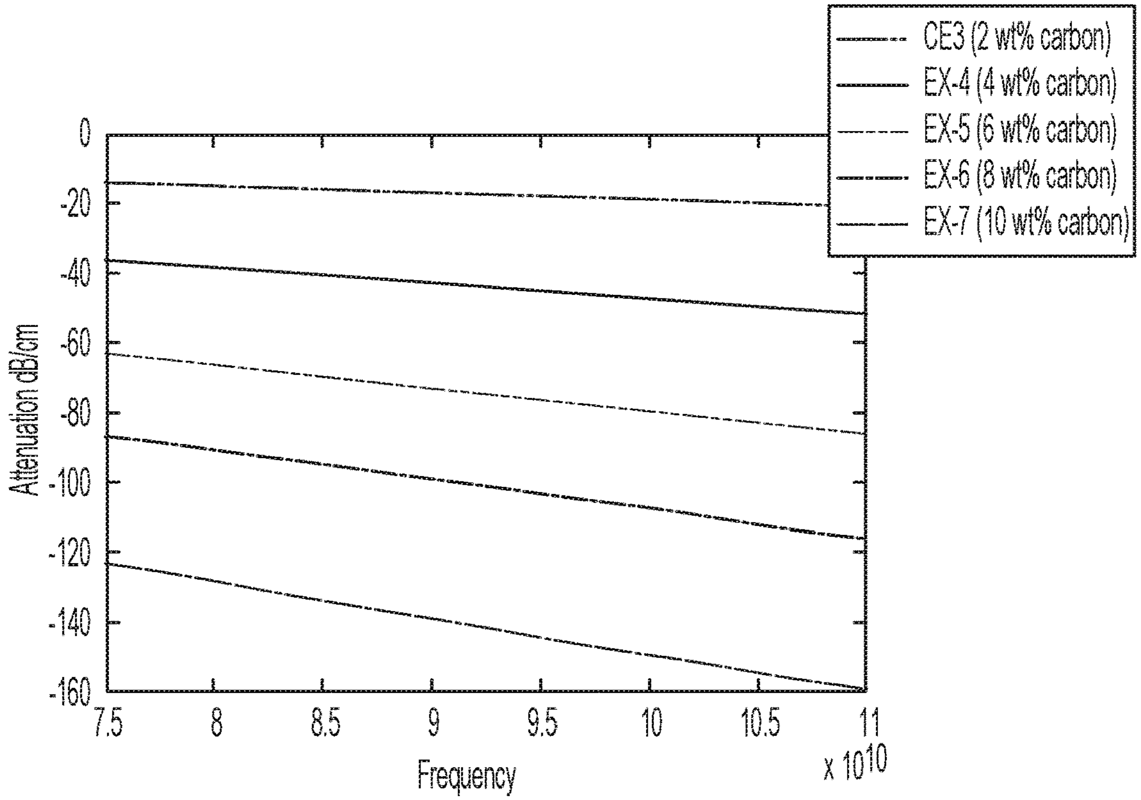
FIG. 26B is a graphical representation of the attenuation constant values for samples EX-4, EX-5, EX-6, EX-7, and CE-3 observed in the W-band.
Figure 27A:
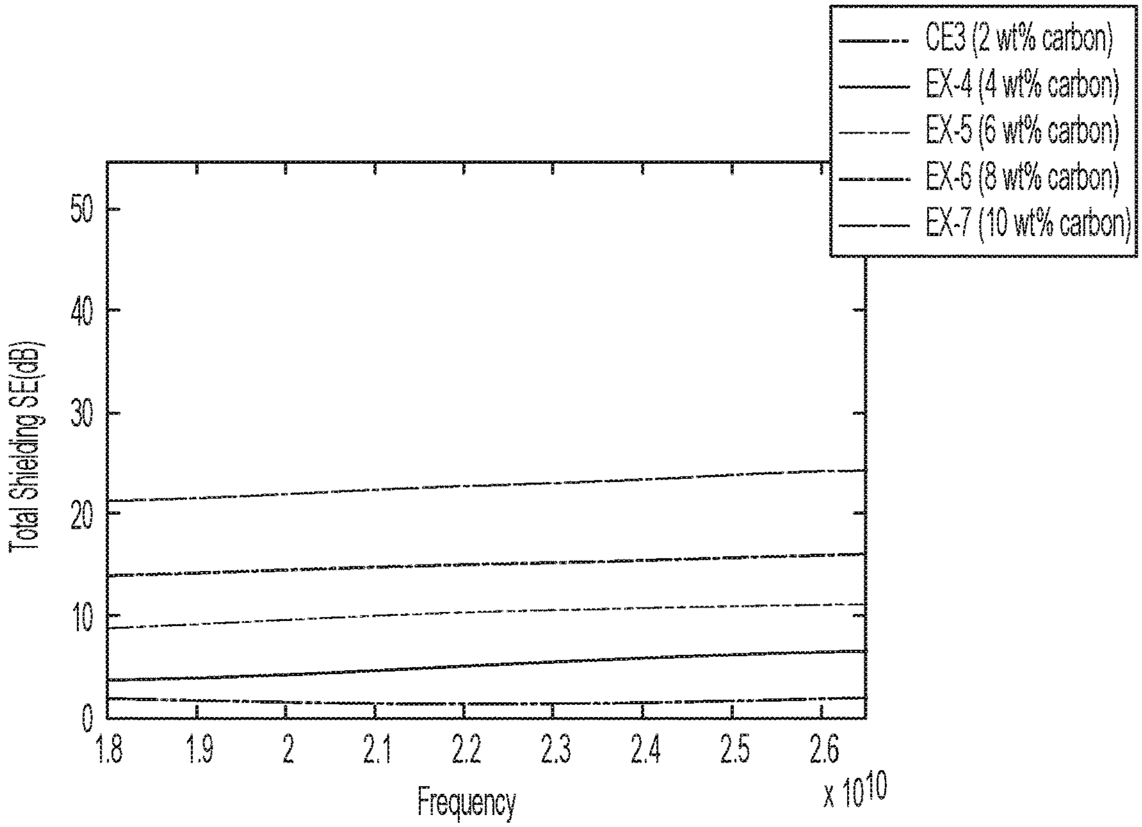
FIG. 27A is a graphical representation of the total shielding effectiveness for samples EX-4, EX-5, EX-6, EX-7, and CE-3 observed in the K-band.
Figure 27B:
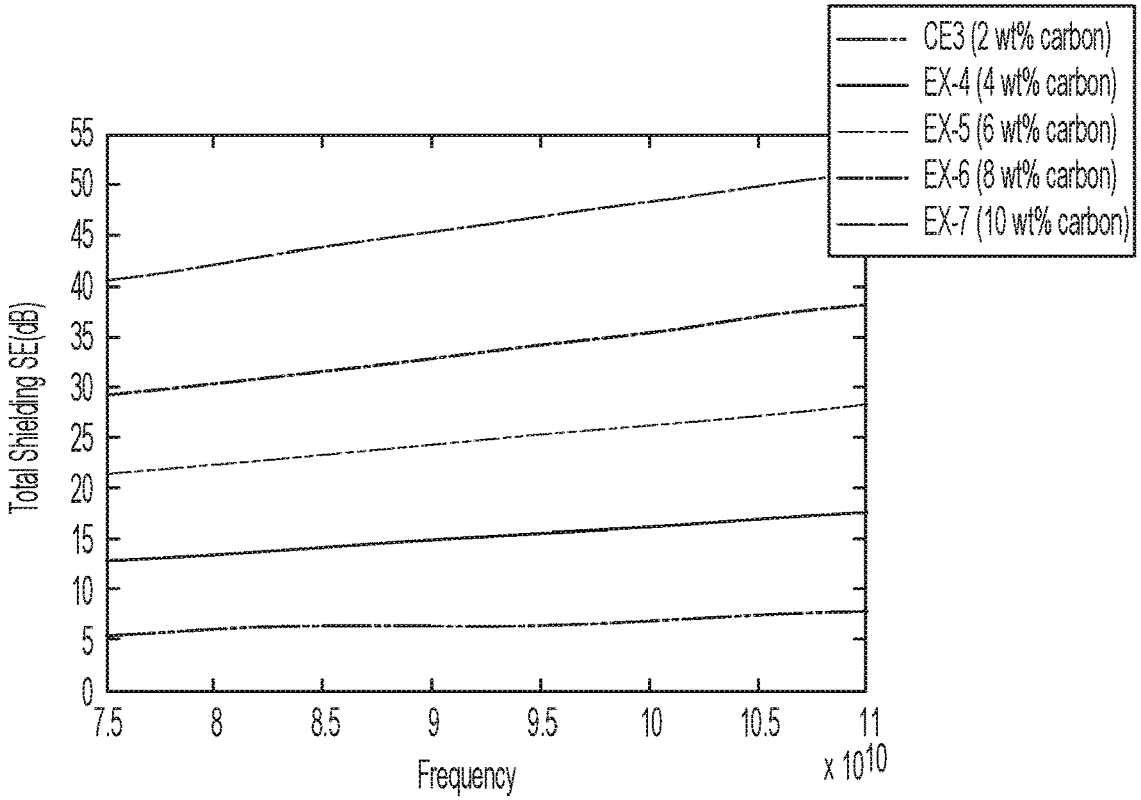
FIG. 27B is a graphical representation of the total shielding effectiveness for samples EX-4, EX-5, EX-6, EX-7, and CE-3 observed in the W-band.
Figure 28A:
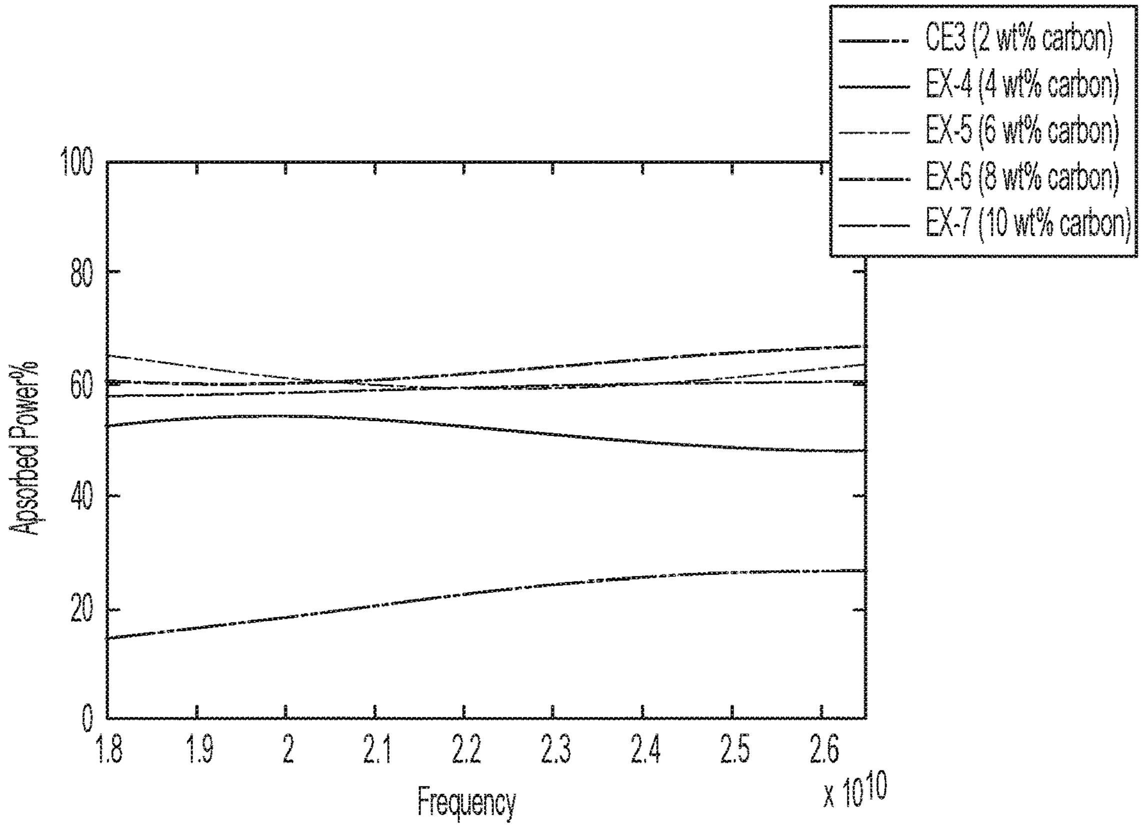
FIG. 28A is a graphical representation of the percent absorbed power in transmission mode for samples EX-4, EX-5, EX-6, EX-7, and CE-3 observed in the K-band.
Figure 28B:
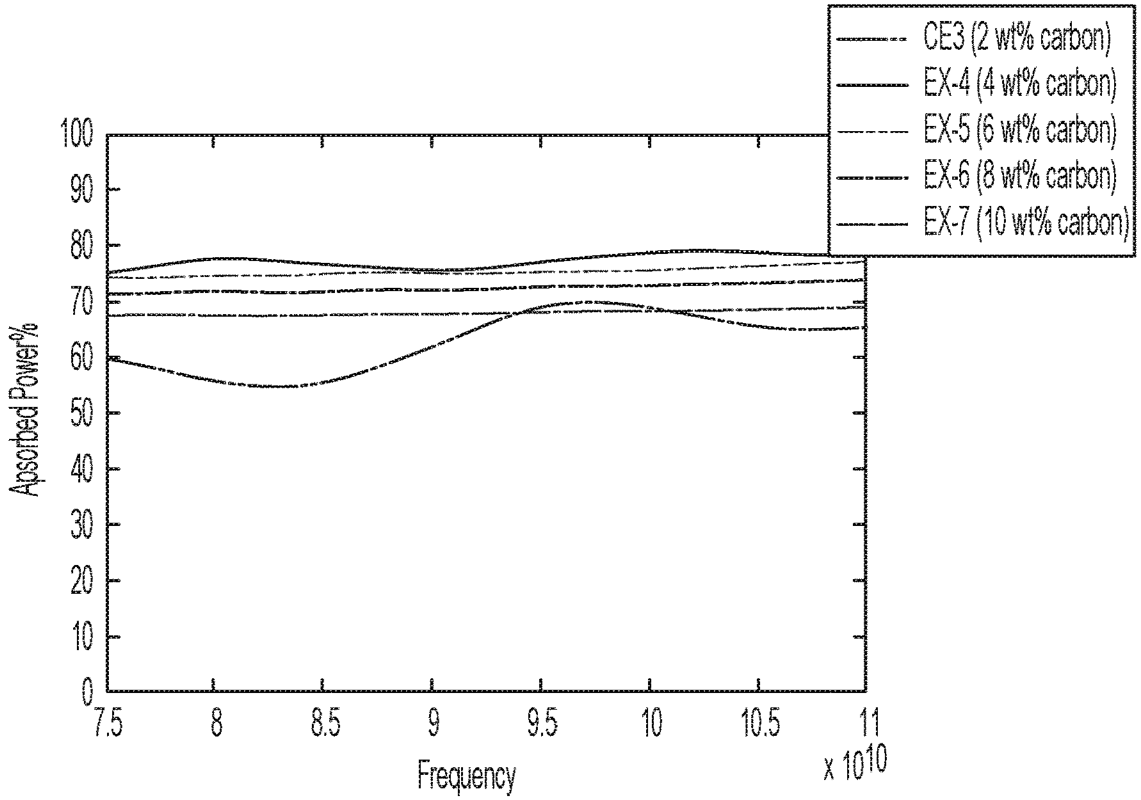
FIG. 28B is a graphical representation of the percent absorbed power in transmission mode for samples EX-4, EX-5, EX-6, EX-7, and CE-3 observed in the W-band.
Figure 29A:
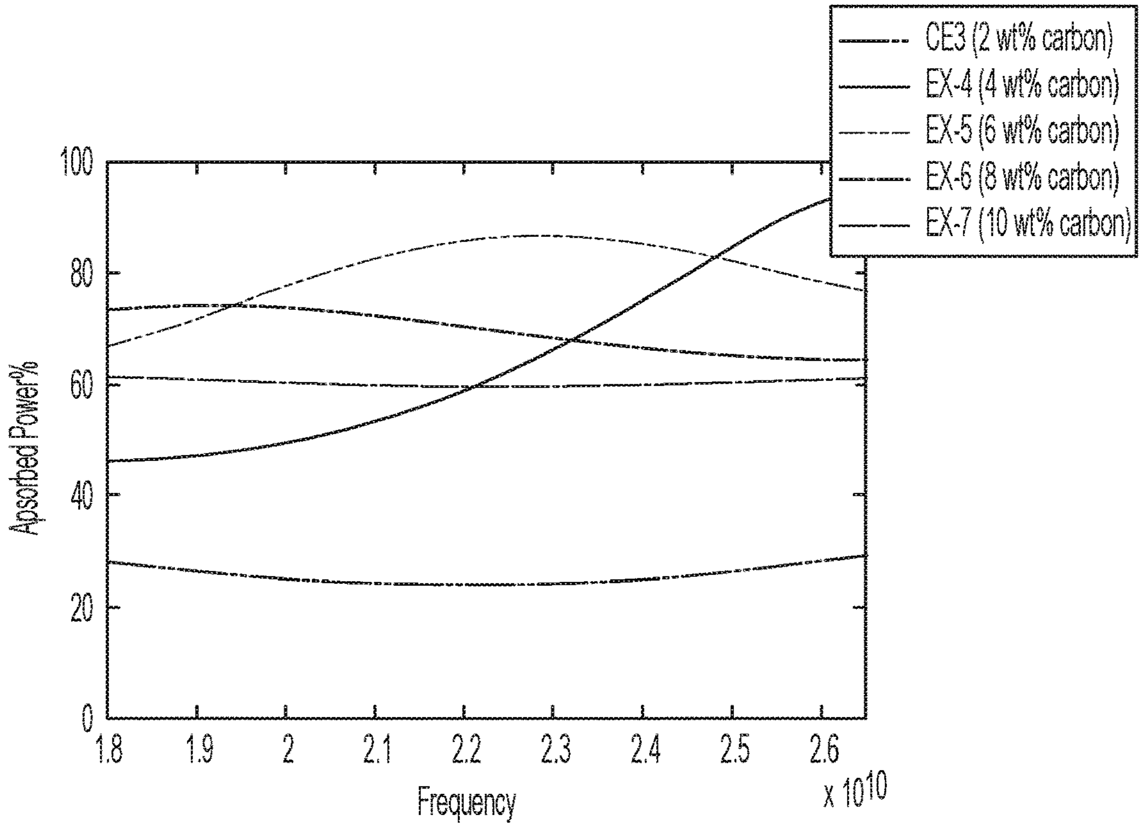
FIG. 29A is a graphical representation of the percent absorbed power in metal-backed reflection mode for samples EX-4, EX-5, EX-6, EX-7, and CE-3 observed in the K-band.
Figure 29B:
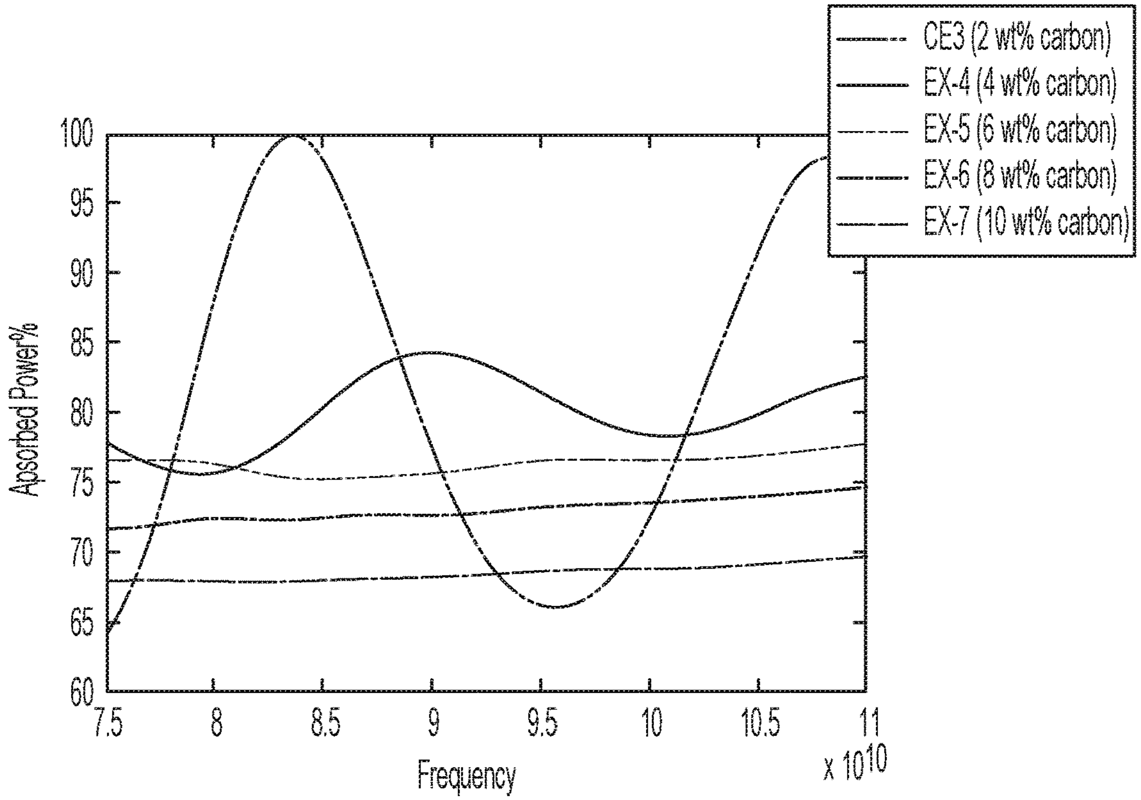
FIG. 29B is a graphical representation of the percent absorbed power in metal-backed reflection mode for samples EX-4, EX-5, EX-6, EX-7, and CE-3 observed in the W-band.

FIGS. 26A and 26B provide a graphical representation of the Attenuation Constant in decibels per centimeter of compositions EX-4 through EX-7 and CE3 when observed at moderate frequencies (K-band: 18-26.5 GHz) and high frequencies (W-band: 75-110 GHz). These results showed that with increasing carbon black content, the attenuation properties of the composite samples increased for the two bands investigated. As carbon increased, attenuation increased becoming more negative. FIGS. 27A and 27B provides the total Shielding Effectiveness as decibels of compositions EX-4 through EX-7 and CE3 when observed at moderate frequencies (K-band: 18-26.5 GHz) and high frequencies (W-band: 75-110 GHz). Again, as the carbon black content increased, the shielding effectiveness of the composite also increased. The Shielding Effectiveness describes the combined effect of absorption and reflection of the material. FIGS. 28A and 28B present the percentage of power absorbed in transmission mode of compositions EX-4 through EX-7 and CE3 when observed at moderate frequencies (K-band: 18-26.5 GHz) and high frequencies (W-band: 75-110 GHz) determined according to the Free Space Method. As it was discussed earlier, when the amount of carbon black increased, the microwave energy absorbed by the material as measured in transmission mode also increased, at least up to a certain level, and then decreased as the amount of carbon was further increased. This result was observed for most of the frequencies investigated, and especially for the measurements made in the W-band. FIGS. 29A and 29B provide these microwave absorption results when samples were measured in metal-backed reflection mode for the K- and W-band frequencies. These results showed that in metal-backed reflection mode, as more of the incoming energy is re-absorbed into the sample after being reflected off the metal plate, higher levels of absorption can be achieved (higher than 80% at some frequencies), compared with the case of samples measured in transmission mode when there is no metal plate that can block the transmitted radiation.

Figure 30:
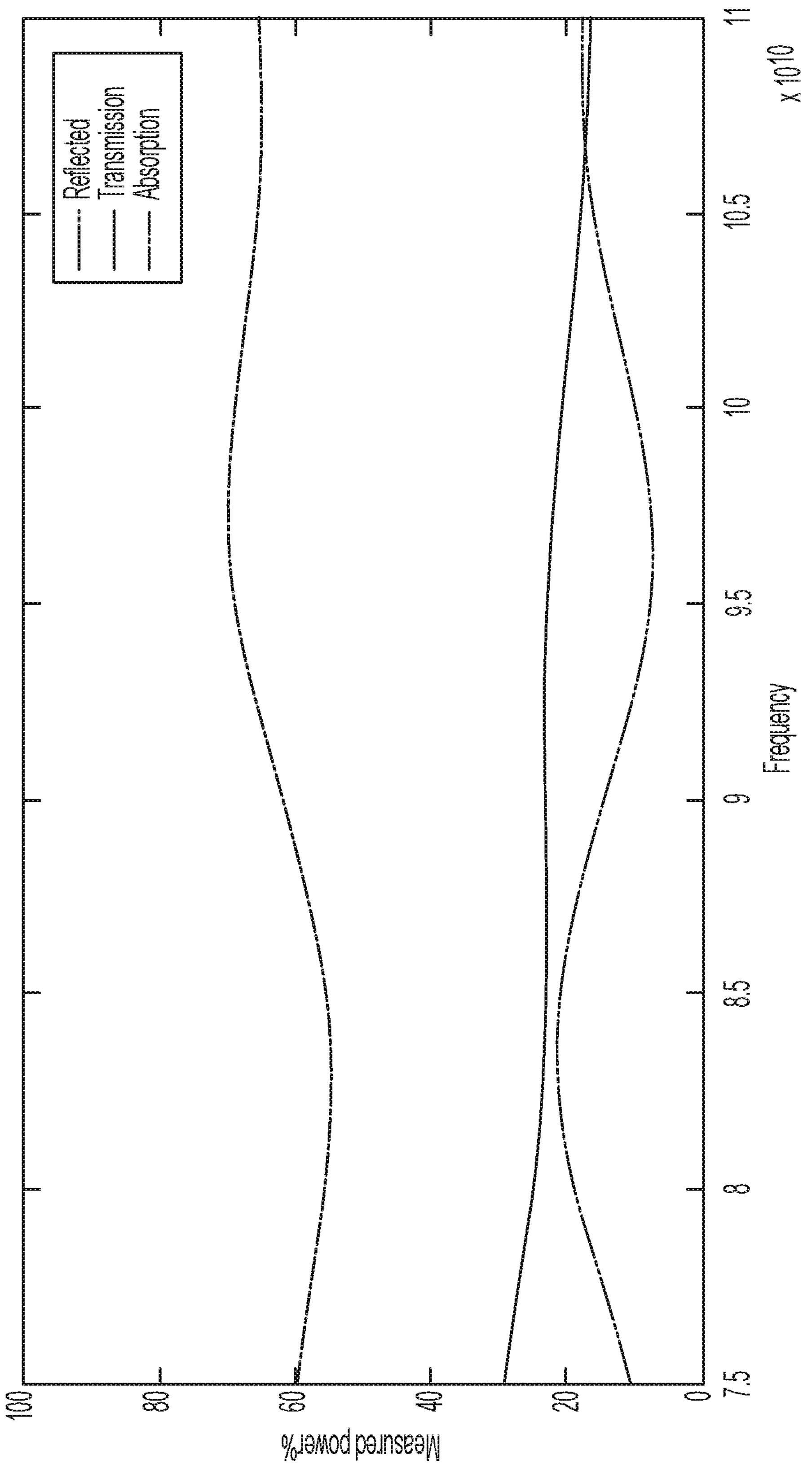
FIG. 30 shows a graphical representation of the measured Percent Power in Transmission mode for sample CE-3 at frequencies 75 GHz to 110 GHz.
Figure 31:
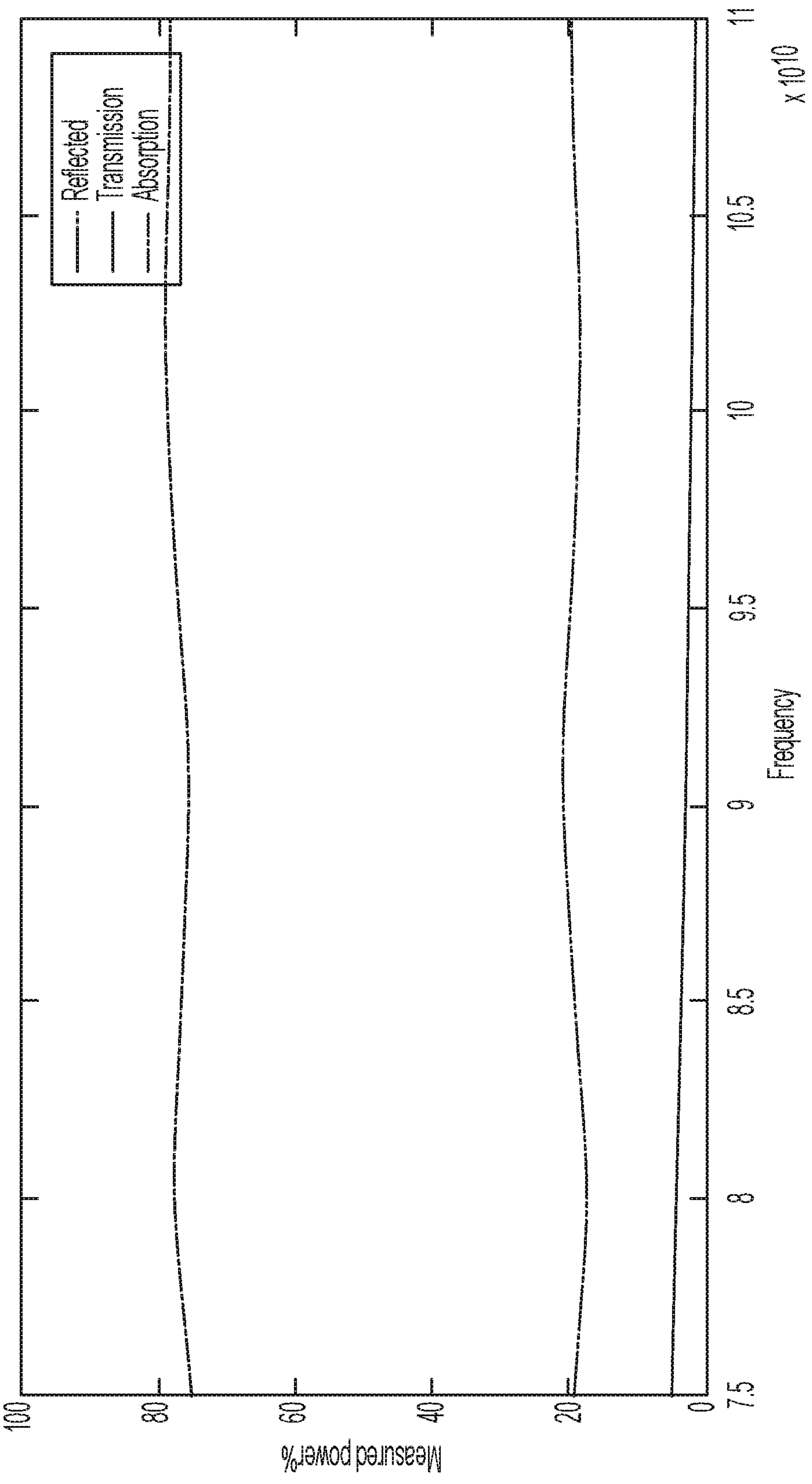
FIG. 31 shows a graphical representation of the measured Percent Power in Transmission mode for sample EX-4 at frequencies 75 GHz to 110 GHz.
Figure 32:
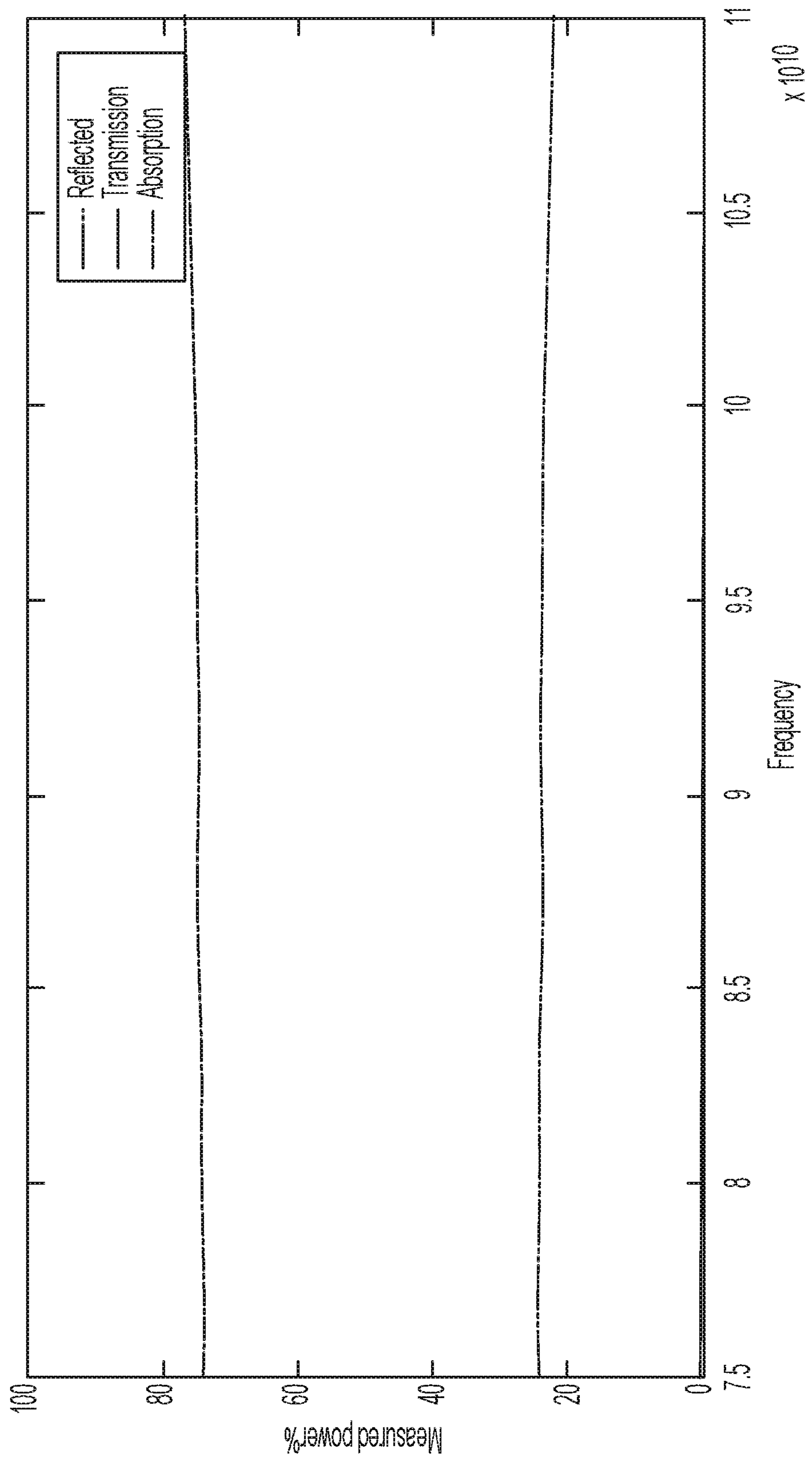
FIG. 32 shows a graphical representation of the measured Percent Power in Transmission mode for sample EX-5 at frequencies 75 GHz to 110 GHz.
Figure 33:
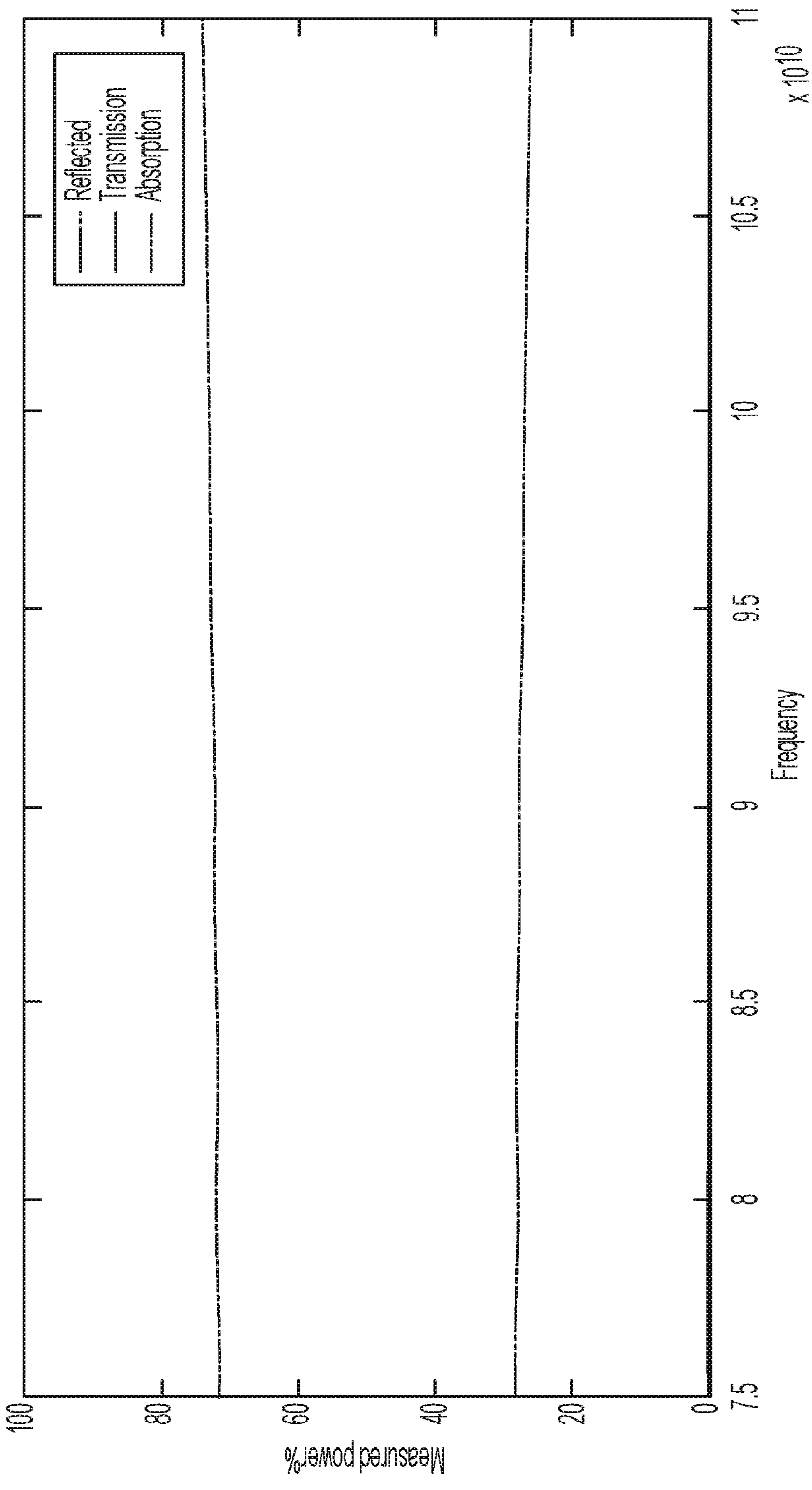
FIG. 33 shows a graphical representation of the measured Percent Power in Transmission mode for sample EX-6 at frequencies 75 GHz to 110 GHz.
Figure 34:
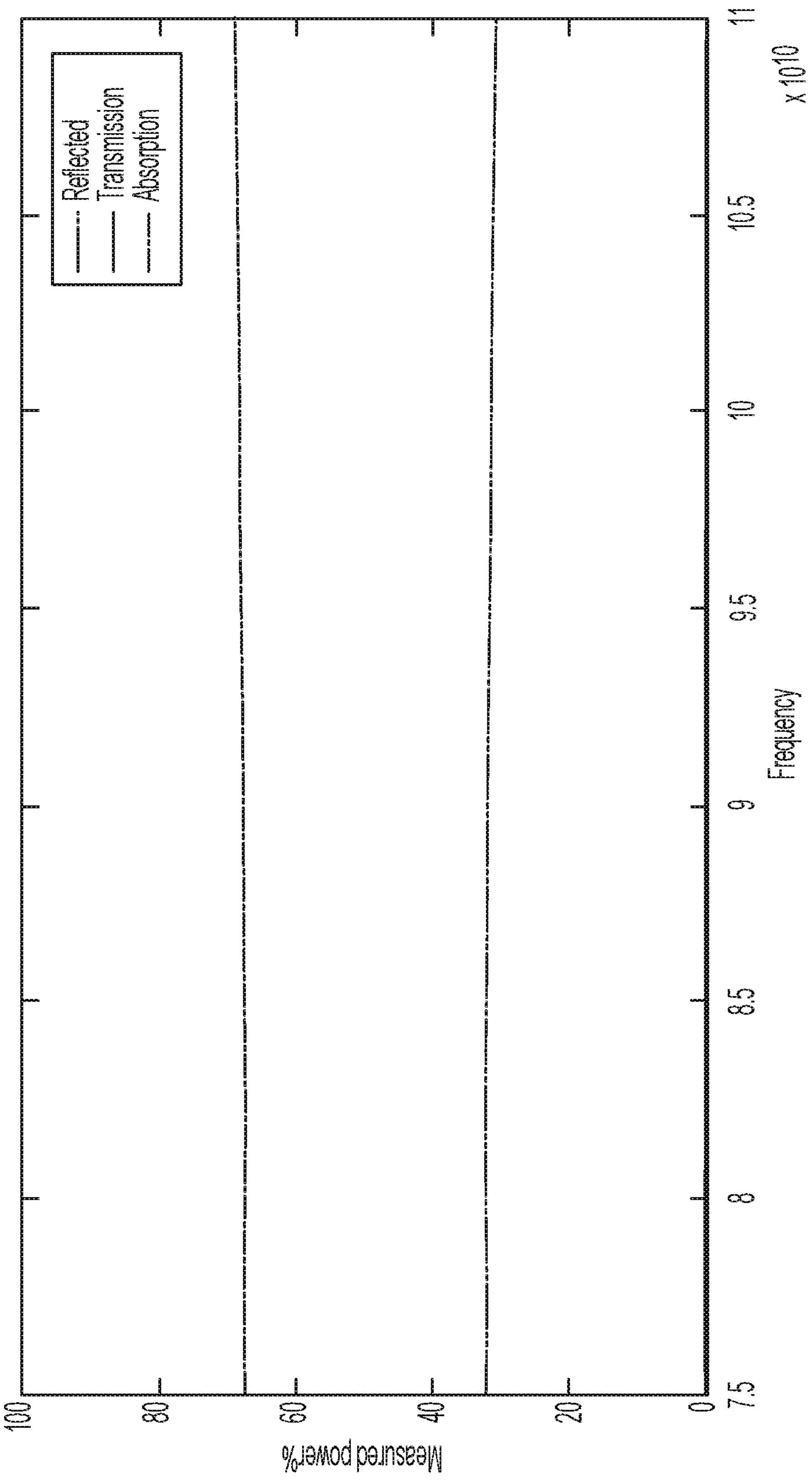
FIG. 34 shows a graphical representation of the measured Percent Power in Transmission mode for sample EX-7 at frequencies 75 GHz to 110 GHz.
Figure 35:
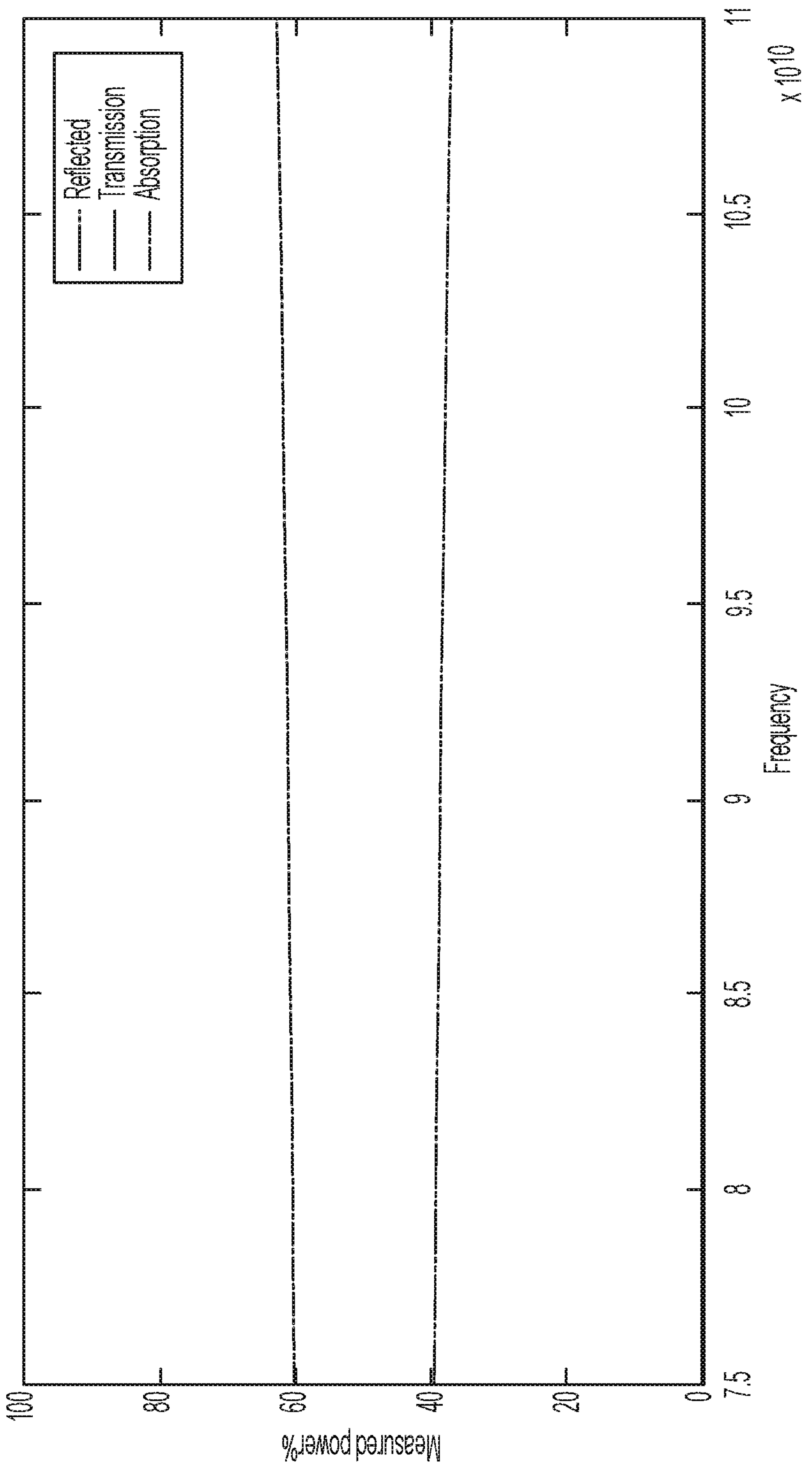
FIG. 35 shows a graphical representation of the measured Percent Power in Transmission mode for sample EX-2 at frequencies 75 GHz to 110 GHz.

FIG. 30 is a graphical representation of the reflected, transmitted, and absorbed percent power in transmission mode for CE3 at frequencies between 75 and 110 GHz; FIG. 31, for EX-4; FIG. 32, for EX-5; FIG. 33 for EX-6; FIG. 34, for EX-7; FIG. 35, for EX-2. These results showed that, as the carbon black level increases, the materials become more reflecting and less transmitting when observed in the W-band for frequencies between 75 and 110 GHz.

Example IV. PBT Composites with Carbon Black and Glass Fiber

Figure 36:
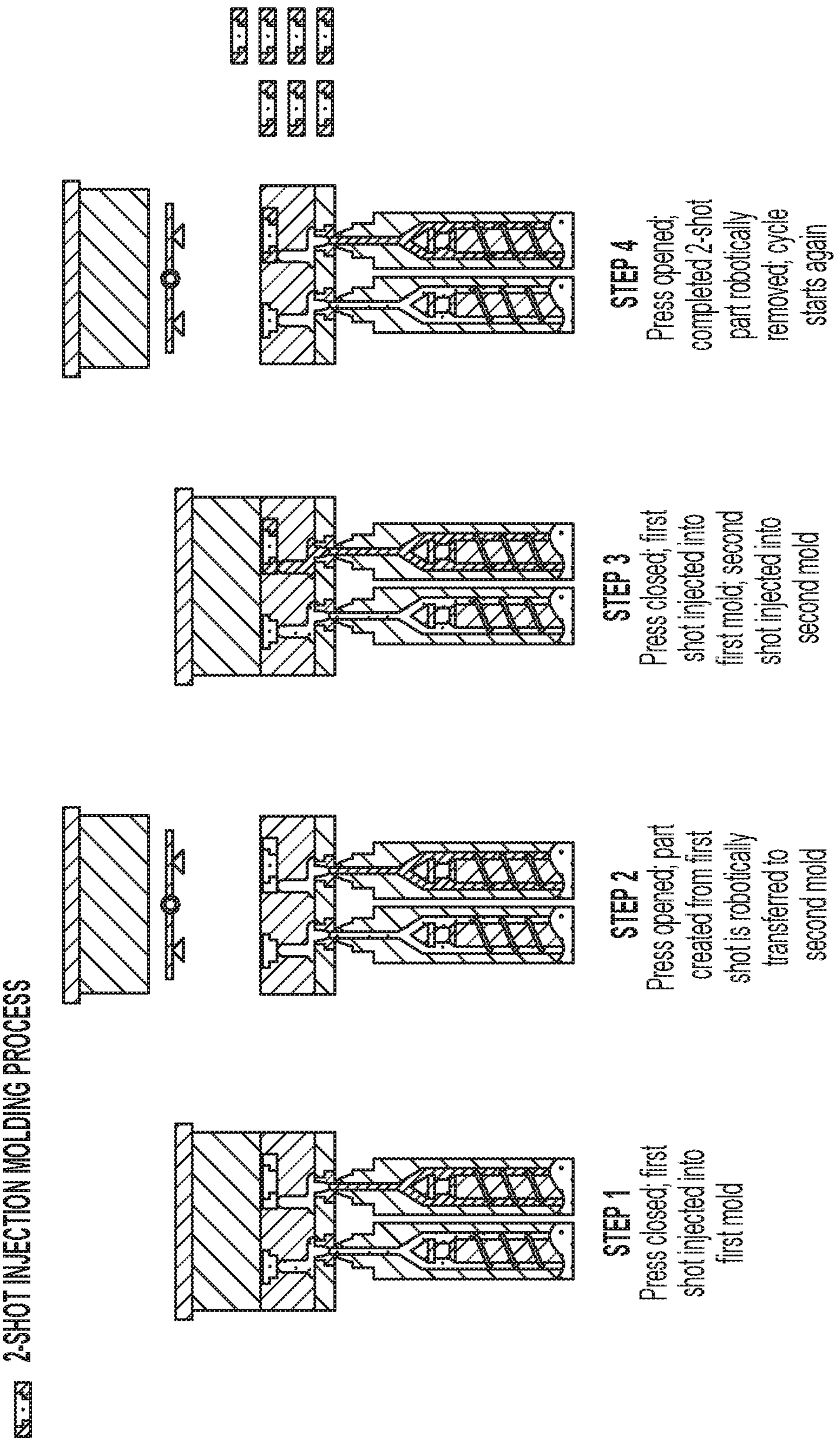
FIG. 36 shows a diagram of a two-shot injection molding process.
Figure 37:
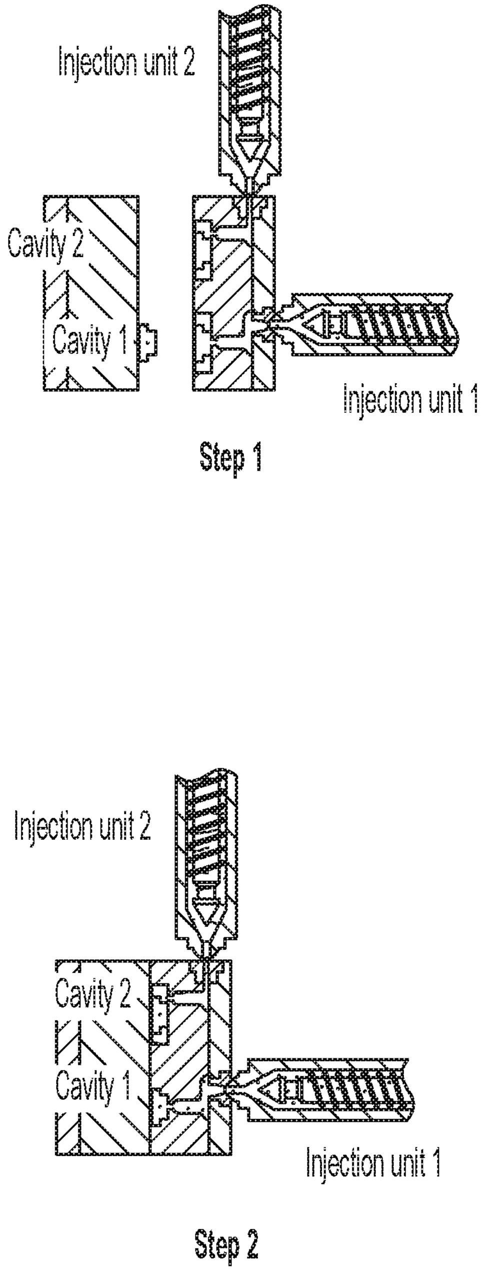
FIG. 37 shows a diagram of the two injection units of a two-shot injection molding process.

Glass fiber containing samples were prepared using a two-shot injection molding process. The two-shot injection molding is a process that combines two materials into one molded part. The first material is injected into a mold and a second material is injected over it, resulting in a multi-material molded part in just one molding cycle. In one common design, a core plate is mounted to a platen or turntable. The first-shot mold closes onto the core and plastic is injected, creating a substrate part. FIGS. 36 and 37 provide examples of the two-shot process from "Two-shot Molding Design Guide," by the Gemini Group (https://geminigroup.net/plastics/two-shot-and-injection-molding-tpi/processes/two-shot-multi-shot/). In FIG. 37, injection point 1 injects material 1 into cavity 1; Injection point 2 injects material 2 into cavity 2. The molded part is then ready for demolding.

It is noted that while using the two-shot (single-step) injection molding process, it was difficult to achieve a clean break at the gate with all of the prepared materials, specifically CE-4 (01152020-1) described below. Samples EX-8 (#2, 01152020-2) and EX-9 (#3, 01152020-3) broke off clean on virtually every shot and very little effort was required to get those materials to run easily.

Formulations are presented in Table 10 (FIG. 38). Formulation 01152020-2 (EX-8), for example, contains 40.93 wt % of VALOX 195, 29.07 wt % of VALOX 315, 10 wt % of Ensaco 360G carbon powder and 20 wt % of JM 718 glass fibers. Formulation 01152020-1 (CE-4) contains the same loadings of VALOX 195 (40.93 wt %) and of VALOX 315 (29.07 wt %), but 4 wt % of Ensaco 360G carbon powder and 26 wt % of JM 718 glass fibers. Lastly, formulation 01152020-3 (EX-9) contains 38.88 wt % of VALOX 195, 27.62 wt % of VALOX 315, 13.5 wt % of Ensaco 360G carbon powder and 20 wt % of JM 718 glass fibers. As it can be calculated from these compositions, the ratio of VALOX 195/VALOX 315 was kept constant and equal to 1.408 in the three formulations. It is desired that the dielectric performance of the resin containing a mixture of two PBTs, 10 wt % of a conductive carbon black and 20% of glass fibers is similar to that of a resin control containing the two same PBTs, 10 wt % of a conductive carbon black and no glass fibers. Tables 11, 12, and 13 (FIG. 39) show the steady-state shear viscosities of the formulations at shear rates representative of injection molding processes. Tables 14 and 15 (FIG. 40) provide the mechanical properties and volume and surface electrical resistivities of CE-4, EX-8, and EX-9.

Additional comparative samples CE-5 and CE-6 that include a mixture of two PBT resins and carbon black at 10 wt. % and 14.5 wt. %, but no glass fiber were prepared. The formulation is presented in Table 16 (FIG. 41A) and the respective properties are shown in Tables 17 and 18 (FIG. 41B). The samples were run on a commercial extruder at manufacturing rates and small samples were collected after 15, 30, 45, and 60 minutes. An amount of 150 kg of each formulation was collected after the process was lined out. A comparison among the samples is shown in Tables 19, 20, and 21 (FIG. 42). As shown in comparing the samples without glass fiber to those with glass fiber, tensile strength increased from 7,502 to 10,847 psi (a 1.45-fold increase); tensile modulus increased from 443,007 to 1,195,628 psi (a 2.7-fold increase); and surface/volume electrical resistivities remained fairly constant.

Figure 43A:
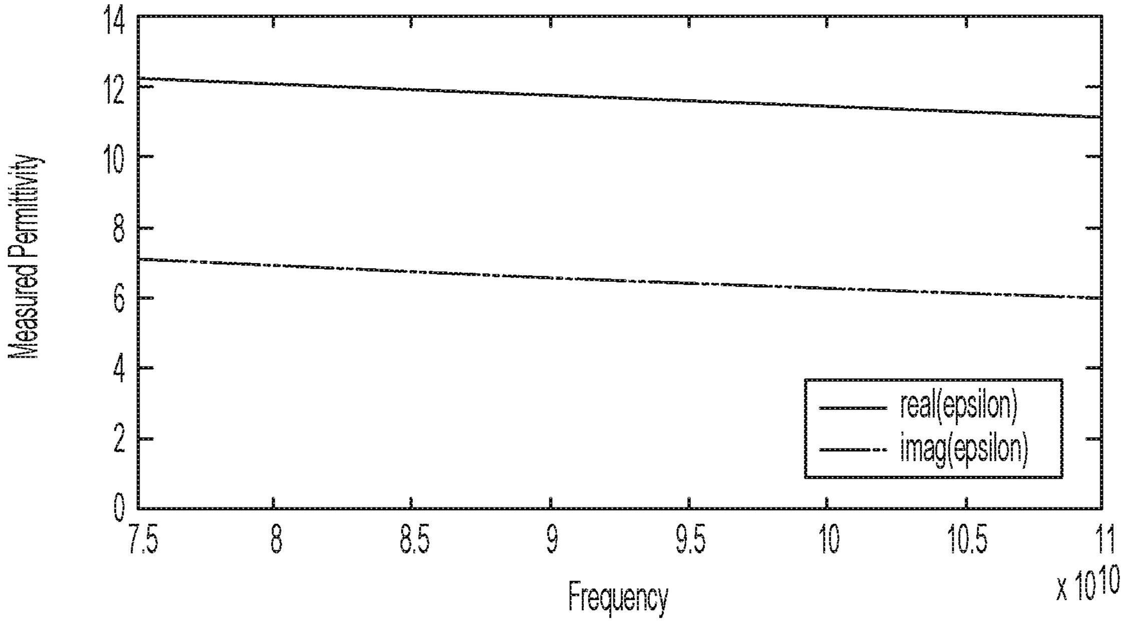
FIGS. 43A and 43B present the dielectric permittivity and loss tangent (respectively) for CE-5.
Figure 43B:
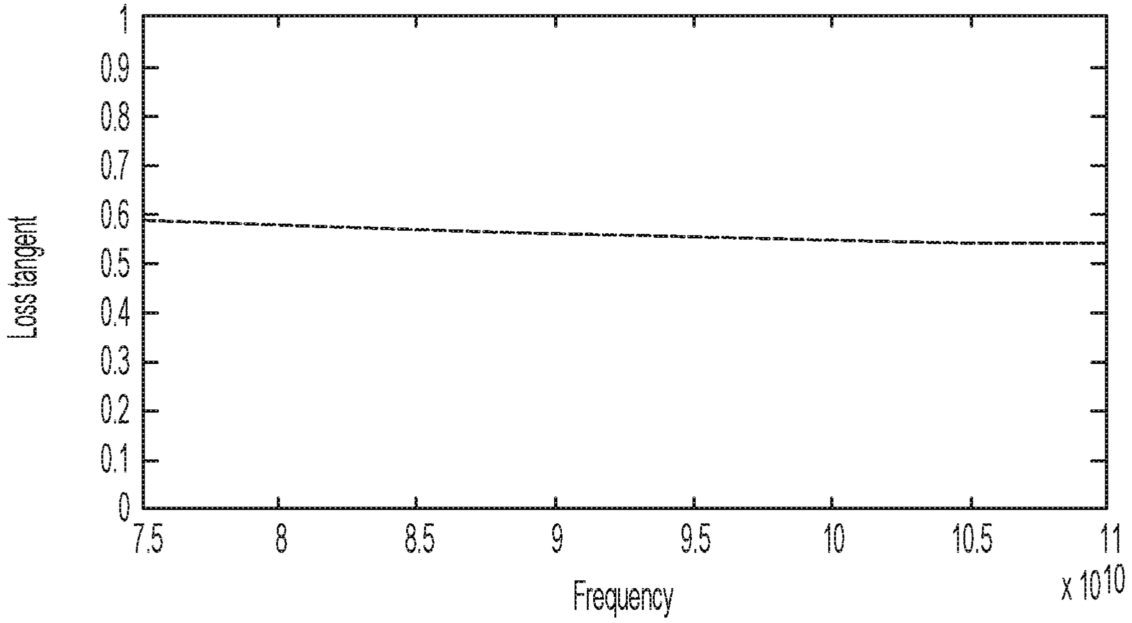
Figure 44A:
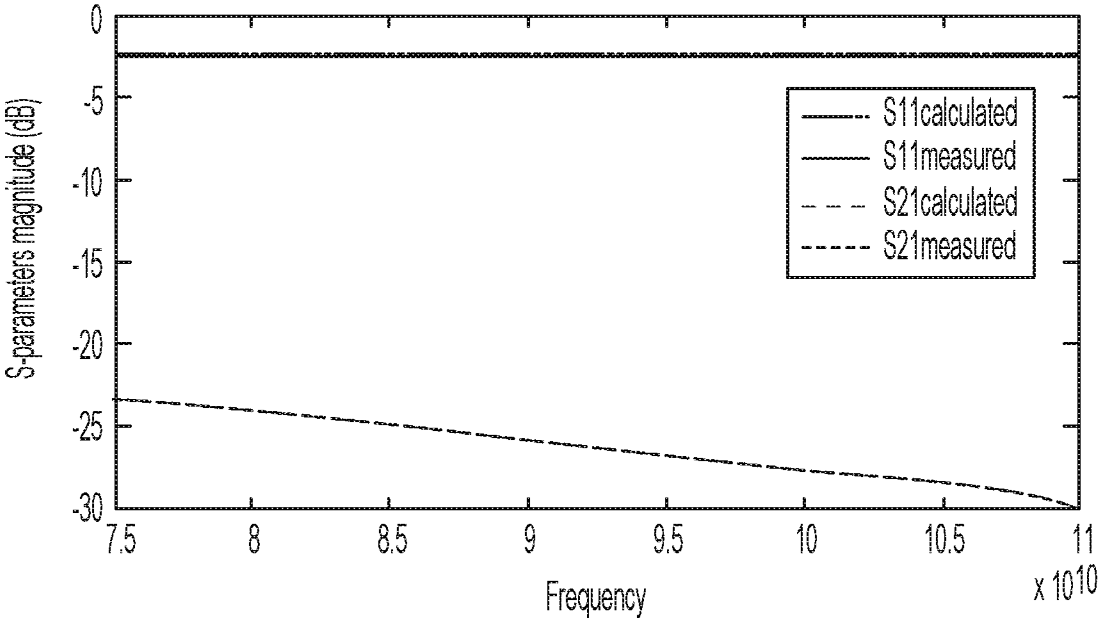
FIGS. 44A and 44B present the S-parameters magnitude (dB) and insertion loss (dB) for CE-5.
Figure 44B:
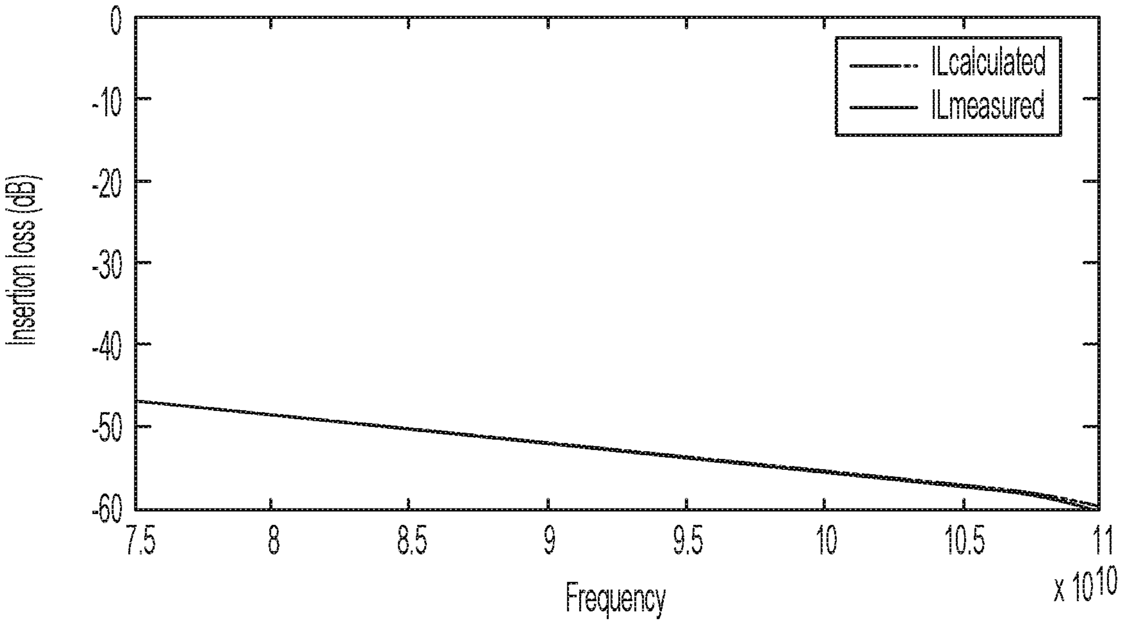
Figure 45A:
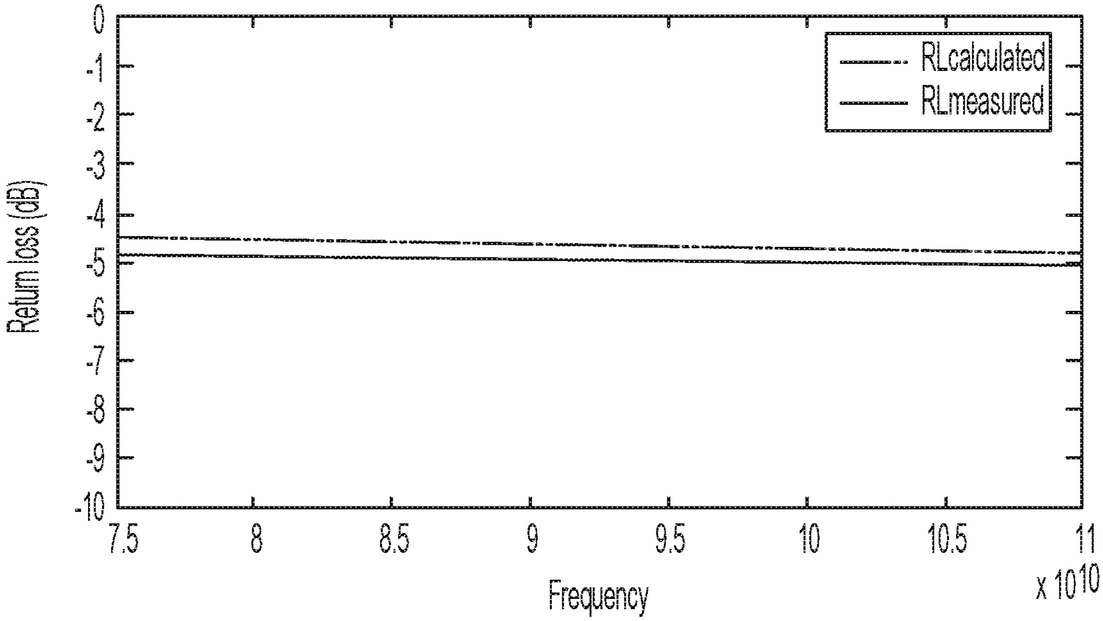
FIGS. 45A and 45B present the return loss (dB) and attenuation constant (dB/cm) for CE-5.
Figure 45B:
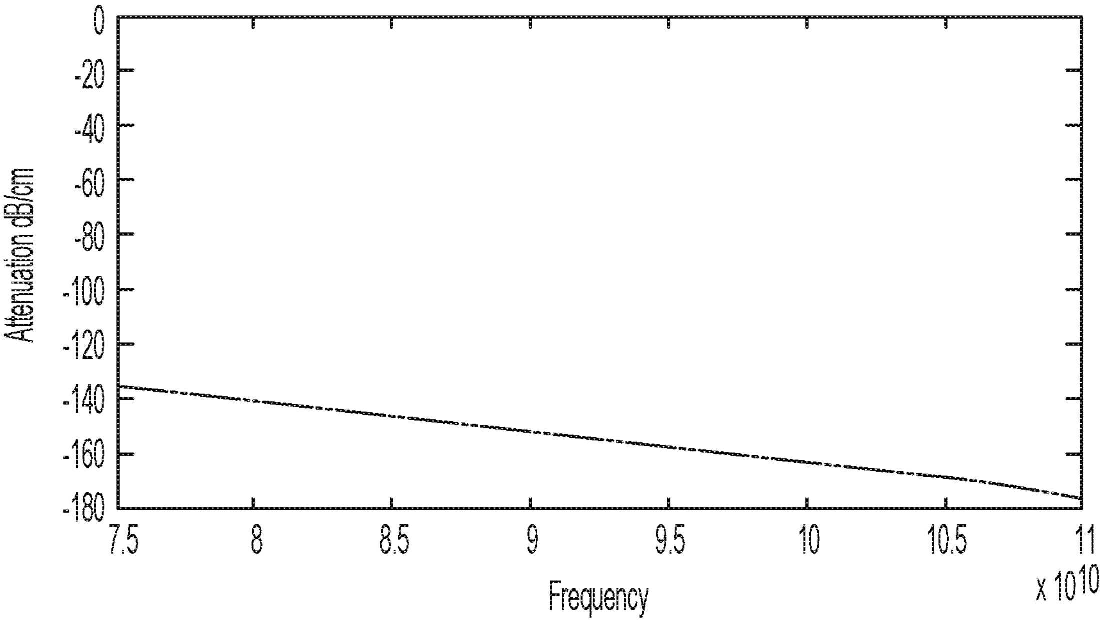
Figure 46A:
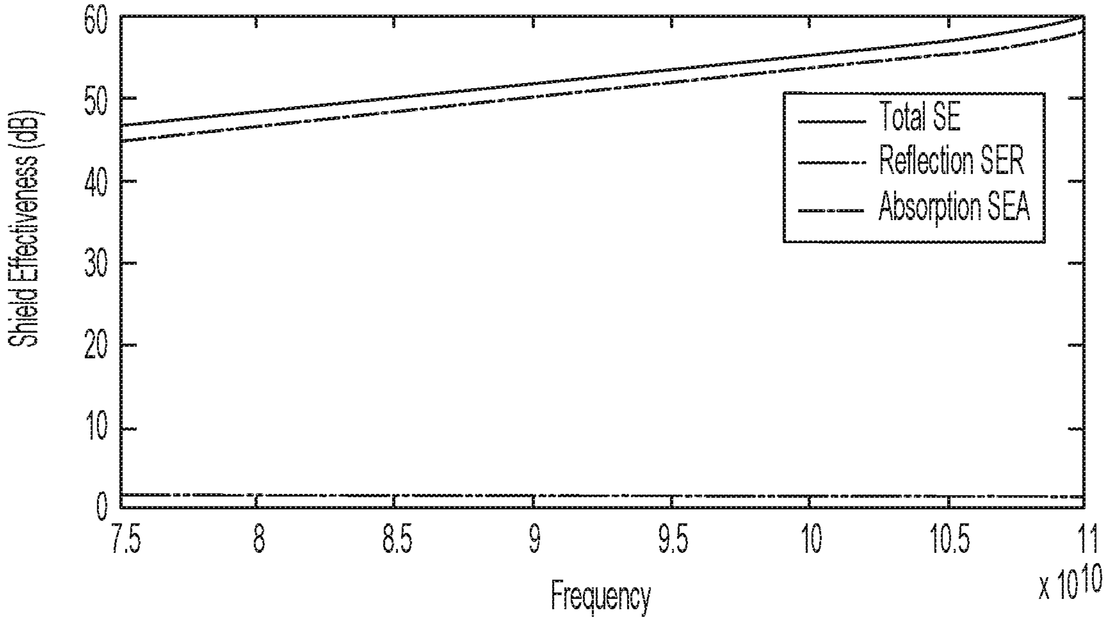
FIGS. 46A and 46B present the shielding effectiveness (dB) and metal-backed reflection loss (dB) for CE-5.
Figure 46B:
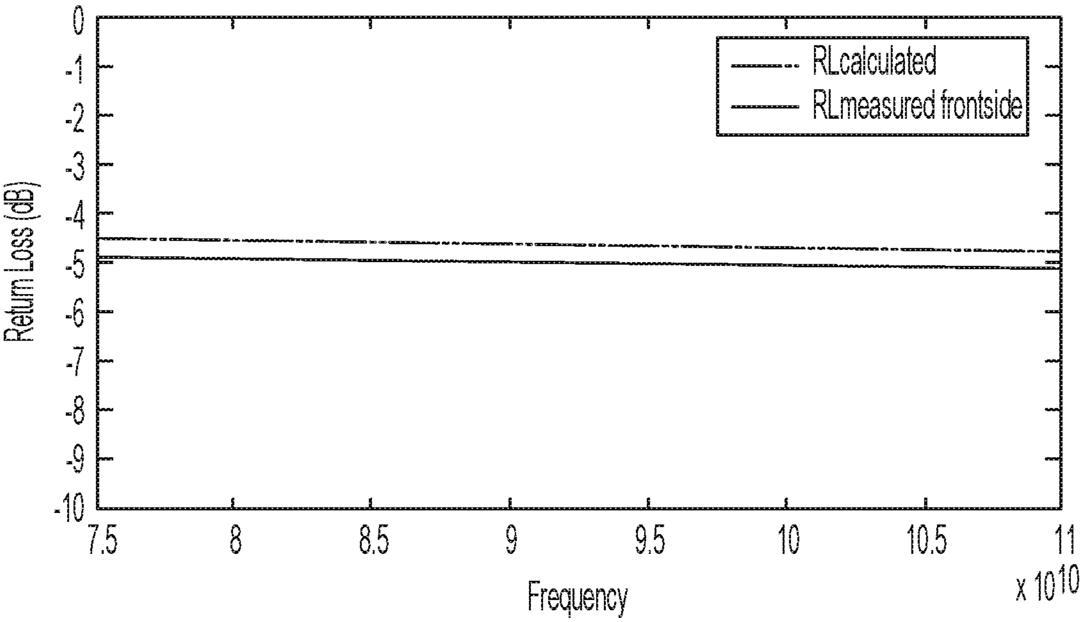
Figure 47A:
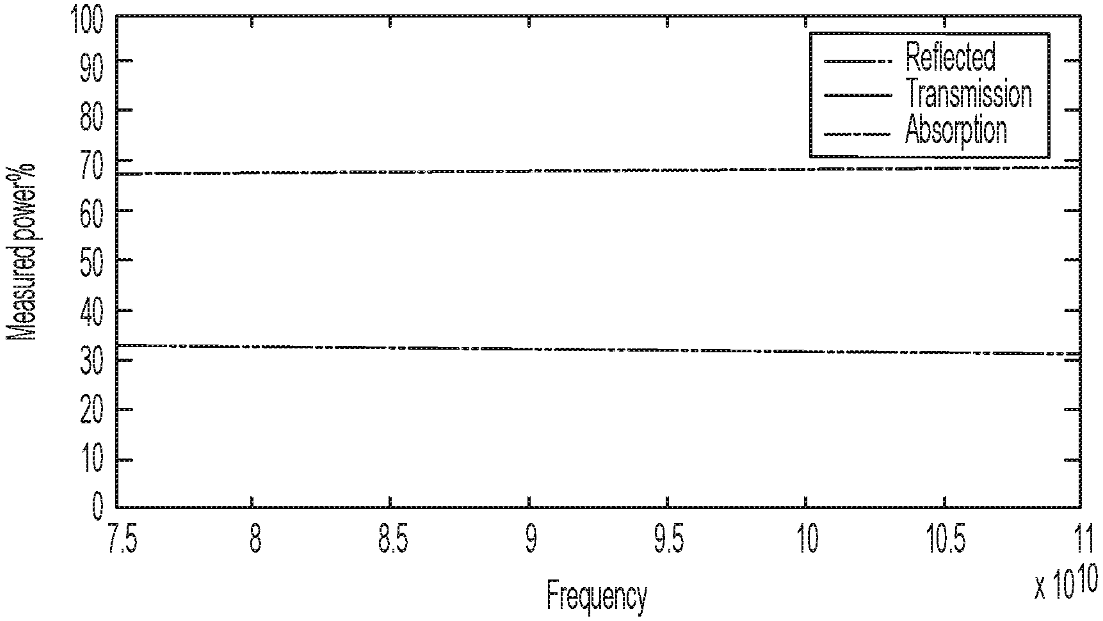
FIGS. 47A and 47B presents the percent power in transmission mode and percent power in metal-backed reflection mode (respectively) for CE-5.
Figure 47B:
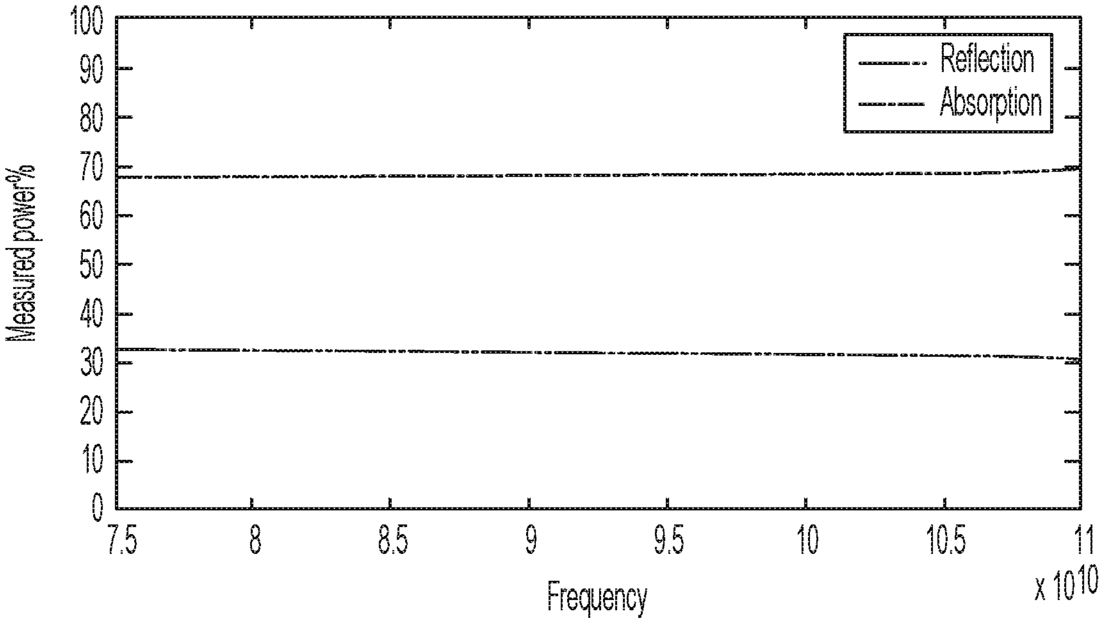
Figure 48A:
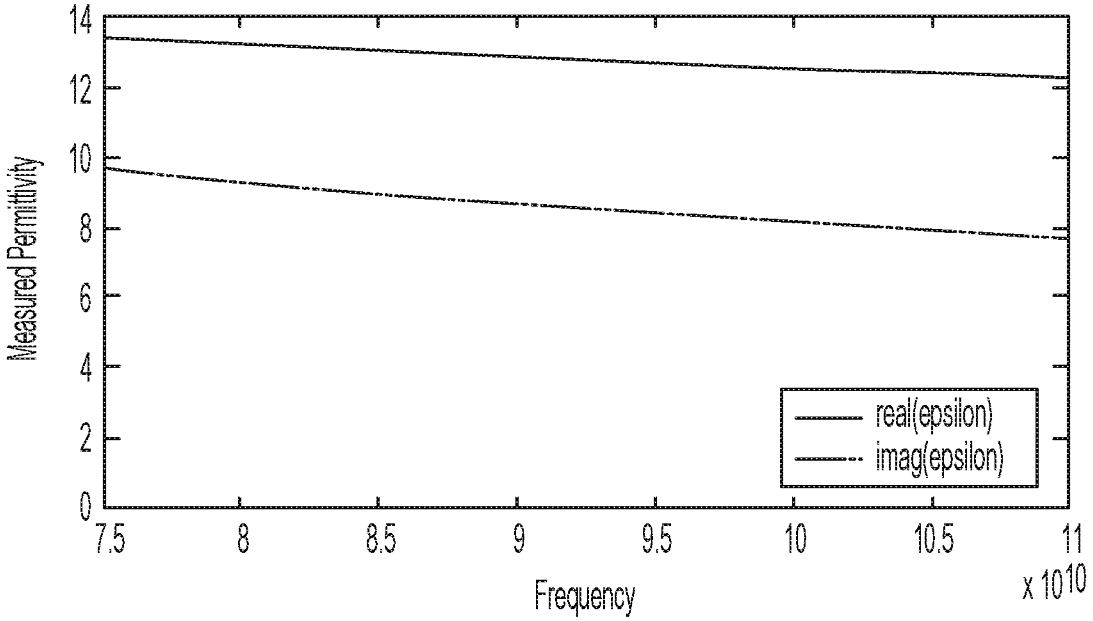
FIGS. 48A and 48B present the dielectric permittivity and loss tangent (respectively) for EX-8.
Figure 48B:
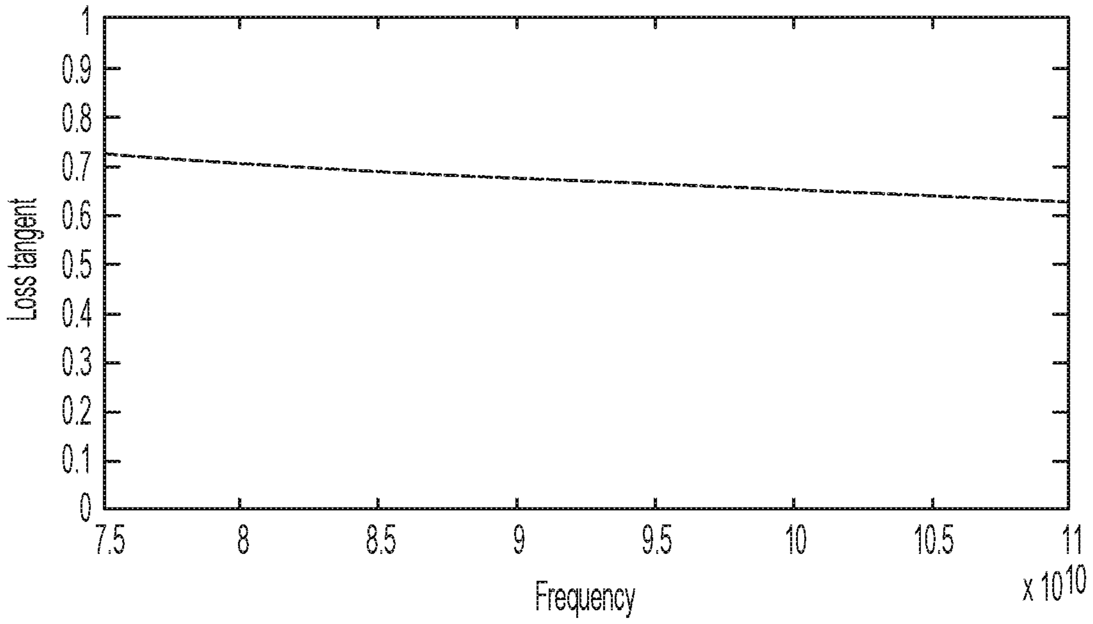
Figure 49A:
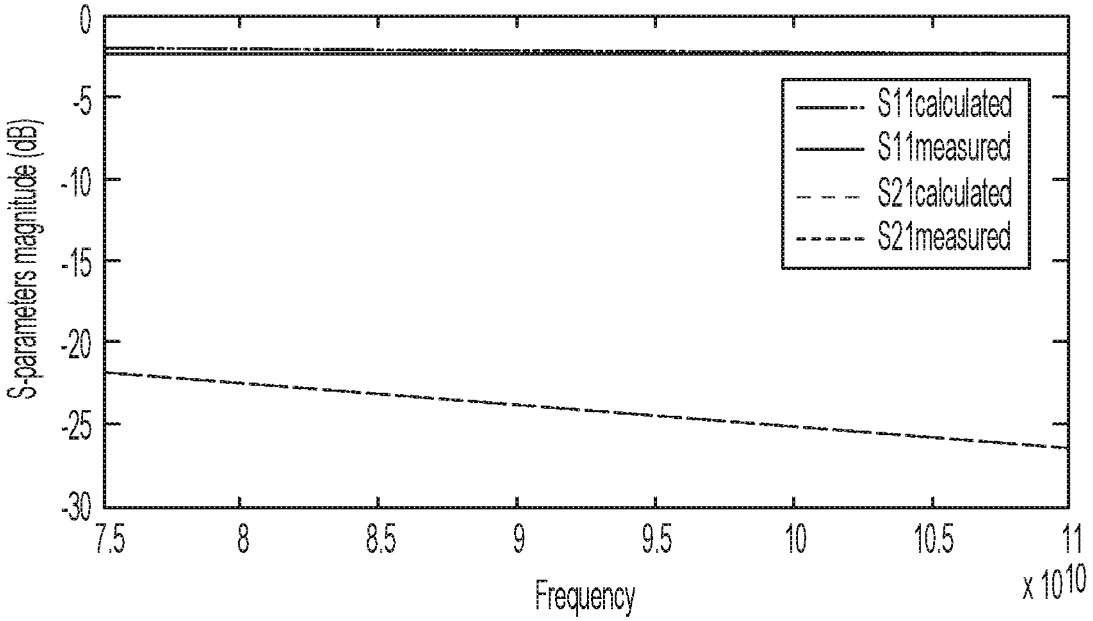
FIGS. 49A and 49B present the S-parameters magnitude (dB) and insertion loss (dB) for EX-8.
Figure 49B:
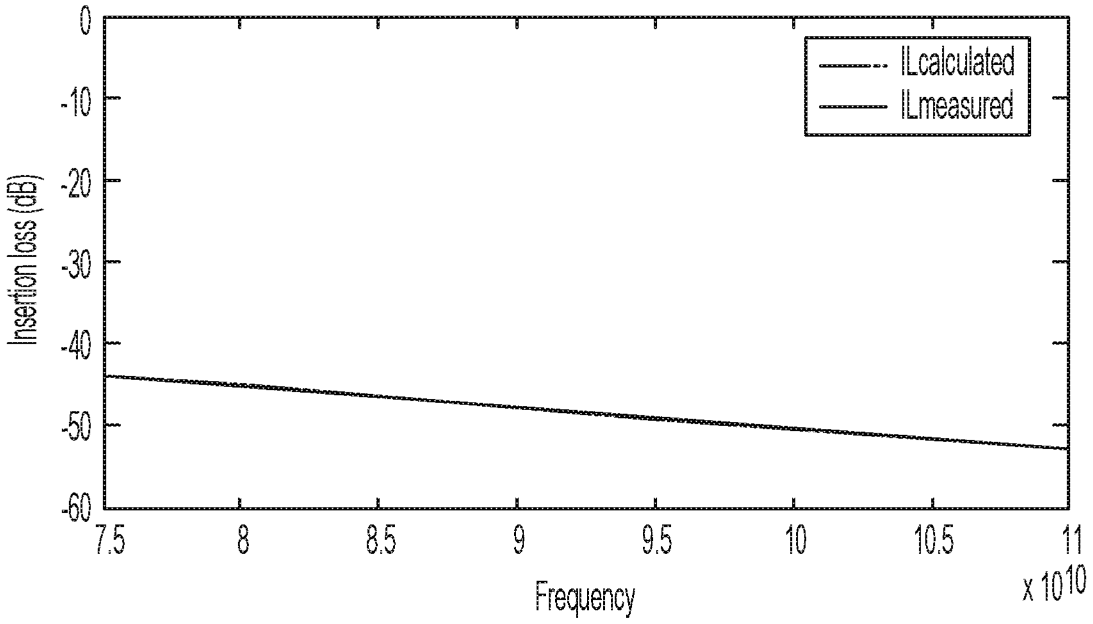
Figure 50A:
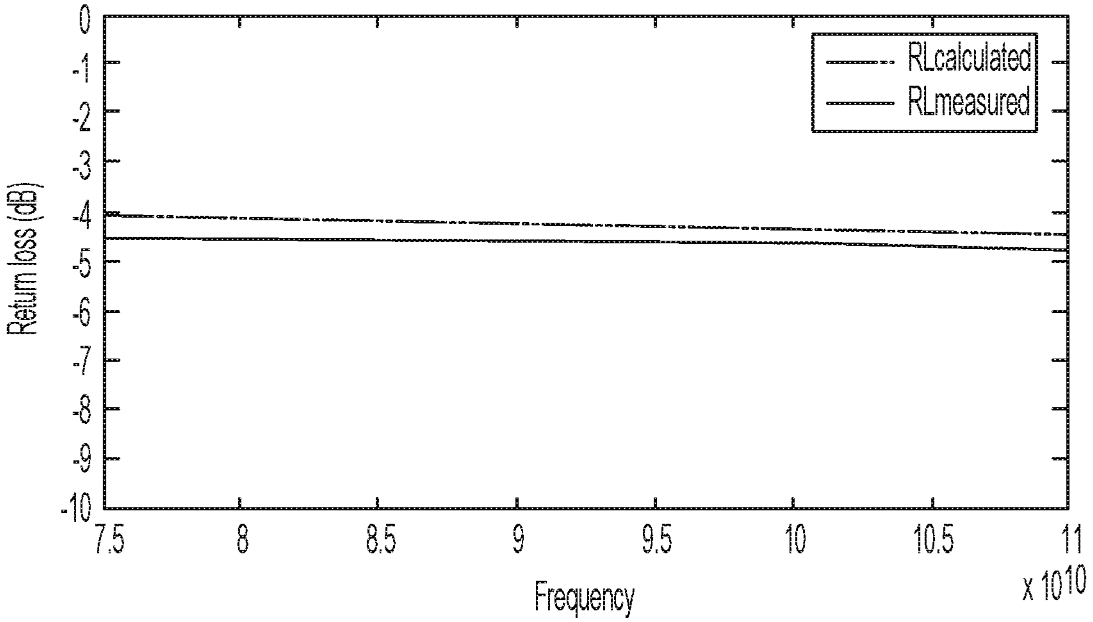
FIGS. 50A and 50B present the return loss (dB) and attenuation constant (dB/cm) for EX-8.
Figure 50B:
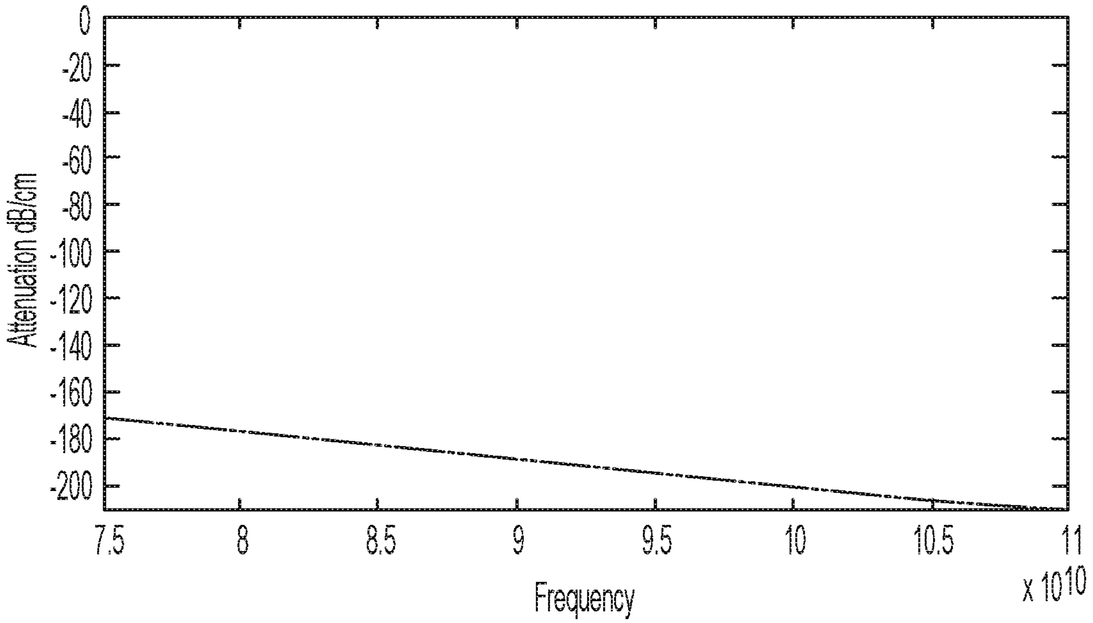
Figure 51A:
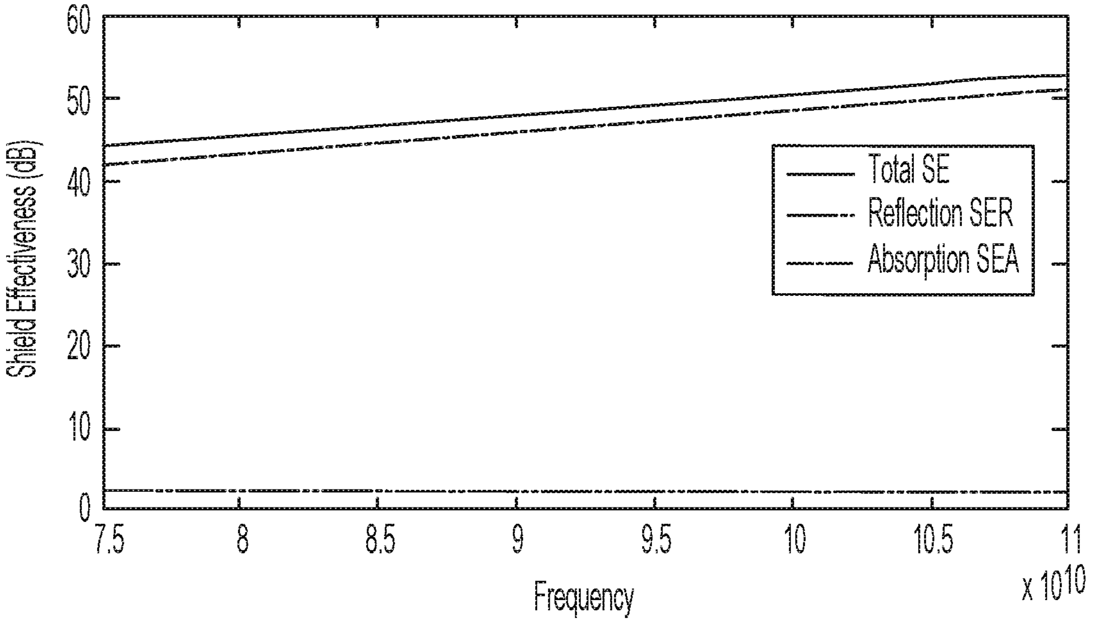
FIGS. 51A and 51B present the shielding effectiveness (dB) and metal-backed reflection loss (dB) for EX-8.
Figure 51B:
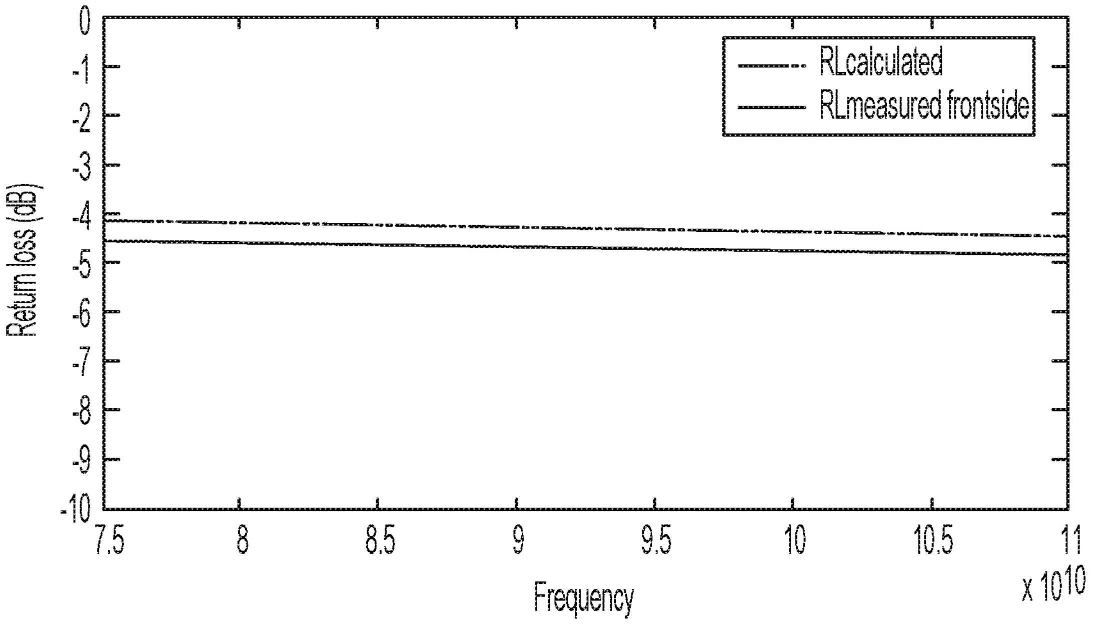
Figure 52A:
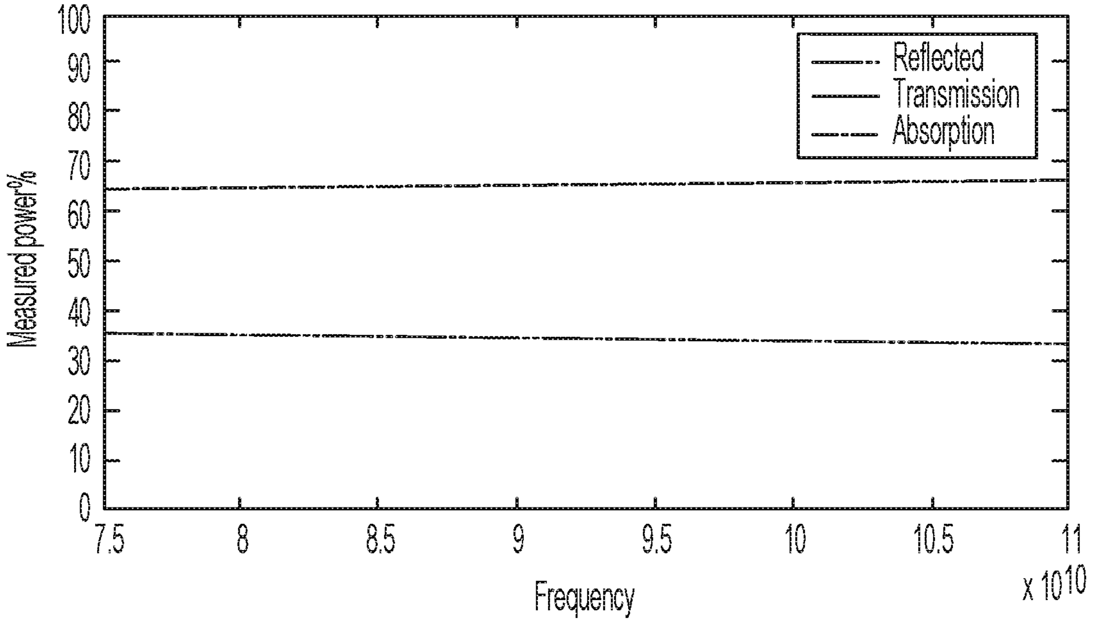
FIGS. 52A and 52B presents the percent power in transmission mode and percent power in metal-backed reflection mode (respectively) for EX-8.
Figure 52B:
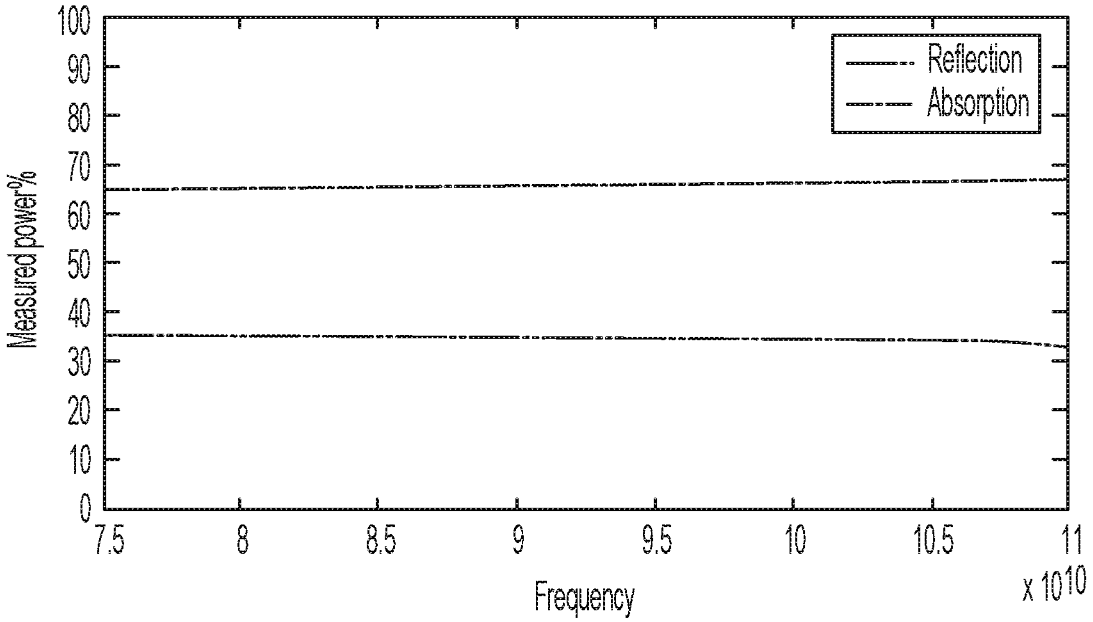
Figure 53A:
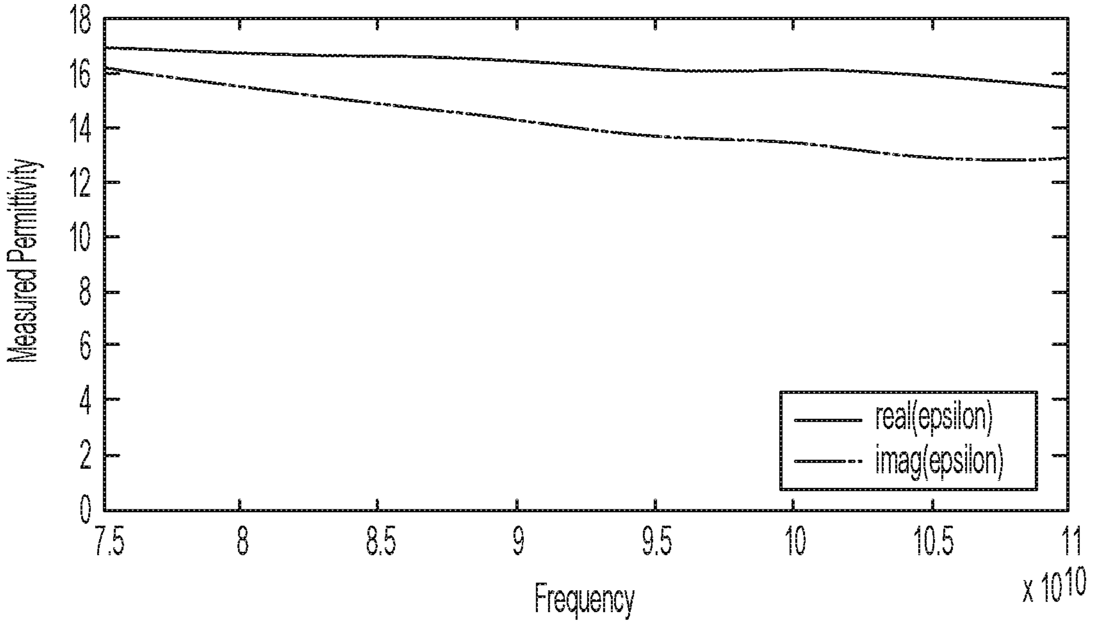
FIGS. 53A and 53B present the dielectric permittivity and loss tangent (respectively) for EX-9.
Figure 53B:
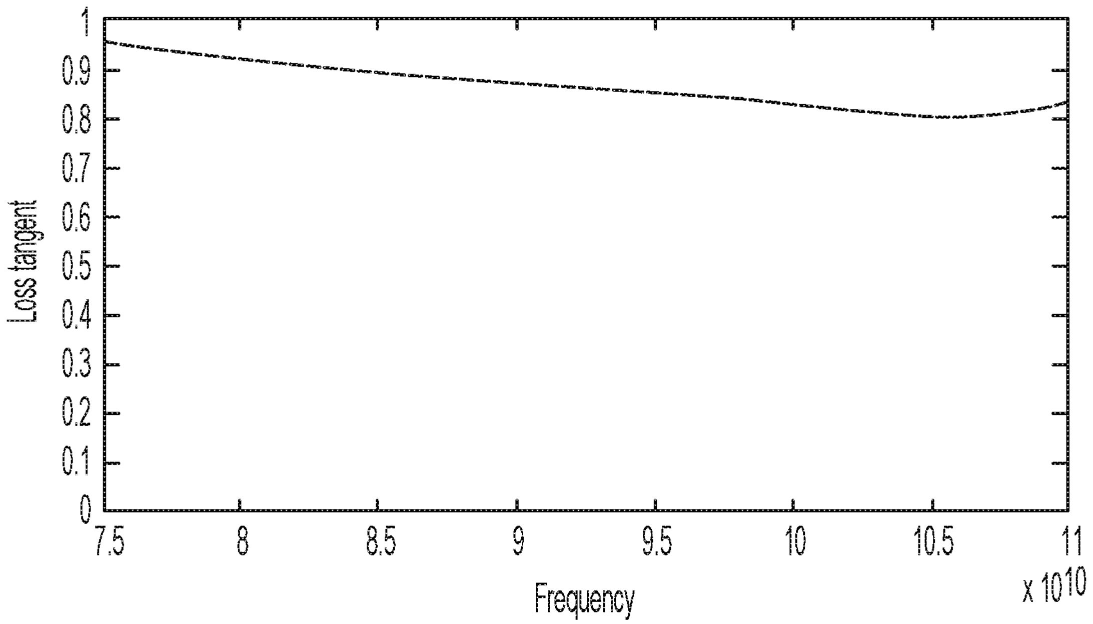
Figure 54A:
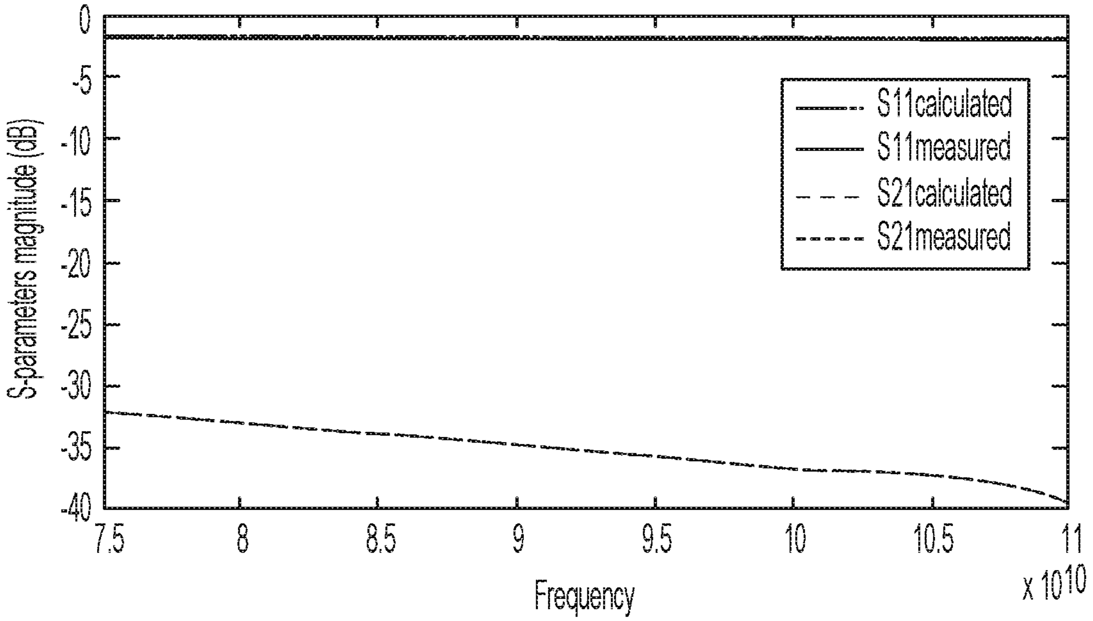
FIGS. 54A and 54B present the S-parameters magnitude (dB) and insertion loss (dB) for EX-9.
Figure 54B:
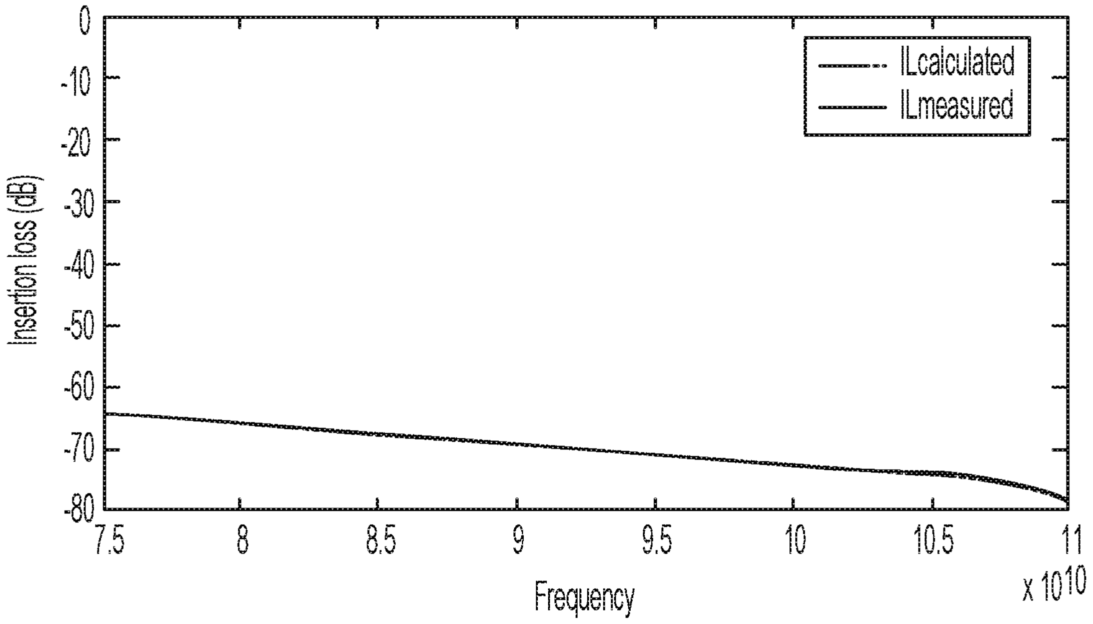
Figure 55A:
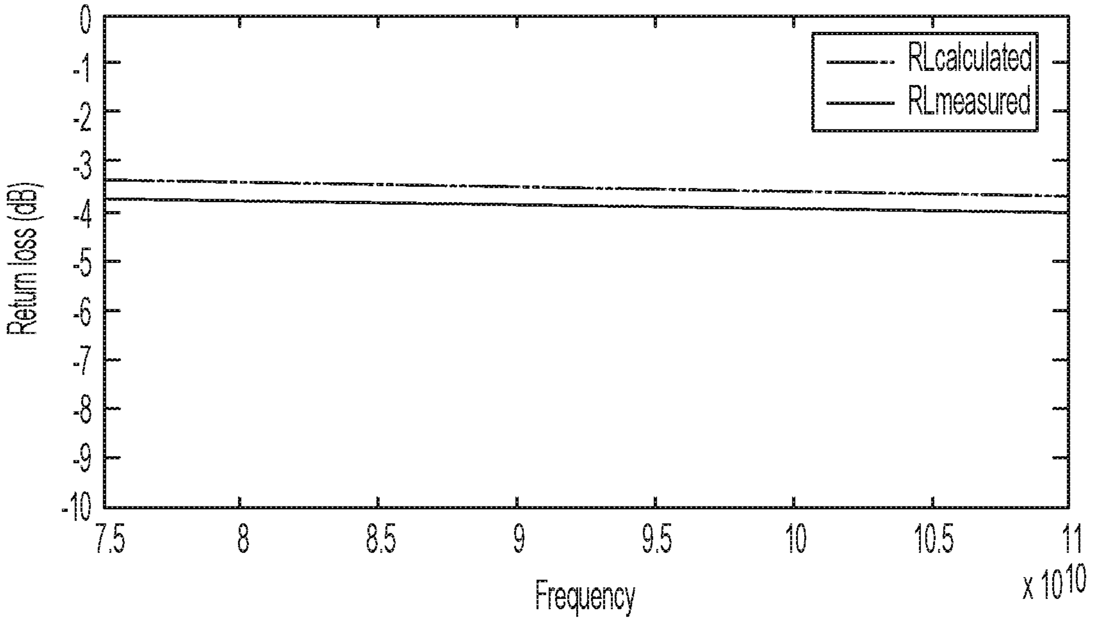
FIGS. 55A and 55B present the return loss (dB) and attenuation constant (dB/cm) for EX-9.
Figure 55B:
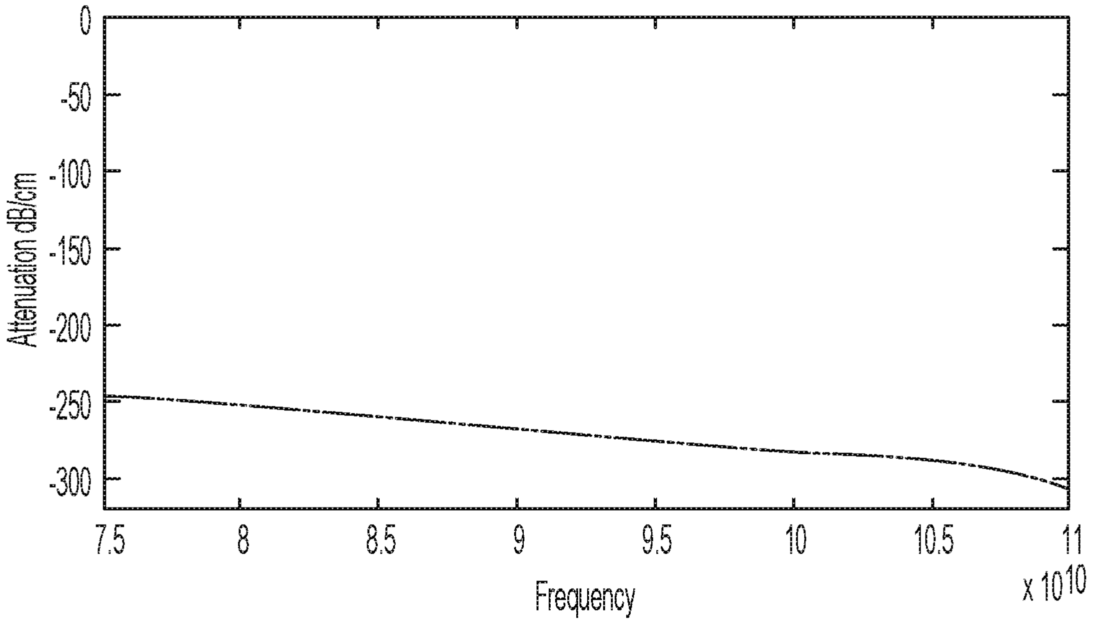
Figure 56A:
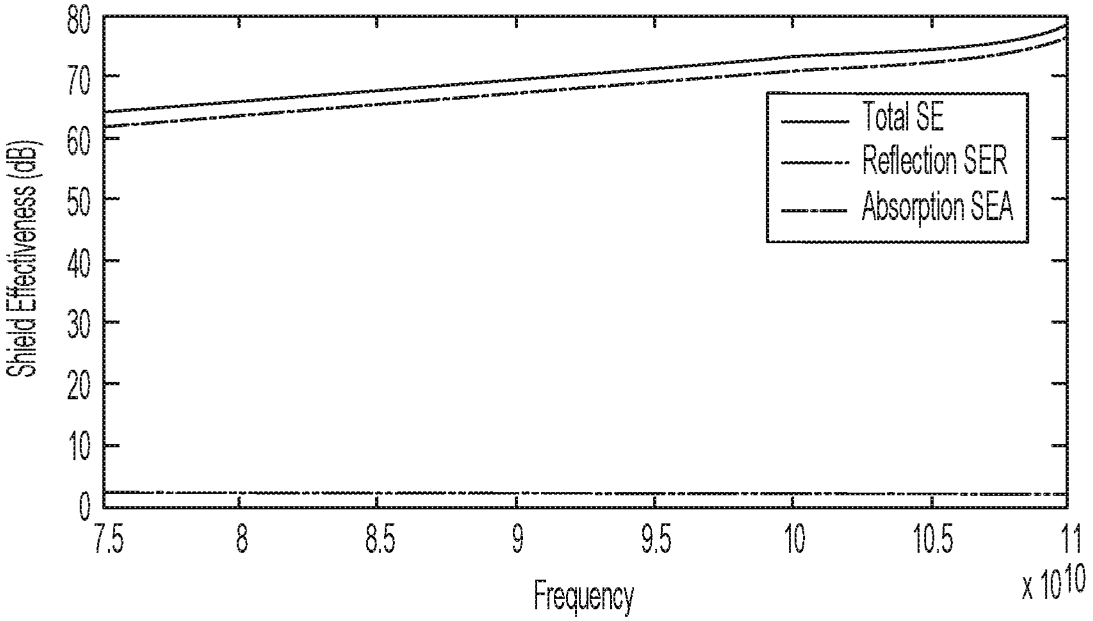
FIGS. 56A and 56B present the shielding effectiveness (dB) and metal-backed reflection loss (dB) for EX-9.
Figure 56B:
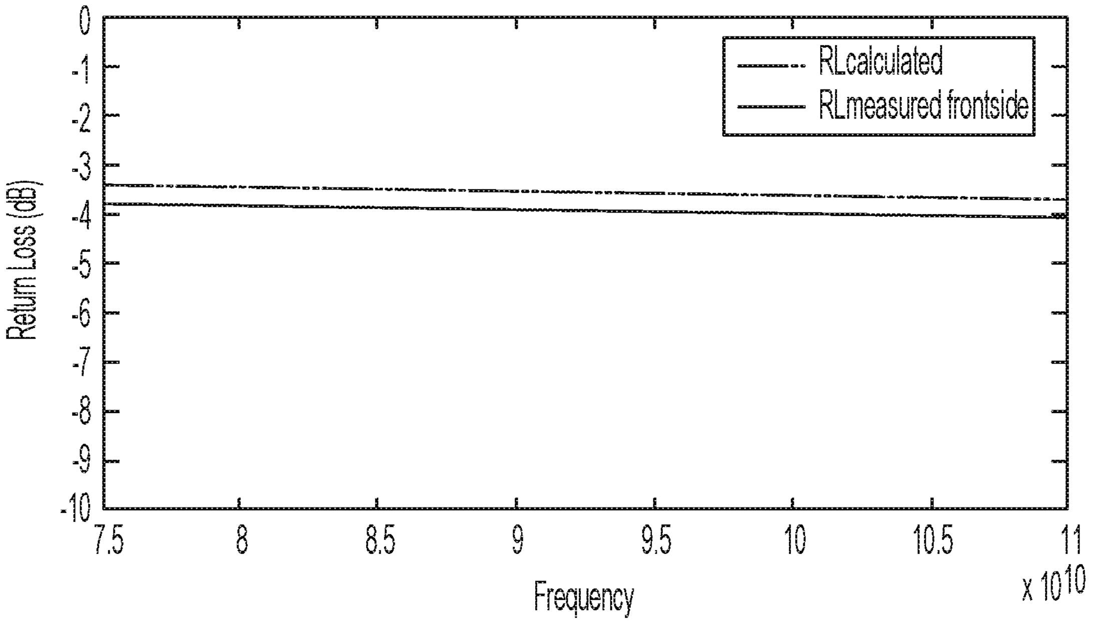
Figure 57A:
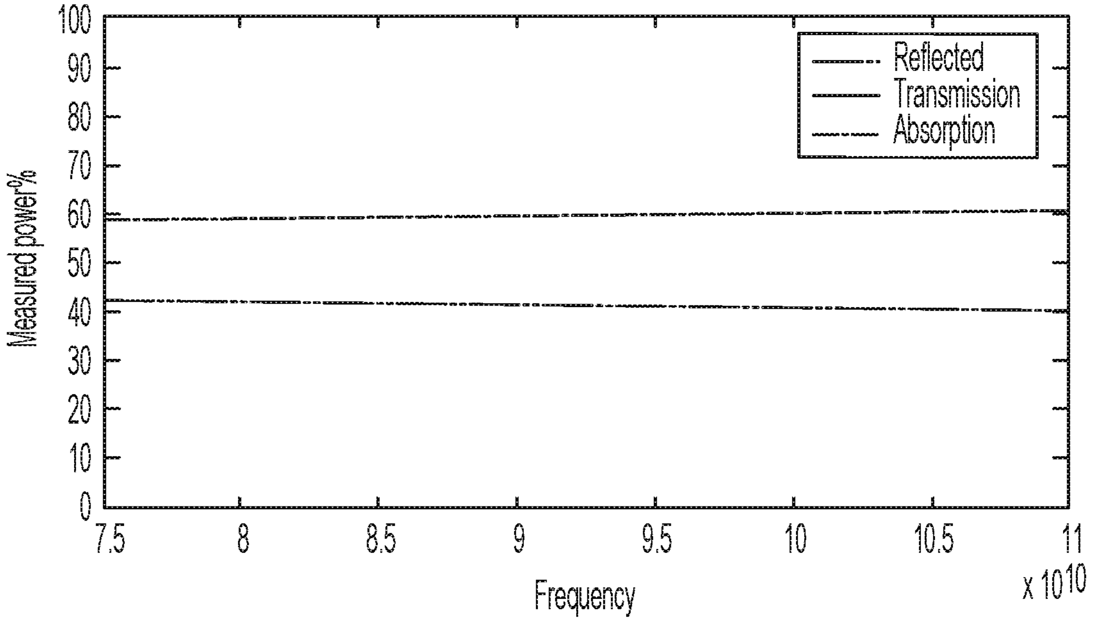
FIGS. 57A and 57B presents the percent power in transmission mode and percent power in metal-backed reflection mode (respectively) for EX-9.
Figure 57B:
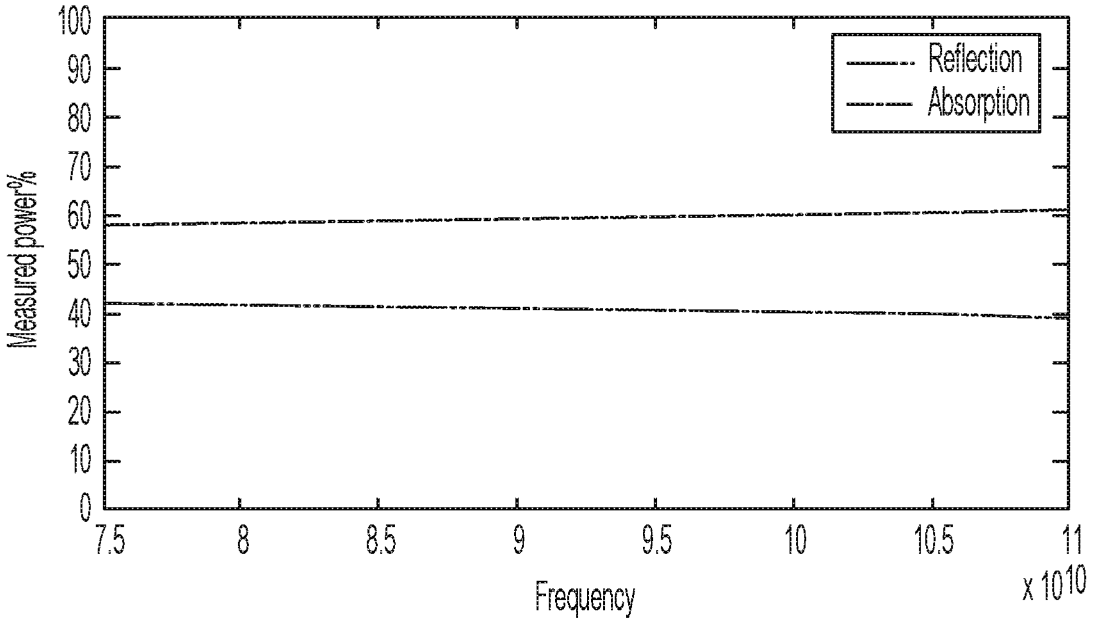

The dielectric performance of samples CE-5 (average thickness, 3.196 mm), EX-8 (average thickness 2.344 mm), and EX-9 (average thickness 2.427 mm) at frequencies between 75 and 110 GHz were observed. FIGS. 43A and 43B present the dielectric permittivity and loss tangent (respectively) for CE-5. FIGS. 44A and 44B present the S-parameters magnitude (dB) and insertion loss (dB) for CE-5. FIGS. 45A and 45B present the return loss (dB) and attenuation constant (dB/cm) for CE-5. FIGS. 46A and 46B present the shielding effectiveness (dB) and metal-backed reflection loss (dB) for CE-5. FIGS. 47A and 47B presents the percent power in transmission mode and percent power in metal-backed reflection mode (respectively) for CE-5. FIGS. 48A and 48B present the dielectric permittivity and loss tangent (respectively) for EX-8. FIGS. 49A and 49B present the S-parameters magnitude (dB) and insertion loss (dB) for EX-8. FIGS. 50A and 50B present the return loss (dB) and attenuation constant (dB/cm) for EX-8. FIGS. 51A and 51B present the shielding effectiveness (dB) and metal-backed reflection loss (dB) for EX-8. FIGS. 52A and 52B presents the percent power in transmission mode and percent power in metal-backed reflection mode (respectively) for EX-8. FIGS. 53A and 53B present the dielectric permittivity and loss tangent (respectively) for EX-9. FIGS. 54A and 54B present the S-parameters magnitude (dB) and insertion loss (dB) for EX-9. FIGS. 55A and 55B present the return loss (dB) and attenuation constant (dB/cm) for EX-9. FIGS. 56A and 56B present the shielding effectiveness (dB) and metal-backed reflection loss (dB) for EX-9. FIGS. 57A and 57B present the percent power in transmission mode and percent power in metal-backed reflection mode (respectively) for EX-9. As it was desired, the dielectric performance of the resin containing a mixture of two PBT resins, 10 wt. % of a conductive carbon black and 20 wt. % of glass fibers (EX-8) was similar to that of the resin containing the two PBT resins, 10 wt. % of a conductive carbon black, but without glass fiber (CE-5).

Thus as provided herein, the dielectric properties of a composition comprising a polymer and an electrically conductive carbon filler depended to a large extent on the type of carbon filler (powder, fibers, nanotubes, graphene, graphite, etc.) and concentration of the carbon-based filler present in the formulation. A polymer containing the same amount of either a low-structure carbon or a high-structure carbon cannot be expected to have the same dielectric performance when measured in the W-band at frequencies between 75 and 110 GHz. Surprisingly, a concentration of carbon black within the range of 2-14.5 weight % was found to be the range at which the microwave absorption exhibited a maximum. We found that the Percent Absorbed Power measured in Transmission mode goes from about 58% at 2 wt % carbon to 76% at 4 wt % carbon, and back to 58% at 14.5 wt % carbon.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

It will be apparent to those skilled in the art that various modifications and variations can be made in the present disclosure without departing from the scope or spirit of the disclosure. Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A composite comprising:

from about 50 wt. % to about 97 wt. % of a thermoplastic resin comprising at least two polybutylene terephthalate resins having different viscosities; and from about 3 wt. % to about 8 wt. % of a carbon black powder having a primary surface area of from about 500 to about 1000 $m^2/g$, wherein the composite exhibits a dielectric constant ε' of between 5 and 30 and a dissipation loss ε" of between 0.5 and 45, measured at frequencies between about 10 and about 120 GHz, wherein a 3.175 mm (0.125 inch) thick molded plaque comprising the composite absorbs about 60% or more of incident microwave radiation at frequencies from about 75 GHz to 110 GHz, and wherein the combined weight percent value of all components does not exceed 100 wt. %, and all weight percent values are based on the total weight of the composite.

2. The composite according to claim 1, wherein the composite has a dissipation factor (Df) of from about 0.01 to about 2 when determined as a ratio of ε" and ε' measured in transmission mode.

3. The composite according to claim 1, wherein a molded sample of the composite exhibits a percent reflected power measured in transmission mode of at least 15% when observed according to a Free Space method at frequencies from about 75 GHz to 110 GHz.

4. The composite according to claim 1, wherein a 3.175 mm (0.125 inch) thick molded plaque comprising the composite reflects at least 14% of incident microwave radiation at frequencies from about 75 GHz to 110 GHz.

5. The composite according to claim 1, wherein a molded plaque comprising the composite exhibits microwave Attenuation of at least about −30 dB/cm in the W-band, and a total Shielding Effectiveness of at least about 7 dB in the W-band when measured according to a Free Space method.

6. The composite according to claim 1, wherein the composite exhibits a surface resistivity of at least 30 ohms per square when tested in accordance with ASTM D 257.

7. The composite according to claim 1, wherein the composite exhibits a volume resistivity of at least 10 ohms cm when tested in accordance with ASTM D 257.

8. The composite according to claim 1, wherein a wt. % ratio of thermoplastic resin to the carbon black powder is from about 32:1 to about 6:1.

9. The composite according to claim 1, wherein the carbon black powder is present in an amount of from 3 wt. % to 7 wt. %, and wherein the percent Absorption measured in Transmission mode is at least 74% when observed at a frequency of 77 GHz.

10. The composite according to claim 1, wherein the composite is free of carbon nanotubes, carbon platelets, or carbon fibers.

11. The composite according to claim 1, wherein the composite consists of the thermoplastic resin and the carbon black powder.

12. An autoradar sensor for electromagnetic radiation comprising a composite, the composite comprising:

from about 50 wt. % to about 97 wt. % of a thermoplastic resin comprising at least two polybutylene terephthalate resins having different viscosities; and from about 3 wt. % to about 8 wt. % of a carbon black powder having a primary surface area of from about 500 to about 1000 $m^2/g$, wherein the composite exhibits a dielectric constant ε' of between 5 and 30 and a dissipation loss ε" of between 0.5 and 45, measured at frequencies between about 10 and about 120 GHz, wherein a 3.175 mm (0.125 inch) thick molded plaque comprising the composite absorbs about 60% or more of incident microwave radiation at frequencies from about 75 GHz to 110 GHz, and wherein the combined weight percent value of all components does not exceed 100 wt. %, and all weight percent values are based on the total weight of the composite.

13. The autoradar sensor according to claim 12, wherein the composite consists of the thermoplastic resin and the carbon black powder.

* * * * *